US010444877B2

(12) United States Patent
Jung et al.

(10) Patent No.: US 10,444,877 B2
(45) Date of Patent: Oct. 15, 2019

(54) DISPLAY DEVICE WITH TOUCH SENSOR

(71) Applicant: LG Display Co., Ltd., Seoul (KR)

(72) Inventors: MoonSeok Jung, Cheonan-si (KR); YongMin Ha, Seoul (KR); Tae-Sang Kim, Cheonan-si (KR)

(73) Assignee: LG Display Co., Ltd., Seoul (KR)

( * ) Notice: Subject to any disclaimer, the term of this patent is extended or adjusted under 35 U.S.C. 154(b) by 708 days.

(21) Appl. No.: 14/979,507

(22) Filed: Dec. 27, 2015

(65) Prior Publication Data

US 2017/0185190 A1 Jun. 29, 2017

(51) Int. Cl.

*G09G 1/00* (2006.01)
*G06F 3/041* (2006.01)
*G09G 3/36* (2006.01)
*H01L 27/12* (2006.01)
*H01L 29/786* (2006.01)
*G02F 1/1333* (2006.01)
*G06F 3/044* (2006.01)
*G02F 1/1362* (2006.01)

(52) U.S. Cl.

CPC ........ *G06F 3/0412* (2013.01); *G02F 1/13338* (2013.01); *G06F 3/044* (2013.01); *G06F 3/0416* (2013.01); *G09G 3/3655* (2013.01); *G09G 3/3666* (2013.01); *H01L 27/124* (2013.01); *H01L 27/127* (2013.01); *H01L 27/1218* (2013.01); *H01L 27/1225* (2013.01); *H01L 27/1248* (2013.01); *H01L 27/1262* (2013.01); *H01L 29/7869* (2013.01); *G02F 1/136286* (2013.01); *G02F 2001/133357* (2013.01); *G06F 2203/04103* (2013.01); *G09G 2300/0426* (2013.01)

(58) Field of Classification Search

CPC .......... G06F 3/047; G06F 3/044; G06F 3/041; G09G 5/003; G09G 5/18; G09G 3/3648; G02F 1/1333

See application file for complete search history.

(56) References Cited

U.S. PATENT DOCUMENTS

2007/0276091 A1* 11/2007 Son ...................... C09D 183/04 525/100
2010/0315324 A1* 12/2010 Nam ................. G02F 1/133615 345/102
2012/0001881 A1* 1/2012 Miyake ................ G09G 3/3648 345/209
2014/0111968 A1* 4/2014 Lee ...................... G02B 5/0242 362/84
2016/0341997 A1* 11/2016 Fukushima ........... H01L 51/105

FOREIGN PATENT DOCUMENTS

WO WO 2015/098192 * 7/2015 ........... H01L 29/786

* cited by examiner

*Primary Examiner* — Michael A Faragalla
(74) *Attorney, Agent, or Firm* — Fenwick & West LLP

(57) ABSTRACT

A display of an electric device includes a plurality of separated transparent electrode blocks, which are configured to provide one or more of supplemental features such as touch recognition. Signal paths between the transparent electrode blocks and the driver for the supplemental feature are implemented with a plurality of conductive lines placed under positioned under one or more planarization layers. The conductive lines implementing the signal paths are routed across the display area, directly toward a non-display area where drive-integrated circuits are located.

19 Claims, 44 Drawing Sheets

Step 1

Step 2

Step 3

Step 4

Step 5

Step 6

DISPLAY DEVICE WITH TOUCH SENSOR

BACKGROUND OF THE INVENTION

Field of the Invention

The present disclosure generally relates to electronic devices, and more particularly to electronic devices with displays and methods of manufacturing the same.

Description of the Related Art

Electronic devices often include displays. For example, mobile telephones and portable computers include displays for presenting information to a user. In addition to displaying information, displays may sport various supplemental features. For instance, a touch screen allows a user to interact with a device simply by touching the graphical interface displayed on the screen with fingers, stylus (pen) or other objects. With ease of use and versatility in operation, the touch screen has been one of the most popular user interaction mechanism used in a variety of flat panel displays such as liquid crystal displays (LCDs) and organic light emitting diode (OLED) displays.

Conventionally, a discrete substrate provided with a matrix of touch-driving lines and touch-sensing lines, which may be referred to as a touch panel, is overlaid on a display panel to provide the touch-sensing functionality. However, placing a separate touch panel on the display panel adds to the thickness and the weight of the display panel. Similar problems can result from adding separate components or substrates for such supplemental features, for instance tactile feedback or pressure sensing function, to the displays. As such, attempts have been made to integrate components relating to those supplemental features within the stacks of layers forming the display panel.

However, integrating the components relating to the supplemental features (e.g., touch sensor, touch pressure sensor, tactile feedback sensor) within a display panel can complicate the operation of the display panel, and may even require some compromises in the display qualities. For instance, conductive lines transmitting signals to and from the display areas in the display panel for an implementation of touch-sensing, touch-pressure sensing or tactile feedback mechanism may generate unwanted parasitic capacitance with other components of the display panel, which may result in visual defects (e.g., irregular tilting angle of liquid crystal molecules, line dim, moiré effects, etc.).

SUMMARY

The present disclosure generally relates to display panels provided with supplemental functionalities such as touch sensing functionality, touch pressure sensing functionality and tactile feedback functionality, and more particularly, to configuration of segmented electrode blocks arranged over a display area of a display panel for such supplemental functionalities.

In a display panel, some elements used in relation with display functionality can be configured to recognize touch inputs on the screen. For instance, some drivers such as a gate driver, a data driver and a touch driver, may be configured to provide signals for operating the display pixels and for recognizing touch inputs made on the screen. Also, some electrodes and/or conductive layers in display pixels used for displaying image on the display panel can be configured to serve as a part of a touch sensor.

For instance, a display panel may be provided with a plurality of transparent electrode blocks (i.e., pieces) provided over a display area of the display panel, and each of the transparent electrode block is configured communicate with a touch driver via a signal path, which is formed of at least one common signal lines. The common signal lines are disposed on a substrate, and the common signal liens are covered by a lower planarization layer. The lower planarization layer is provided over the plurality of common signal lines in a thickness sufficient to provide a planar surface over the common signal lines. A plurality of gate lines, a plurality of data lines and a plurality of thin-film-transistors (TFT) are provided on the planar surface provided by the lower planarization layer, and they form an array of pixel circuits in the display area. That is, the gate lines and the data lines define a matrix of pixel regions, in which each pixel region is provided with a pixel circuitry with one or more TFTs.

In this way, a display panel can be provided in a lighter weight, with thinner profile and can be manufactured with fewer parts in fewer manufacturing steps.

Further features of the invention, its nature and various advantages will be more apparent from the accompanying drawings and the following detailed description of the preferred embodiments.

DETAILED DESCRIPTION

Reference will now be made in detail to the exemplary embodiments of the present invention, examples of which are illustrated in the accompanying drawings. Wherever possible, the same reference numbers will be used throughout the drawings to refer to the same or like parts.

Example embodiments may be described herein with reference to a Cartesian coordinate system in which the x-direction and the y-direction can be equated to the horizontal (row) direction and the vertical (column) direction, respectively. However, one skilled in the art will understand that reference to a particular coordinate system is simply for the purpose of clarity, and does not limit the direction of the structures to a particular direction or a particular coordinate system.

[Exemplary Electric Devices with Display]

Electronic devices may include displays used to display images to a user. Illustrative electronic devices that may be provided with displays are shown in FIGS. 1A and 1B.

Figure 1A:
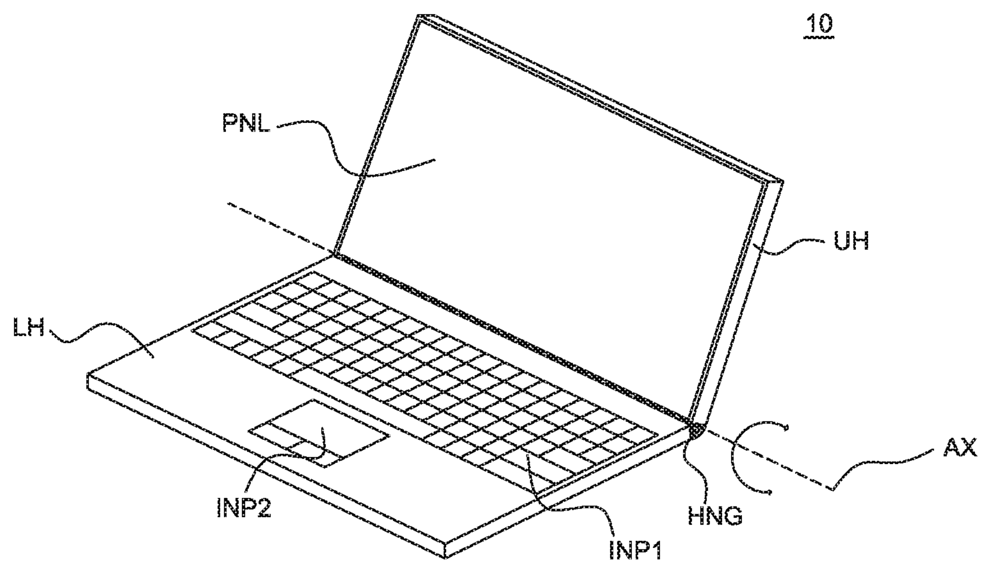
FIG. 1A is a perspective view of a laptop computer with a display, in accordance with an embodiment of the present disclosure.

FIG. 1A shows how electronic device 10 may have the shape of a laptop computer having upper housing UH and lower housing LH. Components such as keyboard INP1 and touchpad INP2 may be provided in the electronic device 10. Device 10 may have hinge structures HNG that allow upper housing UH to rotate in directions about rotational axis AX relative to lower housing LH. Display panel PNL may be mounted in upper housing UH, in lower housing LH or in both upper housing UH and lower housing LH. Upper housing UH, which may sometimes referred to as a display housing or lid, may be placed in a closed position by rotating upper housing UH towards lower housing LH about rotational axis AX. When display panel PNL is mounted across from upper housing UH to lower housing LH, display panel PNL may be a foldable display. Also, upper housing UH and lower housing LH may each include a separate display panel PNL.

Figure 1B:
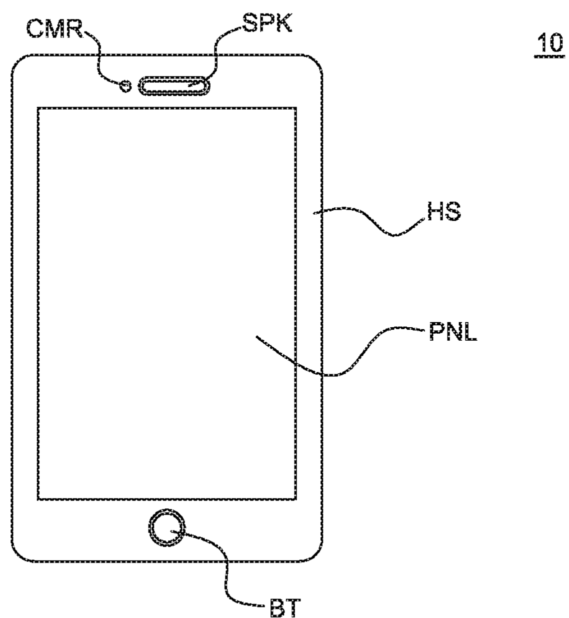
FIG. 1B is a front view of a handheld electronic device with a display, in accordance with an embodiment of the present disclosure.

FIG. 1B shows electronic device 10 provided in a form of a handheld device such as a mobile telephone, music player, gaming device, control console unit in an automobile, or other compact device. In this type of configuration for device 10, housing 12 may have opposing front and rear surfaces. Display panel PNL may be mounted on a front face of housing HS. Display panel PNL may, if desired, have a display cover layer or other exterior layer that includes openings for components such as button BT, speakers SPK and camera CMR.

The configurations for device 10 that are shown in FIGS. 1A and 1B are merely illustrative. In general, electronic device 10 may be a laptop computer, a computer monitor containing an embedded computer, a tablet computer, a mobile telephone, a media player, or other handheld or portable electronic device, a smaller device such as a wrist-watch device, a pendant device, or other wearable or miniature device, a television, a computer display that does not contain an embedded computer, a gaming device, a navigation device, an embedded system such as a system in which electronic equipment with a display is mounted in a kiosk or in an automobile (e.g., dashboard, center console and control panel), or other electronic equipment.

Display panel PNL may be a touch sensitive display that includes a layer with an array of transparent electrode blocks, which serves as a touch sensor. Display panel PNL may be a touch sensitive display that includes a layer with an array of transparent electrode blocks, which serves a touch sensor capable of measuring pressure of touch inputs. Display panel PNL may be a touch sensitive display that includes a layer with an array of transparent electrode blocks, which provides tactile feedback in response to touch inputs.

Displays for device 10 may, in general, include image pixels formed from light-emitting diodes (LEDs), organic LEDs (OLEDs), plasma cells, electrowetting pixels, electrophoretic pixels, liquid crystal display (LCD) components, or other suitable image pixel structures.

Embodiments in the present disclosure are described in the context of LCDs, in particular, the In-Plane-Switching (IPS) mode LCD and the Fringe-Field-Switching (FFS) mode LCD having both the common electrodes and the pixel electrodes arranged on one of the substrates that enclose the liquid crystal layer. However, it should be appreciated that the features described here can be applied to various other kinds of displays so long as the display is equipped with a plurality of conductive lines carrying signals from a driver of the display device is placed under the array of TFTs and connected to an array of transparent electrode blocks placed above the array of TFTs. That is, the features described in the present disclosure can also be adopted in display technologies other than the LCD display such as the organic-light-emitting-diode (OLED) display.

For instance, in an OLED display, a plurality of conductive lines may be placed on one side of the TFT array, and the conductive lines may be connected to the array of transparent electrode blocks provided on the other side of the TFT array. The transparent electrode blocks provided on the other side of the TFT array may serve as a touch sensor to provide touch recognition functionality. As mentioned, the functionality of the array of transparent electrode blocks provided over the TFT array is not limited to the touch sensing, but may also be used for various other functionalities such as touch-pressure sensing functionality, tactile feedback functionality and more. As such, it should be noted that the term "transparent electrode blocks" and "common electrode blocks" are used interchangeably in this disclosure.

[Exemplary Display Panel]

Figure 2:
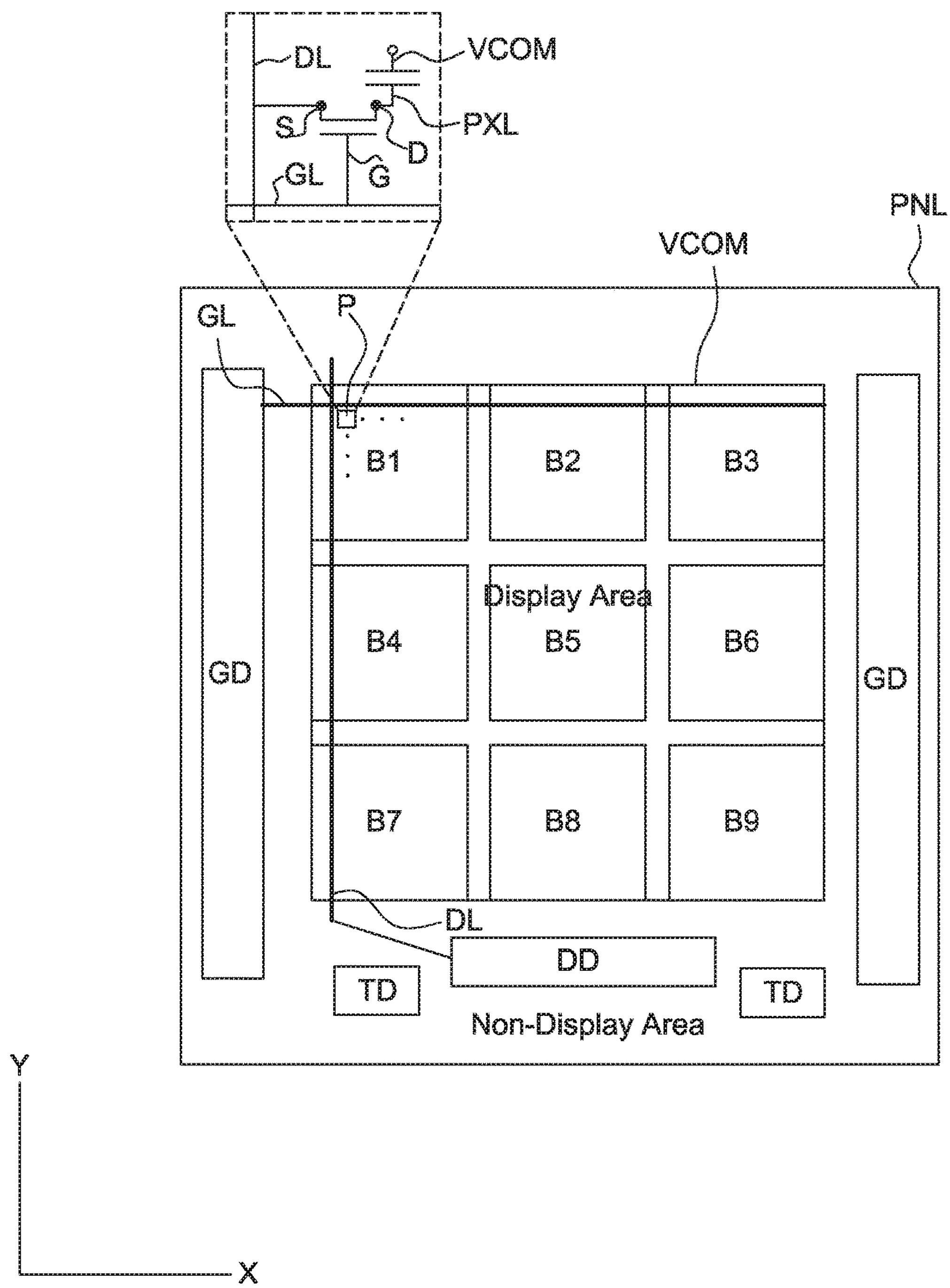
FIG. 2 is a schematic diagram of an exemplary electronic device with a display in accordance with an embodiment of the present disclosure.

FIG. 2 schematically illustrates a configuration of a display panel PNL according to an embodiment of the present invention. Referring to FIG. 2, the display panel PNL includes a plurality of display pixels P, connected to a plurality of data lines DL and a plurality of gate lines GL. A data driver DD and a data driver DD are provided in the area outside the display area, which may be referred to as the inactive area (i.e., non-display area). The data driver DD and the gate driver GD are configured to provide data signals and the gate signals on the data lines DL and the gate lines GL, respectively, to operate display pixels P in the display area.

The pixels include electrodes or other capacitive elements may be used for display functionality and also for touch-sensing functionality. In a liquid crystal display, for instance, a layer of liquid crystal molecules is interposed between two substrates, and the pixel electrode and the common electrode provided on one of the two substrates are provided with data voltage and the common voltage, respectively, to generate electrical fields to control the amount of light passing through the layer of the liquid crystal molecules. The light passed through the liquid crystal layer also passes through the color filters and a black matrix provided on one of the substrates to represent images on the screen. In the display panel PNL depicted in FIG. 2, a common electrode VCOM is divided into a plurality of common electrode blocks (denoted with B1-B12). For simpler explanation, only B1-B9 are depicted in FIG. 2. However, the common electrode VCOM can be provided with more number of separated pieces of common electrode blocks.

Each of the display pixels P includes a thin-film-transistor (TFT) with a gate, a source and a drain. Each of the display pixel P includes a capacitor, which is formed with a pixel electrode PXL and the common electrode VCOM. The gate of the TFT is connected to a gate line GL, the source of the TFT is connected to the data line DL and the drain of the TFT is connected to the pixel electrode PXL of the respective pixel.

The touch driver TD is configured to send and receive touch-sensing related signals to and from each of the common electrode blocks via a plurality of common signal lines SL to use the common electrode blocks in sensing touch inputs on the display panel PNL. It should be appreciated that a transparent electrode provided in the display panel PNL other than the common electrode VCOM may be divided into a plurality of segmented blocks, and configured to send and receive touch-sensing related signals to and from the touch driver TD via a plurality of common signal lines SL.

In an organic-light-emitting diode (OLED) display panel, a plurality of separated transparent electrode blocks arranged across the display area of the OLED display panel can also be configured to communicate with the touch driver TD via a plurality of common signal lines SL.

In some embodiments, all of the data driver DD, the gate driver GD and the touch driver TD may be provided on a substrate of the display panel PNL. In some other embodiments, some of those drivers may be provided on a separate printed circuit board, which is coupled to the substrate of the display panel PNL via a suitable interface connection means (e.g., pads, pins, etc.). Although each of the data driver DD, the gate driver GD and the touch driver TD is illustrated as a discrete component in FIG. 2, some or all of these drivers may be integrated with one another into a single component.

For instance, the touch driver TD may be provided as a part of the data driver DD. In such cases, some of the touch sense functionality related signals communicated between the touch driver TD and the plurality of common electrode blocks may be transmitted via the data driver DD. Also, the data driver DD and the touch driver TD may be provided on the same printed circuit board, which is connected to the common signal lines SL and the data lines DL provided on the substrate of the display panel PNL.

Figure 3A:
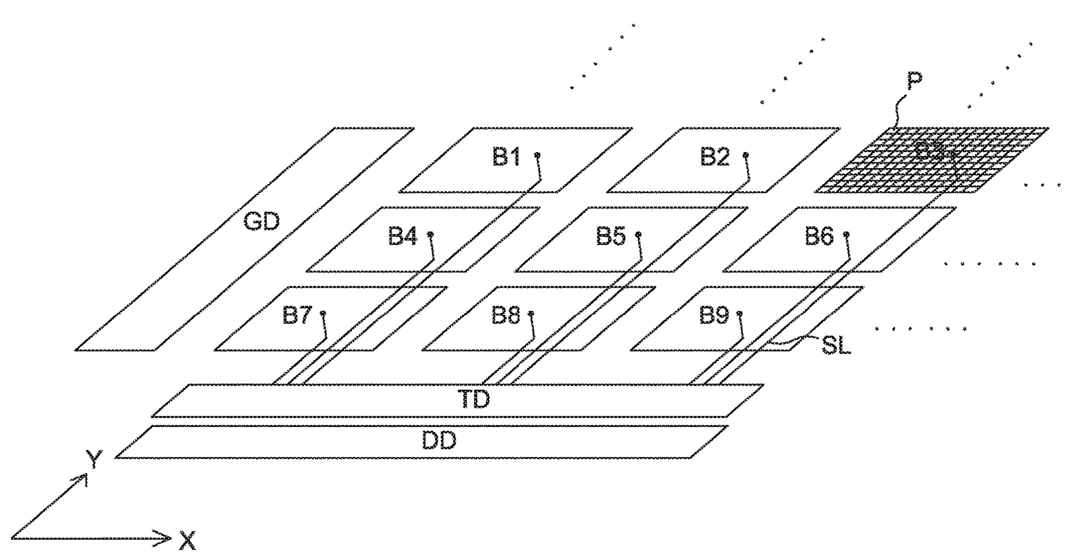
FIG. 3A is a schematic illustration of an exemplary display panel with a plurality of transparent electrode blocks, in which each of the transparent electrode blocks is connected to a common signal line and configured to operate in a self-capacitance touch sensor, according to an embodiment of the disclosure.
Figure 3B:
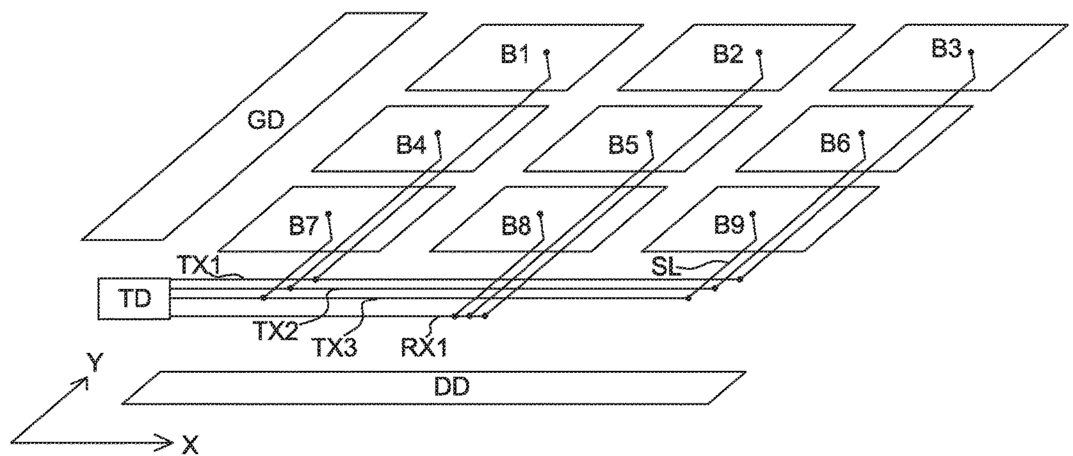
FIG. 3B is a schematic illustration of an exemplary display panel with a plurality of transparent electrode blocks, in which each of the transparent electrode blocks is connected to a common signal line and configured to operate in a mutual-capacitance touch sensor, according to an embodiment of the disclosure.

FIGS. 3A and 3B illustrate exemplary configurations of the transparent electrode blocks (i.e., the common electrode blocks) and the wirings for the transparent electrode blocks to implement a touch sensor in the display panel PNL. In particular, FIG. 3A illustrates an exemplary configuration of common electrode blocks (B1-B9) and the common signal lines SL for a self-capacitance touch recognition system. In the self-capacitance touch recognition system, each common electrode blocks (B1-B9) function as a touch sense electrode with a unique coordinate, and thus changes of capacitance read from each of the common electrode blocks can be used to detect the location of the touch inputs on the display panel PNL. To achieve this, each common electrode block is provided with a discrete signal path to the touch driver TD, which is implemented with the common signal line SL. That is, each common signal line SL is connected with just one common electrode block, although each common electrode block may be connected with multiple common signal lines SL, which forms a signal path between the common electrode block and the touch driver TD.

FIG. 3B illustrates an exemplary configuration of common electrode blocks (B1-B9) and the common signal lines SL for a mutual-capacitance touch recognition system in the display panel PNL. Unlike the self-capacitance touch recognition system, the mutual-capacitance touch recognition system relies on the changes in capacitance between a pair of touch-driving electrode and a touch-sensing electrode to detect the location of the touch inputs on the display panel PNL. Accordingly, in a mutual-capacitance touch recognition system, the common electrode blocks are selectively grouped together so that some groups of common electrode blocks serve as touch-driving electrodes and some other groups of common electrode blocks serve as touch-sensing electrodes. To this end, the common signal lines SL can be grouped together such that the groups of common electrode blocks arranged in one direction (e.g., X-direction) collectively forms touch-driving electrodes (e.g., TX1-TX3), and groups of common electrode blocks arranged in another direction (e.g., Y-direction) collectively forms a touch-sensing electrodes (e.g., RX1).

The common signal lines SL connected to the corresponding ones of the common electrode blocks are routed directly across the active area (i.e., display area) of the display panel PNL, and they are grouped together at the outside of the active area to form either the TX lines or the RX lines. By way of an example, the common signal lines SL from the common electrode blocks B1 and B3 are grouped together as illustrated in FIG. 2B, so that the first touch-driving line TX1 is formed in X-direction. Similarly, the common signal lines SL from the common electrode blocks B4 and B6, and the common electrode blocks B7 and B9 are grouped together to form touch-driving lines TX2 and TX3, respectively. The touch-sensing line RX is formed in Y-direction by grouping the common signal lines SL from the common electrode blocks B2, B5 and B8. The TX lines TX1-TX3 may be oriented in same direction as the gate lines GL (e.g., X-Direction), and the touch-sensing line RX may be oriented in the same direction as the data lines DL (Y-Direction). In this way, a mutual capacitance is formed at intersections between the TX lines and the Rx line.

In FIGS. 3A and 3B, only nine common electrode blocks are depicted for simpler explanation. However, it should be understood that the number of common electrode blocks provided in the display panel PNL is not limited as such, and the common electrode of the display panel PNL can be additional pieces of common electrode blocks. By way of a non-limiting example, a display panel PNL may include 36×48 common electrode blocks. Also, it should be noted that the size of individual display pixel may be much smaller than the size of an individual unit of touch sense region to be provided in the display panel PNL. In other words, the size of each common electrode block can be larger than the size of each individual display pixel. Accordingly, a group of pixels can share a single common electrode block, although each of those pixels is provided with an individual pixel electrode. In a non-limiting example, a single common electrode block may be shared by pixels arranged in 45 columns by 45 rows (each pixel comprising a red, a green and a blue sub-pixel).

[Touch Scan Operation]

Figure 4:
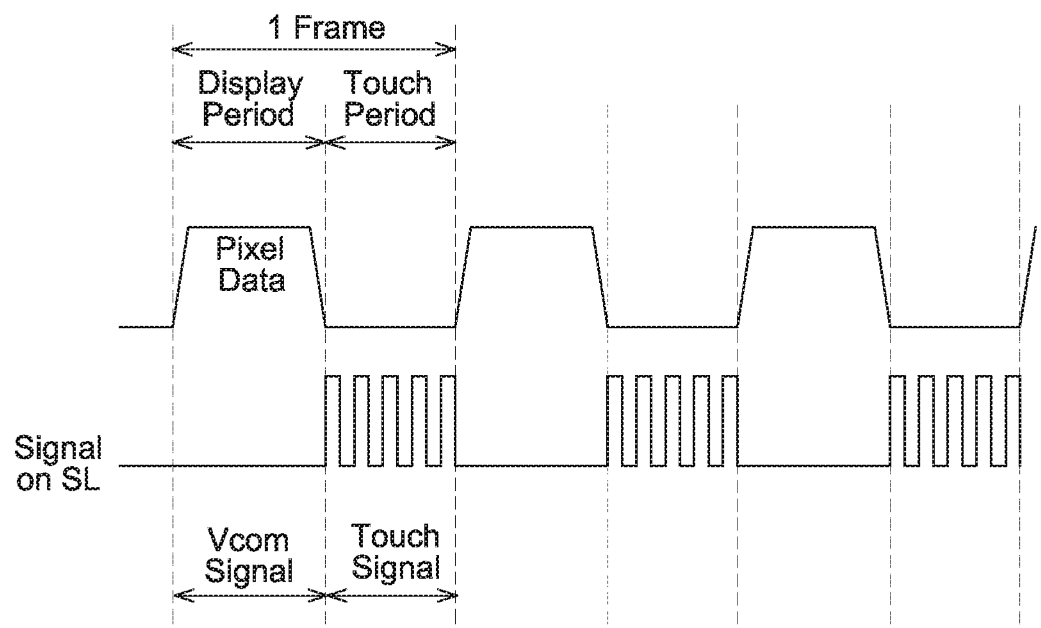
FIG. 4 is a timing diagram showing exemplary timing of signals applied to the transparent electrode blocks and the pixel electrodes of the pixels during display periods and during a touch sense period according to an embodiment of the disclosure.

FIG. 4 shows exemplary signals applied through the common signal lines SL to the common electrode blocks during a display period and during a touch-sensing period according to an embodiment of the present disclosure. Since the common electrode blocks are also used as the touch electrode, they are transmitted with signals related to display functionality for a certain period and provided with touch sensing related signals for a certain period. That is, one frame period, which is defined by the vertical sync signal, includes a display period and a touch-sensing period.

The display period may only be a part of one frame period. In the display period, the gate signals and the data signals are provided on the gate lines GL and the data lines DL, respectively, for charging the pixels with new image data. The remainder of the frame period can be used for preparing the pixels to receive the next image data as well as for scanning the common electrode blocks for identifying touch inputs on the screen. For instance, each frame is 16.6 ms when a display panel configured operated at a frequency of 60 frames per second. Within 16.6 ms, about 12 ms can be dedicated for the display period. The rest can be used for carrying out the touch-sensing functionality and for preparing the pixels to receive a new frame of image data.

Accordingly, the common voltage signal is transmitted from the data driver DD to the common electrode blocks during the display period. In the touch scan period, the touch-driving signal is transmitted from the touch driver TD to the common electrode blocks via the common signal lines SL.

In some embodiments, the common voltage signal may be in the form of a pulse signal that swings between a positive voltage and a negative voltage to perform LCD inversion. In some embodiments, the common voltage signal is supplied to the common electrode blocks via the common signal lines SL. Alternatively, in some other embodiments, the common voltage signal may be supplied to the common electrode blocks via dedicated common voltage signal line SL other than the common signal line SL. Further, in some embodiments, the common signal lines SL may serve as auxiliary means for supplying the common voltage signal to the common electrode blocks in addition to the signal lines dedicated for supplying the common voltage signal to the common electrode blocks.

[Intra-Frame Pause Touch Scanning Scheme]

Figure 5A:
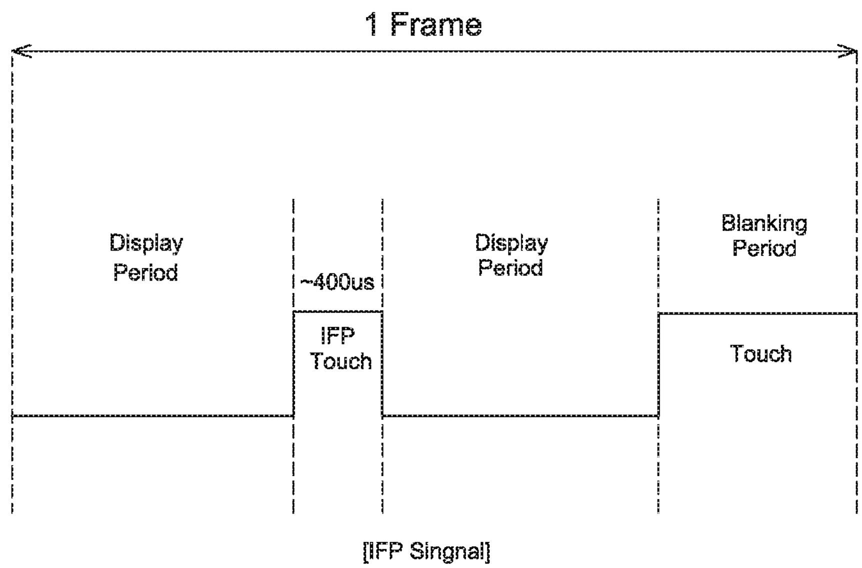
FIG. 5A is a timing diagram showing an exemplary timing of a signal, which is used for providing multiple touch scanning periods within a single frame, according to an embodiment of the disclosure.

In some embodiments, the display panel PNL can be configured to perform the touch scan operation at least two times within a single frame. That is, the display period in a frame can be divided into at least two separate display periods, and an intermediate touch scan period can be positioned in between two separate display periods of the same frame. FIG. 5A illustrates an exemplary Intra Frame Pause (IFP) driving scheme, which may be used in embodiments of the display panel PNL of the present disclosure. Accordingly, an intra-frame touch scan operation is performed at least once in between two separate display periods of the same frame, and at least once more during the blanking period before the next frame starts. During the intermediate touch scan period positioned between the two separate display periods, scan signal is not provided on the gate lines GL. Such a gate driving scheme may be referred to as the "intra-frame pause" (IFP) driving.

Referring to FIG. 5A, a frame includes a first display period and a second display period, which are separated by an IFP touch scan period. A blanking period follows the second display period. During the first display period, scan signal is sequentially provided on the gate lines GL1 through GL(m). After the scan signal is supplied on the gate line GL(m), the intra-frame touch scan operation begins on the display panel PNL. Supplying scan signal on the gate lines GL(m+1) through GL(end) resumes after the completion of the intra-frame touch scan operation. Once the scan signal is supplied on all of the gate lines GL, another touch scan operation is performed during the blanking period. If desired, additional display period and additional intra-frame touch scan period can be provided within a single frame to increase the touch scan resolution of the display panel PNL.

Figure 5B:
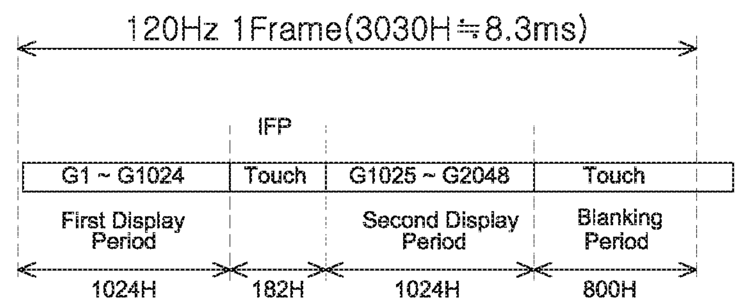
FIG. 5B is a diagram illustrating how the total duration of a single frame can be divided and allocated to accommodate a plurality of display periods and a plurality of touch scanning periods, according to an embodiment of the disclosure.

In an example depicted in FIG. 5B, a display panel having 2048 gate lines GL may be driven at 120 Hz (120 frames per second). With 2048 gate lines, a single frame can include a first display period and a second display period, each of which is 1024H long. The IFP touch scan period between the first display period and the second display period can be 182H long, and the blanking period following the second display period can be 800H long.

In this example, the length of the first display period and the length of the second display period are the same. However, it should be appreciated that the length of the first display period and the length of the second display period can be different from each other. To put it in other term, the number of gate lines provided with the scan signal during the first display period may be different from the number of gate lines provided with the scan signal during the second display period.

As will be described in further detail below, temporarily pausing the scan signal output on the same gate line for every frame can accelerate deterioration of a specific part of the gate driver GD (e.g., specific stage of a shift register, specific transistor(s), etc.). Therefore, in some embodiments, the length of the first period and the length of the second period can change in between two different frames. By way of an example, the first display period may be longer than the second display period, during a first frame (i.e., more number of gate lines are supplied with the scan signal during the first display period than the number of gate lines supplied with the scan signal during the second display period). In a second frame, the first display period may be shorter than the second display period (i.e., less number of gate lines are supplied with the scan signal during the first display period than the number of gate lines supplied with the scan signal during the second display period).

In cases where the common electrode blocks are configured as the self-capacitance touch recognition system, each of the common electrode blocks are provided with touch-driving pulses, and the signals from each of the common electrode blocks are analyzed to determine whether a touch input was registered on a particular common electrode block. More specifically, in the self-capacitive touch recognition system, charging or discharging of the touch-driving pulse on the common electrode blocks can be used to determine touch inputs on the common electrode blocks. For example, a change in the capacitance value upon a touch input changes the time in which the voltage slopes on the common electrode block. Such a change on each of the common electrode blocks can be analyzed to determine the location of touch input on the display panel PNL.

In cases where the common electrode blocks are configured as the mutual-capacitance touch recognition system, groups of common electrode blocks that are configured as the touch-driving lines (TX) are provided with the touch-driving pulses, and groups of common electrode blocks that are configured as the touch-sensing lines (RX) are provided with a touch reference voltage signal. A touch input made on the display panel PNL changes the capacitive coupling at the intersection of the touch driving line (TX) and the touch sensing line (RX), and it changes the current that is carried by the touch sensing line (RX). This information in a raw or in some processed form can be used to determine the locations of touch inputs on the display panel PNL. The touch driver TD performs this operation for each intersection of the TX and RX lines at rapid rate so as to provide multipoint sensing.

In the example shown in FIG. 3B, each of the TX lines was defined by a group of common electrode blocks arranged in a row (X-direction), and each of the RX lines was defined by a group of common electrode blocks arranged in a column (Y-direction). The number of TX and RX lines in the display panel PNL can be adjusted according to the arrangement and sizes of the common electrode blocks in the active area.

The arrangement of the common electrode blocks is not limited as depicted in FIG. 3B, and may be arranged in a various other ways depending on the desired layout of the TX and RX lines in the display panel PNL. The number of TX lines implemented with the common electrode blocks arranged in a single row as well as the number of RX lines implemented with the common electrode blocks arranged in a single column can vary depending on various factors. For instance, the common electrode blocks arranged in a single row can be used to provide multiple TX lines, and the common electrode blocks arranged in a single column can be used to provide multiple RX lines based on the touch scanning frequency and the accuracy as well as the size of the display panel PNL.

Also, the RX line in the mutual-capacitance touch recognition system can be formed with a common electrode block that is larger than the common electrode blocks forming the TX lines. For instance, rather than forming an RX line with a plurality of common electrode blocks arranged in column direction, a single large common electrode block that extends across the active area in the column direction (i.e., Y-direction) can be used as a RX line.

In order to improve the touch-sensing accuracy at the edges of the display panel PNL, the common signal lines SL from the common electrode blocks positioned at each of the far most ends of the active area (i.e., left and right ends) can be grouped together such that RX lines are formed at the far most ends of the active area. In this way, touch inputs made by the object with a very smaller touch point (e.g., 2.50) than a typical size of a finger can be recognized at the edges of the display panel PNL.

To further improve the performance of the touch-sensing capability, the width of the common electrode blocks that serve as the RX lines at the far most end of the display panel PNL may be different from the width of other touch-sensing blocks in the other areas of the display panel PNL. Configuring the common electrode blocks at the farthest ends of the display panel PNL as an RX line allows for more accurate touch input recognition even from the very end portions of the active area. However, this means that the location of the common electrode blocks that serve as the TX line will shift away from the edges by the width of the common electrode blocks serving as the RX line at the edges. Also, each TX line does not fully extend across the RX lines positioned at the edges. Accordingly, the width of the common electrode blocks at the edges may be narrower than the width of the common electrode blocks at other areas of the active area. For instance, the width of the common electrode blocks, measured in X-direction, at the edges of the active area may be ½ of common electrode blocks positioned elsewhere.

To improve the touch-sensing accuracy at the upper and lower edges of the display panel PNL, the common electrode blocks at the upper and lower edges of the display panel PNL can have a reduced width, measured in Y-direction, as compared to other common electrode blocks at different areas of the display panel PNL. This way, narrower TX lines can be provided at the top and bottom edges of the display panel PNL.

Regardless of which type of touch recognition system is implemented in the display panel PNL, each of the common electrode blocks are connected with at least one common signal line SL. The common signal lines SL extend parallel to one another and routed outside the active area in the same direction as the data lines DL. Arranging the common signal lines SL parallel to each other and having them routed across the active area toward the drivers allows to eliminate needs for a space in the non-display area of the display panel for routing the common signal lines SL, and thereby reducing the size of the bezel.

Each common signal line SL connected to a corresponding common electrode block runs across the active area of the display panel PNL toward the non-display area, bypassing common electrode blocks that are connected other common signal lines. For instance, the common signal line SL connected to the common electrode block B1 is routed across underneath the common electrode blocks B4 and B7 to reach the non-display area where the drivers are located without being in contact with the common electrode blocks B4 and B7 in the route.

The common signal lines SL cannot be positioned immediately on the surface of the common electrode blocks. If the common signal lines SL are routed on the surface of the common electrode blocks, the common signal lines SL will be in contact with multiple common electrode blocks along path toward the non-display area. This will disrupt the unique coordinates of the common electrode blocks in the self-capacitance touch recognition system or break the formation of TX/RX lines in the mutual-capacitance touch recognition system.

Also, when the common signal lines SL are positioned in the same layer as the pixel electrode PXL, coupling generated between the common signal lines SL and the pixel electrode PXL may cause various display defects when the common signal lines SL are used to modulate the common electrode blocks during the touch-sensing period. Accordingly, placing the common signal lines SL in the same layer as the pixel electrodes PXL makes it difficult to reduce the space between the common electrode blocks and the pixel electrode PXL, resulting in lower storage capacitance. Further, unwanted fringe field may be generated when the common signal lines SL are placed in either the common electrode layer or the pixel electrode layer. Such fringe field can affects the liquid crystal molecules and lead to undesired light leakage. Thus, in order to route the common signal lines SL across the active area of the display panel PNL, the plane level of the common signal lines SL should be different from the plane levels of the pixel electrode and the common electrode blocks.

Placing the common signal lines SL between the layer of pixel electrode and the layer of common electrode blocks poses similar problems. In such a configuration, an insulation layer should be provided between the layer of the common electrode blocks and the layer of common signal lines SL. The thickness of the insulation layer interposed between the pixel electrode and the common electrode blocks is limited in the IPS or the FFS mode LCD device, and it also limits the thickness of the common signal lines SL as it cannot be greater than the thickness of the insulation layer between the layer of pixel electrodes and the layer of common electrode blocks.

For instance, when the thickness of the insulation layer interposed between the pixel electrode and the common electrode blocks is about 3000 Å, the thickness of the common signal lines SL is limited to about 2500 Å if the common signal lines SL are to be placed between the common electrode blocks and the pixel electrode. Since the thickness is one of the factors affecting the resistance of the common signal lines SL, the limitation as to the thickness of the common signal lines SL effectively limits the performance of the common signal lines SL in transmitting signals between the driver and the common electrode blocks, especially as the size of the display area in the device becomes larger.

For the reasons stated above, the common signal lines SL are positioned under the array of TFTs such that they are sufficiently distanced away from the pixel electrode and the common electrode blocks provided above the array of TFTs. Such a setting provides more leeway in increasing the width and thickness of the common signal lines SL. To this end, one or more planarization layer is provided between the common signal lines SL and the common electrode blocks, and the common signal lines SL are connected to the corresponding common electrode blocks via contact holes through the planarization layer. In such settings, each of the common signal lines SL connected to a common electrode block can be routed across the active area without contacting other common electrode blocks placed along its route. The common signal lines SL can simply bypass the common electrode blocks along the path to the touch driver TD in the inactive area.

[Bypass Lines]

In some embodiments, the common signal lines SL are connected to the corresponding common electrode blocks via bypass lines, which are connected to both the common signal lines SL and the common electrode blocks through the contact holes in the planarization layers.

Figure 6A:
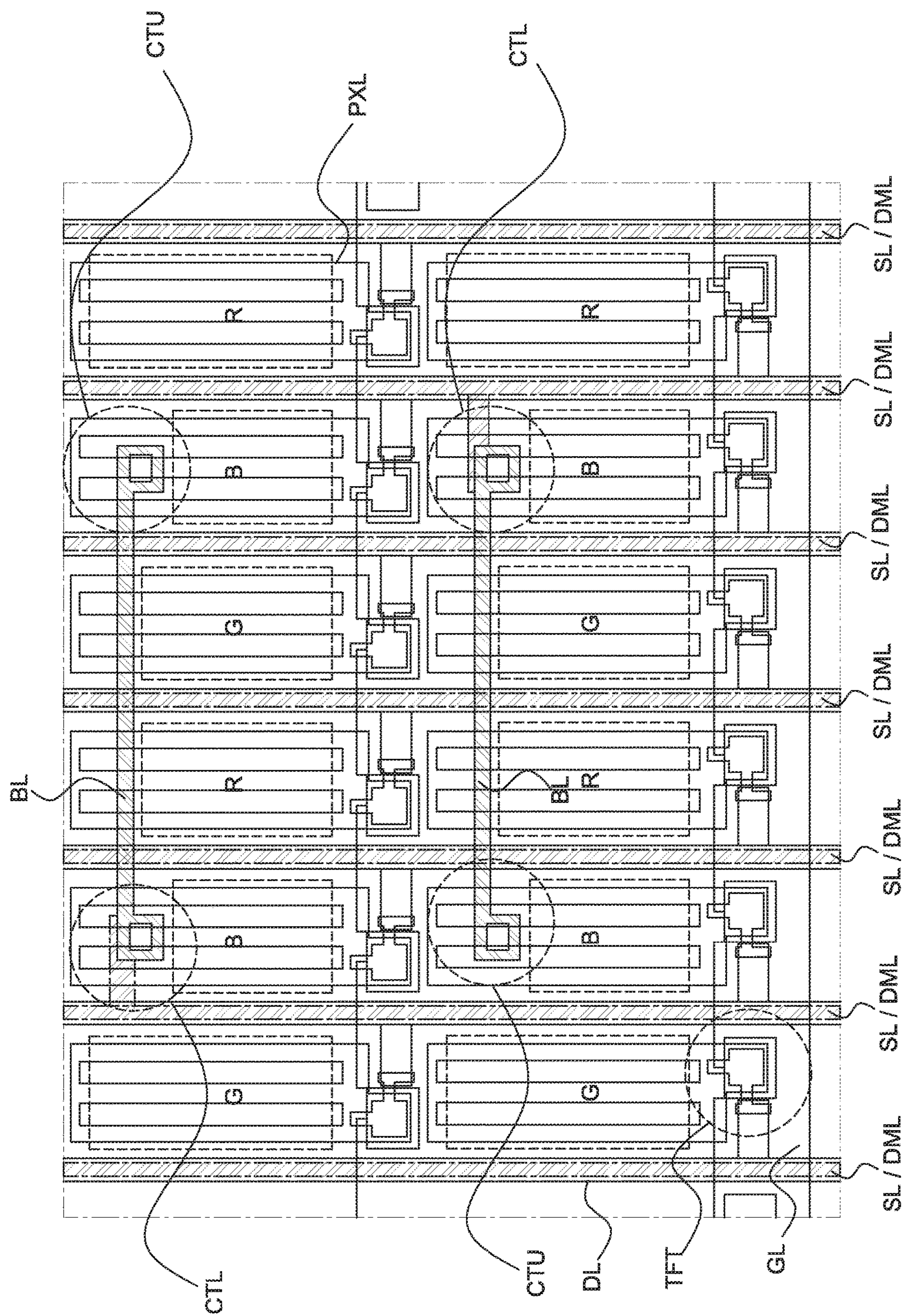
FIG. 6A is a schematic illustration showing an exemplary configuration of the common signal lines and the bypass lines in the display panels, according to an embodiment of the present disclosure.

FIG. 6A is a top view of an exemplary configuration of the common signal lines SL and the bypass lines BL in a matrix of pixel regions in the display panel PNL, according to an embodiment of the present disclosure. Referring to FIG. 6A, the data lines DL and the gate lines GL are arranged to intersect each other, thereby defining a matrix of pixel regions in the display area of the display panel PNL. The common signal lines SL are arranged to extend in the same direction as the data lines DL. Each common signal line SL is positioned to at least partially overlap with a data line DL to minimize reduction in the aperture ratio of the pixel regions by the common signal lines SL. As will be described below, a dummy line DML may be placed underneath some of the data lines DL in place of the common signal line SL.

Each pixel region is provided with a TFT. The TFT may be formed in the bottom gate structure with the source and drain provided on the opposite side of the semiconductor layer SEM. Such TFT structure is sometimes referred to as the inverted staggered structure or the back-channel etched structure. The source electrode of the TFT extends from or otherwise connected to the data line DL, and the drain is connected to the pixel electrode PXL (not shown in FIG. 6A) provided in the corresponding pixel region. The pixel electrode PXL is provided with a plurality of slits to generate electrical field in conjunction with the overlapping common electrode block (not shown).

The common signal lines SL are placed under the TFTs of the pixels, and each of the common electrode blocks is connected to the ones of the corresponding common signal lines SL via contact holes (i.e., lower contact hole: CTL; upper contact hole: CTU) through the planarization layers formed over the TFTs. In this configuration, each common signal line SL is connected to at least one bypass line BL that is connected to the corresponding common electrode block.

The bypass line BL may be arranged in the same direction as the gate line GL such that a bypass line BL extends across from one pixel region to another pixel region of the same row. That is, the connection between the bypass line BL and the common signal line SL can be made via a contact hole provided in one pixel region, and the connection between the bypass line BL and the common electrode block can be made via a contact hole provided in another pixel region. As shown in FIG. 6A, usable aperture ratio in the pixel regions vary due to the bypass lines BL and the contact holes (CTL, CTU) for connecting the common signal lines SL and the common electrode blocks to the bypass lines BL.

Figure 6B:
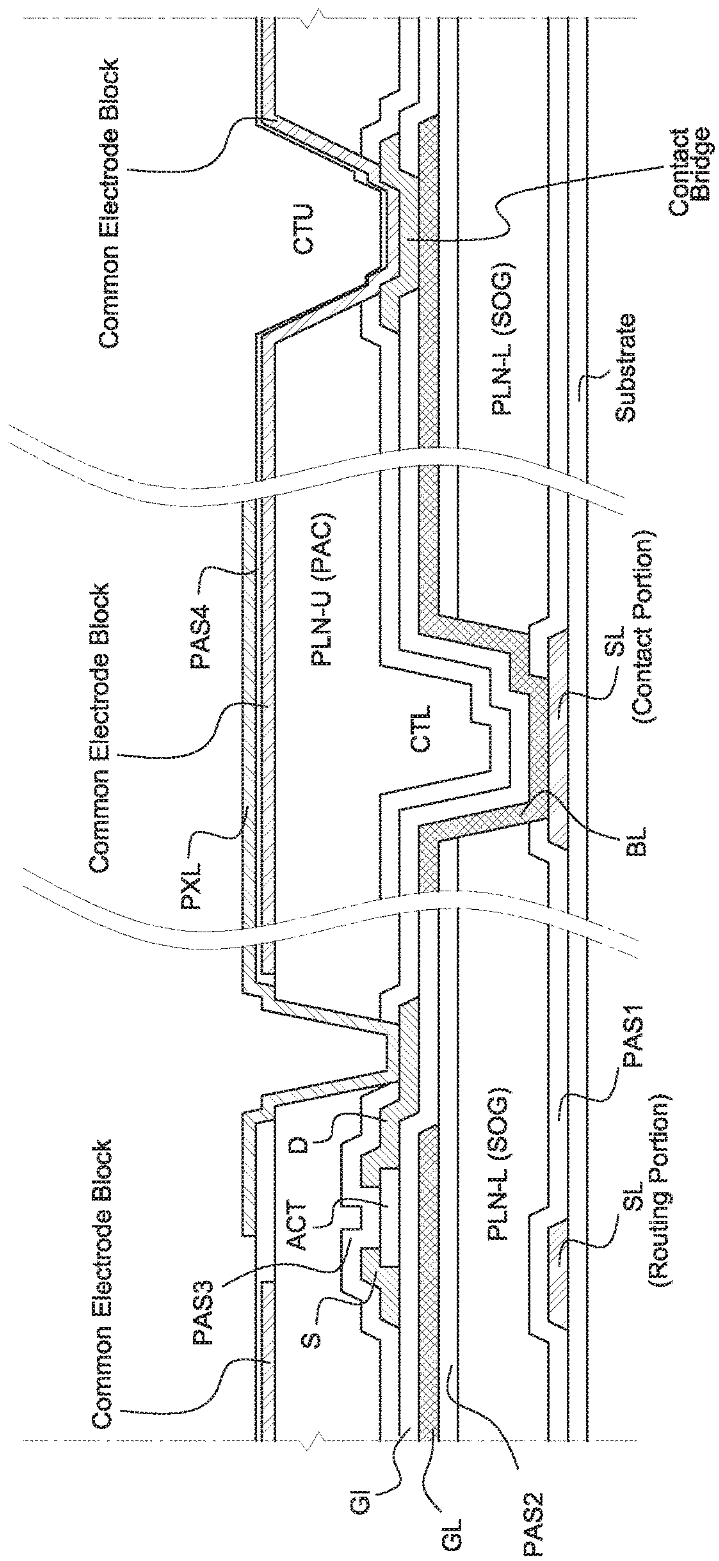
FIG. 6B is a cross-sectional view showing an exemplary configuration for connecting a common signal line to a transparent electrode block via a bypass line, according to an embodiment of the present disclosure.
Figure 6C:
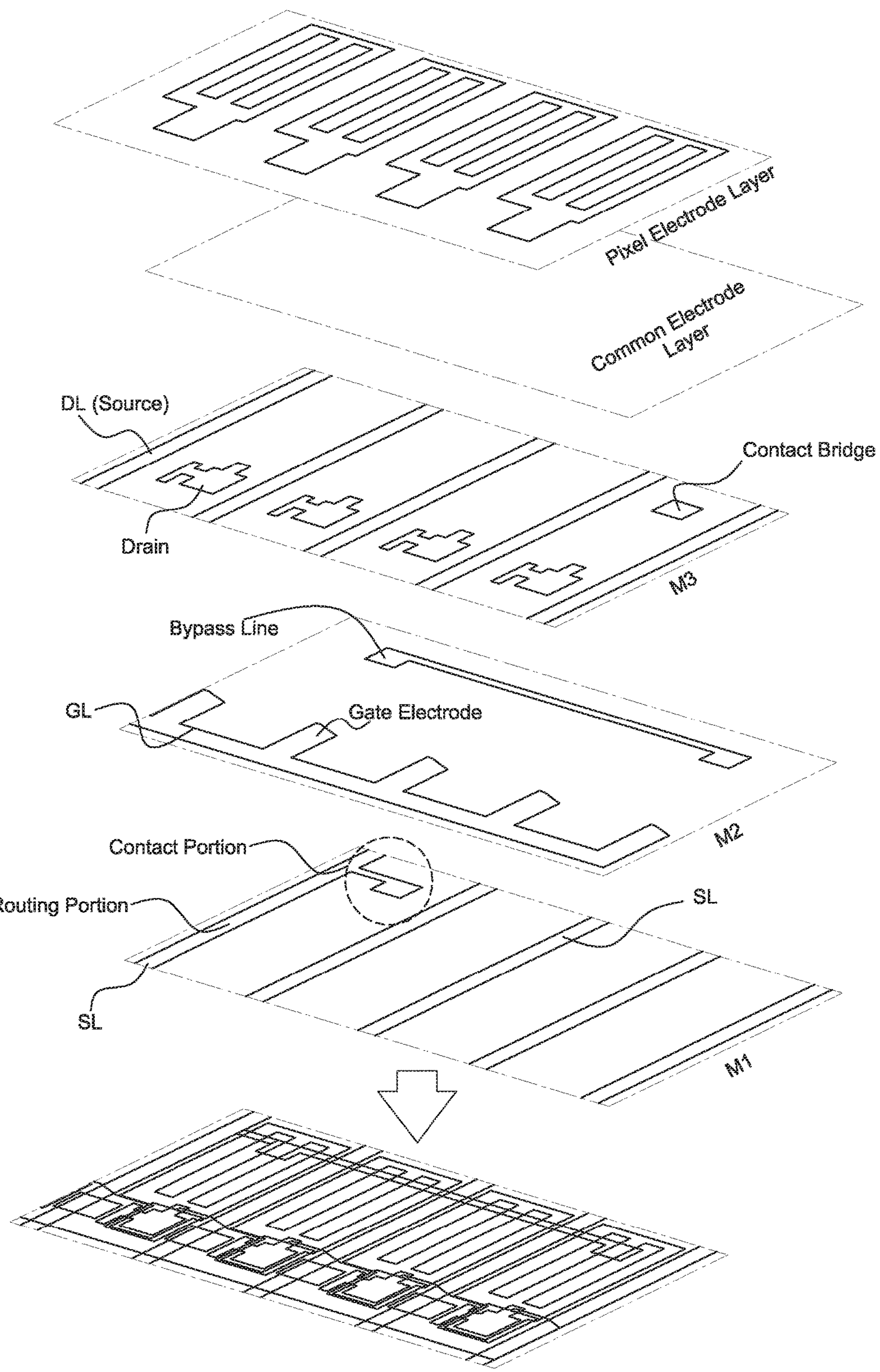
FIG. 6C is a schematic illustration showing the order in which the metal layers forming the common signal lines, the bypass lines, the gate lines, the data lines and the source/drain of the thin-film transistor, according to an embodiment of the present disclosure.

FIG. 6B is a cross-sectional view showing an exemplary configuration for connecting a common signal line to a common electrode block via a bypass line BL. FIG. 6C illustrates the order in which the metal layers are disposed over one another to form the common signal lines SL, the bypass lines BL, the gate lines GL, the data lines DL and the source/drain of the TFT in the display panel PNL. In the present disclosure, the metal layer is referred in accordance with the order in which each of the metal layers is placed on the substrate.

Referring to FIGS. 6B and 6C, the common signal lines SL are formed with the first metal layer on the substrate. The metal layer used in forming the common signal lines SL is referred to as the first metal layer M1 as it is first metal layer disposed on the substrate, and for convenience of explanation, other metal layers on the first metal layer M1 are referred to as the second metal layer M2, the third metal layer M3 and so forth in the order from the first metal layer M1. The second metal layer M2 may be referred to as the gate metal layer and the third metal layer M3 may be referred to as the source/drain metal layer.

It should be noted that the term "first metal layer" do not necessarily mean that the layer is comprised of a single metal layer. Instead, the term "first metal layer" refers to a metal layer or a stack of metal layers capable of being patterned on a surface and insulated from another layer of metal layer or another stack of metal layers by an insulation layer. Similar to the first metal layer M1, other subsequent metal layers (e.g., the second metal layer M2, the third metal layer M3) in the embodiments of the present disclosure may be formed of a stack of multiple layers of different metals.

The metal layers forming the common signal lines SL, gate lines GL, bypass lines BL, and data lines DL may be formed of a stack of metal layers such as copper, molybdenum, titanium, aluminum and the combination thereof. In a suitable embodiment, the first metal layer M1 may be formed of a stack of a copper layer (Cu) and a molybdenum-titanium alloy layer (MoTi). The second metal layer M2 may also be a stack of a copper layer (Cu) and a molybdenum-titanium alloy layer (Mori). The third metal layer M3 may be a stack of a molybdenum-titanium alloy layer (Moti), copper layer (Cu) and another molybdenum-titanium alloy layer (Moti). The copper layer may be thicker than the molybdenum-titanium alloy layer in each of the metal layers.

[Lower Planarization Layer]

To provide an array of TFTs on the common signal lines SL, a lower planarization layer PLN-L is provided over the common signal lines SL. The thickness of the lower planarization layer PLN-L may vary depending on the thickness of the common signal lines SL. For example, the thickness of the common signal lines SL may range from about 2500 Å to about 7500 Å, and more preferably from about 3500 Å to about 6500 Å, and more preferably from about 4500 Å to about 5500 Å. In one particular example, the common signal lines SL are patterned from the first metal layer M1 formed of a stack of a copper layer (Cu) and a molybdenum-titanium alloy layer (MoTi), the thickness of the copper layer can be ranged from about 4500 Å to about 5500 Å and the thickness of the molybdenum-titanium alloy layer (MoTi) can be ranged from about 100 Å to about 500 Å.

The thickness of the lower planarization layer PLN-L covering the common signal lines SL may range from about 0.5 μm to 4 μm, and more preferably from about 0.5 μm to 3 μm, and more preferably from about 0.5 μm to 2 μm. The thickness of the planarization layer that covers the common signal lines SL can vary based on various factors, such as the dielectric property, material, fabrication process, and more.

The array of TFTs is fabricated on the lower planarization layer PLN-L. It should be noted that fabrication of TFTs involves high-temperature processes and chemical treatments. The upper planarization layer PNL-U placed on the TFTs is not directly affected by the processes and treatments involved in fabrication of the TFTs. On the other hand, the lower planarization layer PNL-L, which is provided under the TFTs, is directly affected by the processes and treatments performed during fabrication of the TFTs, electrodes and other components on the lower planarization layer PNL-L.

Accordingly, the lower planarization layer PNL-L should have sufficient thermal stability, mechanical stability, chemical endurance and resistance to photoresist strippers/developers so that the lower planarization layer can withstand processes and treatments performed in forming the array of the TFTs, electrodes and various other components implementing the pixel circuitry.

For example, some of the processes during the fabrication TFTs with an oxide semiconductor layer, such as IGZO (indium-Gallium-Zinc-Oxide), may be carried out at about 350 degrees Celsius or higher. Fabrication of TFTs with a poly-silicon semiconductor layer may require a process performed at even a higher temperature. As such, the lower planarization layer PLN-L cannot be formed of photo-acryl, which is generally used as the planarization layer covering the TFTs. Instead, the lower planarization layer PLN-L may be formed of a material exhibiting a sufficient thermal stability to cover the common signal lines SL and to provide a planar surface for the TFTs to be fabricated thereon, while sustaining the physical structure and the optical property to be used in a display panel PNL.

In particular, the lower planarization layer PLN-L should maintain a planar surface over the common signal lines SL at a temperature equal to or greater than 350 degrees Celsius. More preferably, the lower planarization layer PLN-L may maintain a planar surface over the common signal lines SL at a temperature equal to or greater than 380 degrees Celsius. To put it in another term, the lower planarization layer PLN-N may include a material, which exhibits less than 1% of thermal gravimetric analysis (TGA; isothermal) at 350 degrees Celsius for 30 minutes (% weight loss at 350 C/30 min). More preferably, the lower planarization layer PLN-N may include a material, which exhibits less than 0.1% of TGA at 380 degrees Celsius for 30 minutes.

The lower planarization layer PLN-L should exhibit suitable optical properties, even following the processes and treatments involved during the fabrication of TFTs. This is especially true for a LCD panel as the light emitted from the light source would pass through the lower planarization layer PNL-L. In this regard, the average light transmittance rate of the lower planarization layer PNL-L may be greater than 70%, more preferably greater than 80%, and more preferably greater than 90% (% measured for 400-800 nm thickness on a bare glass). Further, the refractive index of the material for forming the lower planarization layer PNL-L may have a refractive index ranged from 1.4 to 1.6. In a particular example, a bare glass coated with the lower planarization layer PNL-L in a thickness of 400 nm exhibited average light transmittance of about 91.24%~91.25%, even after being placed at 380 C for 30 minutes. Also, the lower planarization layer PNL-L exhibited a refractive index of 1.49 at 633 nm thickness.

The lower planarization layer PNL-L should also exhibit sufficient chemical endurance to withstand the chemical treatments during fabrication of TFTs, electrodes and other components on the lower planarization layer PNL-L. For instance, the lower planarization layer PNL-L may exhibits sufficient chemical endurance against deionized water (DI), isopropyl alcohol (IPA), propylene glycol methyl ether acetate (PGMEA) and the like. In a particular example, the thickness of a lower planarization layer PNL-L (e.g., 1.3 um) may change less than 10 angstroms when treated with DI water or IPA (at 70 C/10 min), and may change less than 20 angstroms when treated with PGMEA (at RT/10 min).

The lower planarization layer PNL-L should also have sufficient resistance to photoresist strippers/developers used in fabrication of TFTs, electrodes and other components on the lower planarization layer PNL-L. In a particular example, the thickness of a lower planarization layer PNL-L (e.g., 1.3 um) may change less than 10 angstroms when treated with N-Methyl-2-pyrrolidone (NMP) (at 70 C/10 min), and may change less than 20 angstroms when treated with 2.38% tetra-methyl-ammonium hydroxide (TMAH) (at RT/10 min).

In some embodiments, the lower planarization layer PNL-L is formed of an organosiloxane hybrid layer based on Si—O monomer and polymer. In the present disclosure, the hybrid polysiloxane polymer layer may be simply referred to as a SOG layer.

In embodiments where the lower planarization layer PNL-L is formed of a SOG layer, the lower planarization layer may include a hybrid polysiloxane polymer layer, where the hybrid polymer contains organic contents, which includes alkyl and aryl functionalities, as expressed in the chemical formula

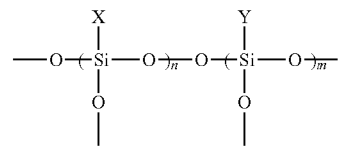

1 below.

[Formula 1] (n and m refer to number of repeating units)

The material for forming the lower planarization layer PNL-L (e.g., SOG layer) should also be suitable for spin-on-glass method, slit coating method, slot-die coating method or other suitable coating methods to cover and to provide planar surface on the common signal lines SL. In some embodiments, viscosity profile of the material that forms the lower planarization layer PNL-L is in a range between 2.5 cps to 3 cps at 25 C, and more preferably in a range between 2.5 cps to 2.7 cps at 25 C. The density of the material that forms the lower planarization layer PNL-L may be about 1.0 g/ml at 25 C. Curing process may be performed once the lower planarization layer PNL-L is coated over the common signal lines SL.

Metallic ions from the first metal layer M1, which forms the common signal lines SL, may be diffused into the lower planarization layer PLN-L by the heat from the curing process of the lower planarization layer PLN-L and/or the annealing processes involved in TFT fabrication. Similarly, metallic ions from the second metal layer M2, which forms the gate lines GL and the bypass lines BL, may also be diffused into the lower planarization layer PLN-L by the heat involved during curing/annealing processes. For instance, Cu diffusion into the lower planarization layer can occur when either the first metal layer M1 or the second metal layer M2 includes copper (Cu). Furthermore, metallic ion impurities and/or moisture from the glass substrate may also be diffused into the lower planarization layer PLN-L. Such metallic ions and other impurities diffused into the lower planarization layer PLN-L can increase the permittivity of the lower planarization layer PLN-L, which in turn increases resistance-capacitance (RC) delay time that hampers the touch sensing performance of the display panel PNL.

Accordingly, in some embodiments, a passivation layer PAS1, serving as a capping layer, is provided under the lower planarization layer PLN-L. In such embodiments, the passivation layer PAS1 covers the common signal lines SL and the surface of the substrate. Not only does the passivation layer PAS1 block metallic ions and other impurities from the common signal lines SL and the substrate, it also improves adhesion of the lower planarization layer PLN-L on the substrate. Further, in some embodiments, a passivation layer PAS2 may be provided on the lower planarization layer PLN-L. In this case, the passivation layer PAS2 is interposed between the lower planarization layer PLN-L and the second metal layer M2 (e.g., gate lines GL, bypass lines BL) to suppress diffusion from the second metal layer M2.

The passivation layer PAS1 and PAS2 may be a silicon nitride layer, a silicon oxide layer or stacks of such layers. In some suitable embodiments, the passivation layer PAS1 under the lower planarization layer PLN-L and the passivation layer PAS2 on the planarization layer PLN-L may be provided in a substantially the same thickness, and may be formed of the same inorganic material. For instance, both the passivation layer PAS1 and the passivation layer PAS2 may be a silicon nitride layer with a thickness between about 1000 Å and about 3000 Å. In some suitable embodiments, the lower planarization PLN-L having a thickness of 17,000 Å can be provided with the passivation layer PAS1 and the passivation layer PAS2, each with a thickness of about 2000 Å.

Not only does the passivation layer PAS2 serve as a capping layer, it can also provide protection for components that are placed on the lower planarization layer PLN-L from undesired fumes (e.g., hydrogen fumes) from the lower planarization layer PLN-L. As such, the material and configuration of the passivation layer PAS2 between the lower planarization layer PLN-L and the array of TFT can vary depending on the semiconductor layer (i.e., active layer) of the TFTs on the lower planarization layer PLN-L. For example, in some embodiments, the passivation layer PAS2 may be formed of a silicon nitride layer when the TFTs above uses oxide metal semiconductor (e.g., IGZO). It should be noted that, in some embodiments, the passivation layer PAS2 may not be provided between the lower planarization layer PLN-L and the conductive lines of the second metal layer M2, for instance the gate lines GL and the bypass lines BL.

With the common signal lines SL covered under the lower planarization layer PLN-L, the gate lines GL and the gates G of the TFTs are patterned with the second metal layer M2 on the lower planarization layer PLN-L. The bypass lines BL are also patterned from the second metal layer M2 provided on the lower planarization layer PLN-L. The semiconductor layer (e.g., oxide, LTPS, a-Si) is patterned on the gate insulation layer GI to provide the TFT's channel ACT. The data line DL, which is connected to the source S of the TFT, is formed with the third metal layer M3.

To provide a planar surface for placing the common electrode blocks, the upper planarization layer PLN-U is provided over the TFTs and the bypass lines BL. The drain D of the TFT is in contact with the pixel electrode PXL through a contact hole in the upper planarization layer PLN-U. As shown, a passivation layer PAS3 formed of inorganic material, such as SiNx and/or SiOx, may be interposed between upper planarization layer PLN-U and the third metal layer M3. Another passivation layer, PAS4, is interposed between the common electrode blocks and the pixel electrodes PXL provided on the upper planarization layer PLN-U.

A contact bridge may be present at upper contact hole CTU for connecting a bypass line BL and the corresponding common electrode block. More specifically, the contact bridge is patterned from the third metal layer M3 on the contact region of the bypass line BL (i.e., BL-VCOM contact region), and is exposed through the upper contact hole CTU in the upper planarization layer PLN-U.

Each one of the common signal lines SL is connected to one of the common electrode blocks by one or more bypass lines BL. In this regard, one end of a bypass line BL is connected to the common signal line SL via a lower contact hole CTL through the lower planarization layer PLN-L at the SL-BL contact region. The other end of the bypass line BL is connected to the common electrode block via the upper contact hole CTU through the upper planarization layer PLN-U at the BL-VCOM contact region. As depicted in FIG. 6B, a contact bridge formed of the same metal layer as the source/drain metal of the TFT (i.e., the third metal layer M3), may be interposed between the bypass line BL and the common electrode block. The common electrode block can come in contact with the contact bridge through the upper contact hole CTU so as to electrically connect the common electrode block and the bypass line BL. However, it should be noted that the contact bridge is not necessary to provide the connection between the bypass line BL and the common electrode block. As such, in some other embodiments, the bypass line BL may directly contact the common signal line SL through the lower contact hole CTL without the contact bridge interconnecting them.

Each common signal line SL includes a routing portion extending under a data line DL and a contact portion projecting out from the routing portion toward the lower contact hole CTL. The end of the contact portion at the SL-BL contact region may be enlarged to ensure the contact area size through the lower contact hole CTL. Likewise, the ends of the bypass line BL corresponding to the SL-BL contact region and the BL-VCOM contact region may be wider than the interim section of the bypass line BL. Although only one of the common signal line SL is depicted with the contact portion in FIG. 6C, contact portions of other common signal lines SL may be placed in pixel regions of different rows.

[Exemplary Manufacturing Steps/Masks]

Figure 7A:
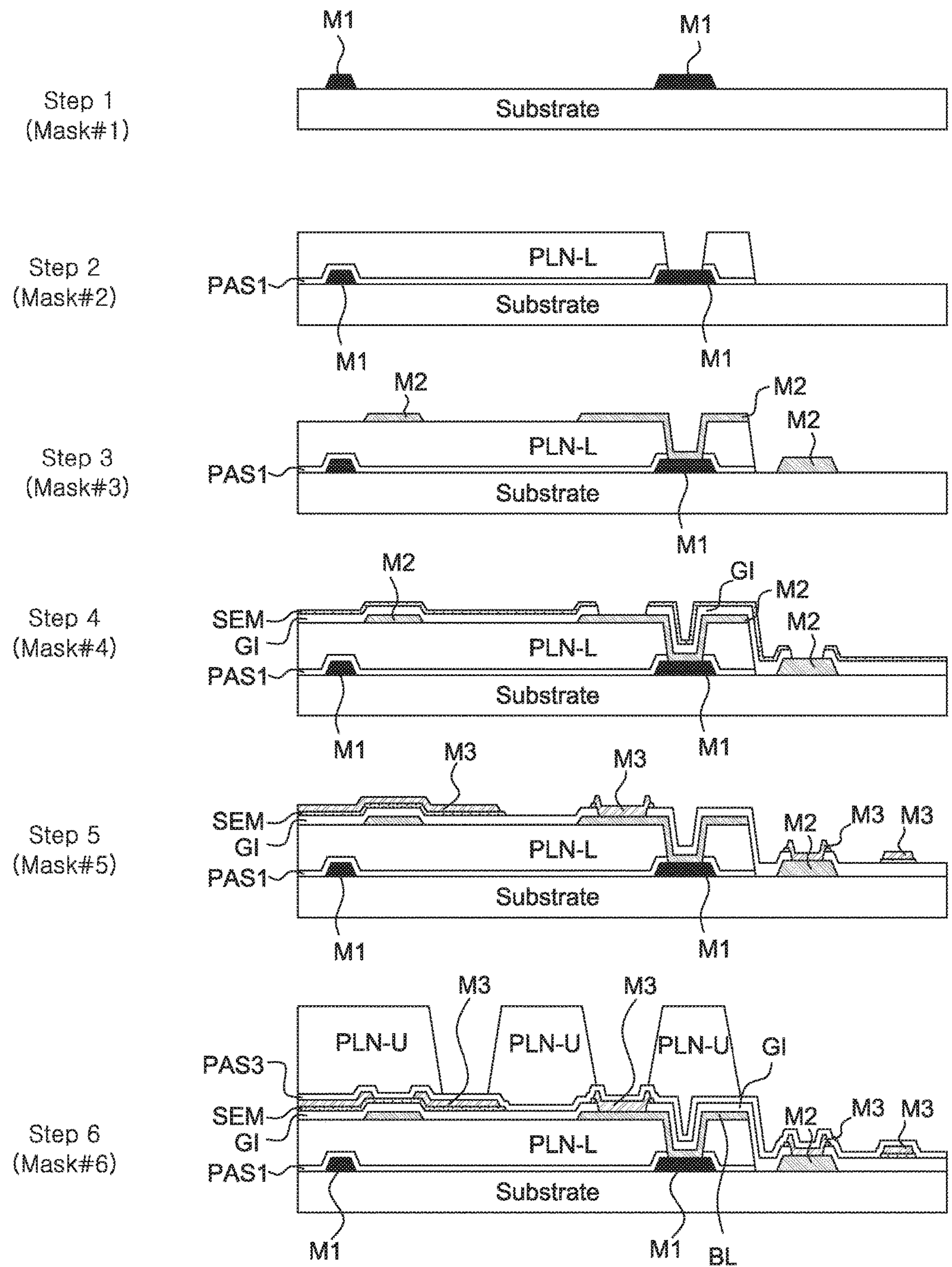
FIGS. 7A-7B illustrate cross-sectional views of a display panel during manufacturing steps, according to an embodiment of the present disclosure.
Figure 7B:
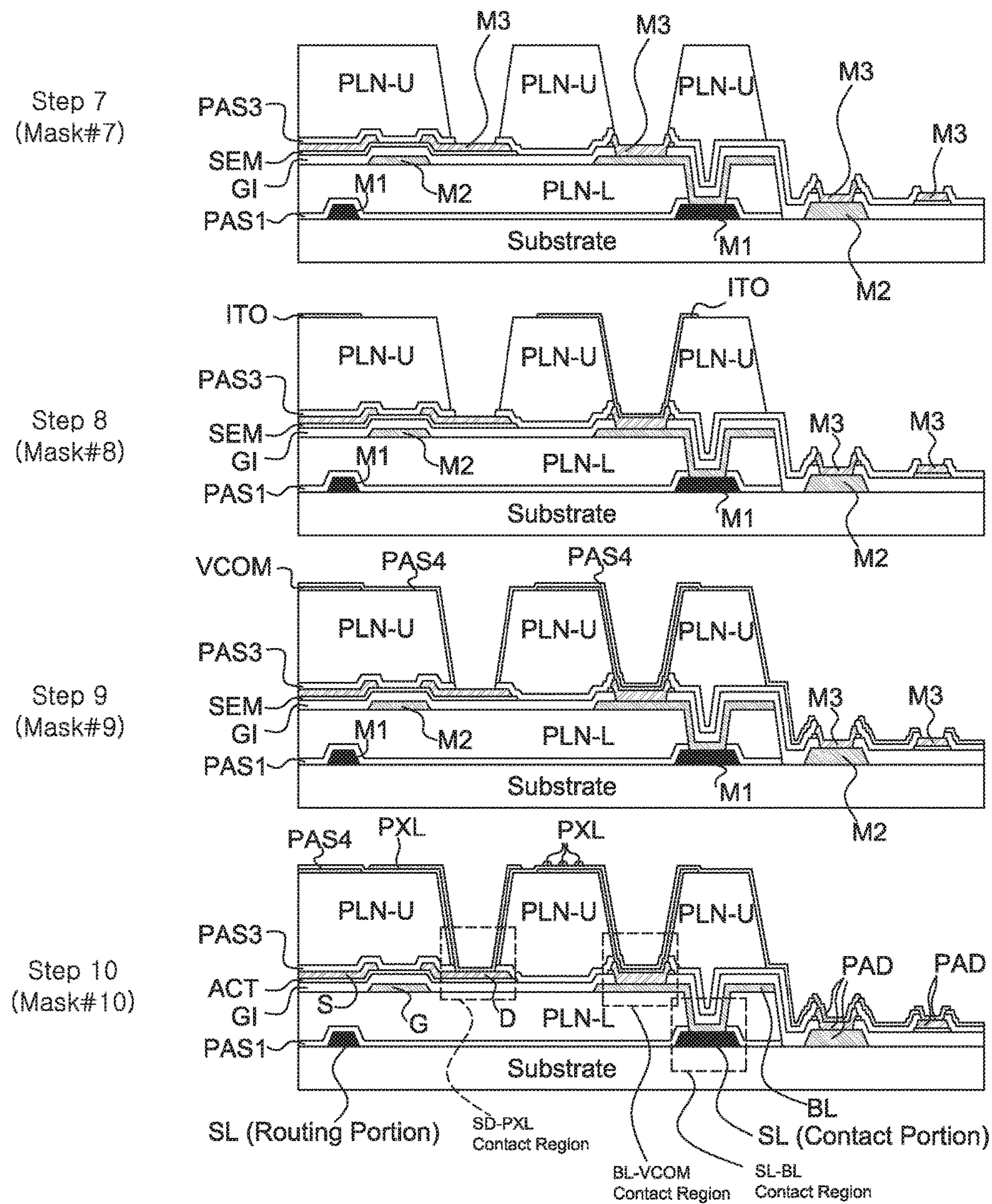

FIGS. 7A and 7B illustrate an exemplary manufacturing method for a TFT substrate of a display panel PNL, according to an embodiment of the present disclosure. Referring to FIGS. 7A and 7B, in step 1, the first metal layer M1 is disposed on the lower substrate and is patterned to form the common signal lines SL on the lower substrate. Although not shown here, the first metal layer M1 may be patterned to form conductive lines and/or pads in the non-display area of the display panel PNL, if desired.

In step 2, the lower planarization layer PLN-L is disposed on the common signal lines SL. As shown, the passivation layer PAS1 may be provided on common signal lines SL and on the surface of the lower substrate. A lower contact hole CTL is formed at the SL-BL contact region where the connection between the common signal line SL and a bypass line BL is to be made. As such, a connection portion of a common signal line SL is exposed through the lower contact hole CTL at the SL-BL contact region.

If desired, some part of the lower substrate in the non-display area may not be covered by the lower planarization layer PLN-L. For instance, in some embodiments, drivers (e.g., gate driver GD, data driver DD, touch driver TD), metal traces (e.g., metal lines and pads) for connecting flexible printed circuit boards (FPCB) in the non-display area may be placed on the lower substrate without being covered under the lower planarization layer PLN-L.

Curing process may be performed once the lower planarization layer PNL-L is coated over the common signal lines SL. As the curing temperature increases, the coefficient of thermal expansion (CTE) for the lower planarization layer PLN-L (e.g., the SOG layer) decreases. The lower planarization layer PLN-L may deteriorate when cured at a temperature that causes decomposition of Si—O bonding. Also, the hardness and the modulus of the lower planarization layer PLN-L increase as the curing temperature is raised, which can make the lower planarization layer PLN-L prone to cracks. As such, in suitable embodiments, the curing temperature may be in a range between 350 C and 400 C. However, it should be appreciated that the curing temperature is not limited as such, and can vary depending on the material of the lower planarization layer PLN-L.

In step 3, the second metal layer M2 is patterned on the lower planarization layer PLN-L to form the gate lines GL and the bypass lines BL. Similar to the first metal layer M1, the second metal layer M2 may also be patterned to form metal traces in the non-display area, which may be arranged to be in contact with the metal traces patterned from the first metal layer M1. If the lower planarization layer PLN-L exists in the non-display area between the metal traces of the first metal layer M1 and the second metal layer M2, they may come in contact via contact holes through the lower planarization layer PLN-L.

As mentioned above, a passivation layer PAS2 may be provided on the lower planarization layer PNL-L before placing the gate lines GL and the bypass lines BL. In some embodiments, the lower contact holes CTL for connecting the common signal lines SL and the bypass lines BL may be formed after the passivation layer PAS2 is placed on the lower planarization layer PLN-L.

Alternatively, in some other embodiments, the lower contact holes CTL at the SL-BL contact regions may be formed prior to forming the passivation layer PAS2 on the lower planarization layer PLN-L for enhanced protection against hydrogen fume (H+) from the lower planarization layer PLN-L. More specifically, the lower contact holes CTL can be formed before placing the passivation layer PAS2 on the lower planarization layer PLN-L. In this way, the passivation layer PAS2 is placed on the lower planarization layer PLN-L with the contact hole already formed therein, and thus the side wall surface within the lower contact holes CTL can be covered by the passivation layer PAS2.

It should be noted that there may be free/unbound hydrogen (H) species in the passivation layer PAS2 (e.g., $Si_3N_4$) as well. Such hydrogen species may hamper the TFT performance, especially if the TFT to be placed on the lower planarization layer PLN-L includes TFTs with oxide metal semiconductor (e.g., IGZO). As such, in embodiments in which the passivation layer PAS2 is present on the lower planarization layer PLN-L, the curing process may be performed after forming the passivation layer PAS2 on the lower planarization layer PLN-L. In this way, the free/unbound hydrogen (H) species in the passivation layer PAS2 can be reduced during the curing process.

In step 4, a gate insulation layer GI is provided on the gate lines GL and the bypass lines BL. On top of the gate insulation layer GI, a semiconductor layer SEM (e.g., IGZO) is disposed. Then, a contact hole is formed through the gate insulation layer GI and the semiconductor layer SEM to expose a part of the bypass line BL at the BL-VCOM contact region.

In step 5, the third metal layer M3 is disposed over the semiconductor layer SEM, and is patterned along with the semiconductor layer SEM to form the data lines DL and source/drain of the TFTs. Accordingly, the semiconductor layer SEM under the source/drain of the TFTs as well as under the data lines DL remains intact even after the patterning of the third metal layer M3.

The bypass line BL at the BL-VCOM contact region can be damaged during patterning of the third metal layer M3. As such, the photoresist may be remained on the BL-VCOM contact region during patterning of the third metal layer M3. As a result, the third metal layer M3 under the photoresist at the BL-VCOM contact region remains intact on the bypass line BL as depicted in FIG. 7A. In this case, electrical connection between the bypass line BL and the common electrode block is made via the piece of third metal layer M3 remaining at the BL-VCOM contact region, which is referred in the present disclosure as the contact bridge.

In step 6, another passivation layer PAS3 is formed on the source/drain of the TFTs and the data lines DL. Then, the upper planarization layer PNL-U is provided on the passivation layer PAS3 to provide a planar surface over the TFTs and the data lines DL. As the upper planarization layer PNL-U is provided on top of the TFTs and the data lines DL, the thermal stability of the material forming the upper planarization layer PLN-U need not be as great as the material of the lower planarization layer PLN-L. Accordingly, the upper planarization layer PLN-U may be formed of photo-acryl. The upper contact holes CTU are formed through the upper planarization layer PLN-U, exposing the passivation layer PAS3 at the drain region of the TFTs and at the BL-VCOM contact region.

In step 7, the passivation layer PAS3 at the BL-VCOM contact region is removed to expose the contact bridge at the BL-VCOM contact region. Here, the passivation layer PAS3 at the SD-PXL contact region of the TFT may remain in the upper contact hole CTU.

In step 8, a transparent conductive layer, such as indium-tin-oxide (ITO) layer is formed on the upper planarization layer PLN-U to serve as the common electrode VCOM of the display panel PNL. As described above, the common electrode VCOM is patterned into a plurality of separated pieces, i.e., common electrode blocks.

In step 9, yet another passivation layer PAS4 is provided on the common electrode blocks and on the upper planarization layer PLN-U. The passivation layer PAS4 may also cover the surfaces inside the contact holes. For instance, passivation layer PAS4 may cover the passivation layer PAS3 exposed under the upper contact hole CTU at the SD-PXL contact region, the part of the common electrode block in the upper contact hole CTU at the BL-VCOM contact region as well as the conductive lines/pads in the non-display area. Afterward, the passivation layer PAS4 can be etched at the selective regions to expose the surface thereunder. As shown, the passivation layer PAS4 can be etched along with the passivation layer PAS3 inside the upper contact hole CTU at the SD-PXL contact region to expose the drain of the TFT.

In step 10, another transparent conductive layer (e.g., ITO) is disposed on the passivation layer PAS4, and is patterned to form the pixel electrodes PXL. As the SD-PXL contact region of the TFT is exposed, the transparent conductive layer comes in contact with the drain of the TFT. If desired, the transparent conductive layer can be disposed on the conductive lines/pads positioned in the non-display area as well.

In some embodiments, the common signal lines SL may be in direct contact with the corresponding common electrode blocks. Since the common signal line LS is directly connected to the corresponding common electrode block without using the bypass line BL, any side effects which may result from using the bypass line BL (e.g., aperture ratio loss in the pixels) can be resolved.

[Common Signal Line-Transparent Block Direct Contact]

Figure 8A:
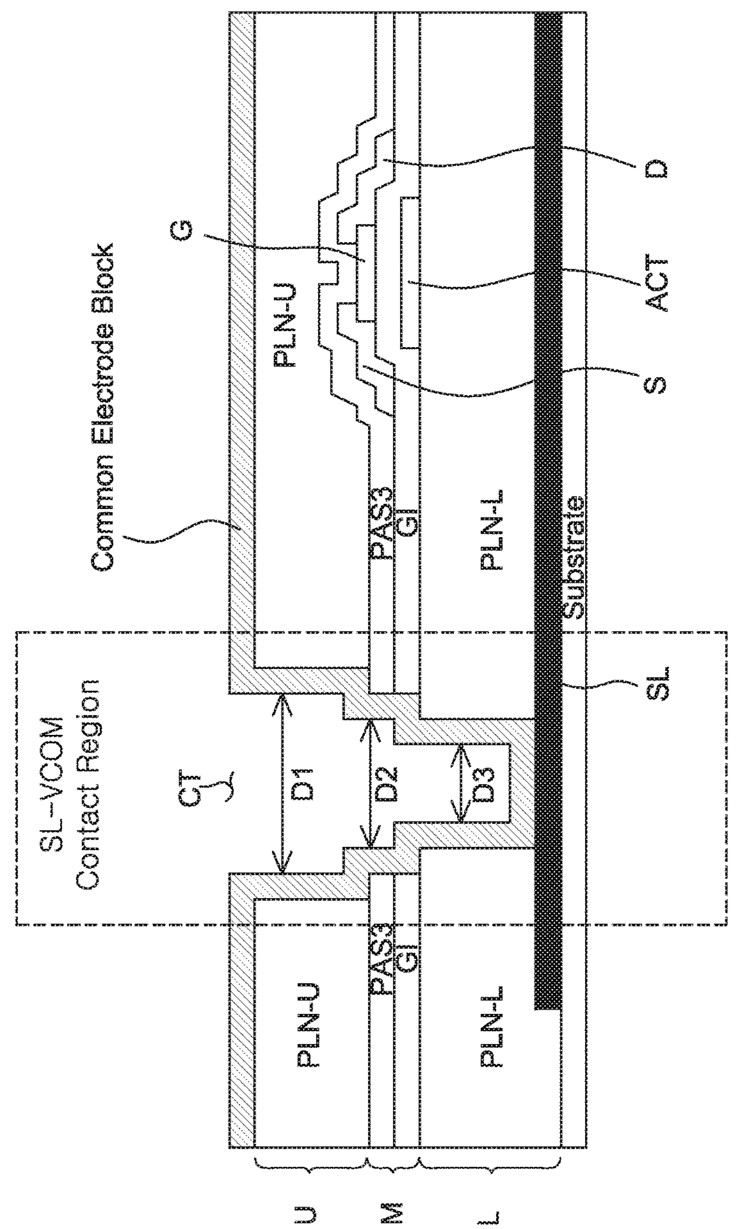
FIG. 8A illustrates a cross-sectional view of an exemplary embodiment in which at least some of the common signal lines are in direct contact with the common electrode blocks via a contact hole made through the upper and lower planarization layers at a SL-VCOM contact region.

FIG. 8A illustrates an exemplary configuration of the common signal line SL and the common electrode block, which are directly contacting each other through the upper planarization layer PLN-U and the lower planarization layer PLN-L. Considering the step coverage of the common electrode block (e.g., ITO), the contact hole CT becomes narrower from the top to bottom toward the common signal line SL so that the common electrode block can reach the common signal line SL without a disconnection. More specifically, the upper part U of the contact hole CT at the upper planarization layer PLN-U can be wider than the mid part M of the contact hole CT at the passivation layer PAS3 and the gate insulation layer GI. Further, the mid part M of the contact hole CT at the passivation layer PAS3 and the gate insulation layer GI can be wider than the lower part L of the contact hole CT at the lower planarization layer PLN-L. In some embodiments, the part of the contact hole at the gate insulation layer GI may be wider than the part of the contact hole at the passivation layer PAS3. In a suitable embodiments, the width $D_2$ of the contact hole CT at the gate insulation layer GI and the passivation layer PAS3 may be wider than the width $D_3$ of the contact hole CT at the lower planarization layer PLN-L by at least 2 um or more.

Also, the gate insulation layer may have a ledge in the contact hole CT. The ledge is formed in the contact hole CT when a part of the gate insulation layer GI is etched in a first round of etching process and another part of the gate insulation is etched in a second round of etching processes different from the first round of the etching process. The first round of etching process can form the contact hole through the passivation layer PAS3 and only a part of the gate insulation layer GI, leaving the gate insulation layer GI still covering the lower planarization layer PLN-L in the contact hole. Then, another round of etching process is carried out to form the contact hole completely through the gate insulation layer GI, which will leave a ledge of a gate insulation layer in the contact hole CT.

Manufacturing method is as follows. In step 1, a plurality of common signal lines SL are patterned on a substrate from the first metal layer M1. In step 2, the common signal lines SL are covered by the lower planarization layer PLN-L, which is followed by curing of the lower planarization PLN-L. Similar to the previous example which uses the bypass line BL, the passivation layer PAS1 and PAS2 may be provided on the lower and upper surfaces of the lower planarization layer PLN-L, respectively. In step 3, the second metal layer M2 is patterned to provide the gate lines GL and the gate electrode on the lower planarization layer PLN-L, which is followed by the deposition of the gate insulation layer GI. In step 4, the semiconductor layer SEM is deposited on the gate insulation layer GI, and an annealing process is performed. Then, the semiconductor layer SEM is patterned. In step 5, the third metal layer M3 is patterned to provide source/drain electrodes of the TFT and the data lines DL. In step 6, another passivation layer PAS3 is provided on the source/drain electrode and the data lines DL, then another annealing process is performed. In step 7, the upper planarization layer PLN-U is deposited to provide a planar surface over the TFTs, and the contact hole CT is formed through the upper planarization layer PLN-U to open the SL-VCOM contact region.

Figure 8B:
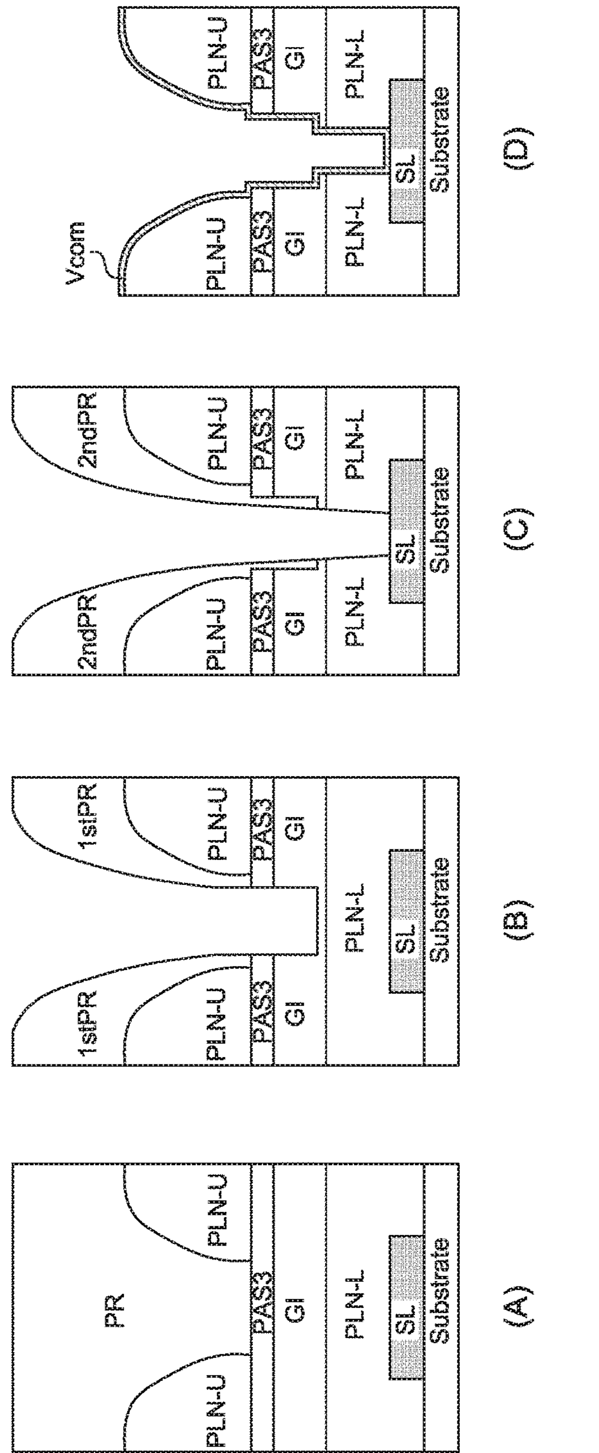
FIG. 8B illustrates cross-sectional views of the SL-VCOM contact region shown in FIG. 8A during manufacturing steps, according to an embodiment of the present disclosure.

FIG. 8B is schematic illustrations for explaining an exemplary manufacturing method of a display panel PNL, in which the common signal lines SL and the common electrode blocks are in direct contact with each other. Referring to FIG. 8B, the photoresist PR can be provided over the upper planarization layer PLN-U as depicted in (A) of FIG. FIG. 8B. Then a photo/develop process is carried out to create a contact hole through the passivation layer PAS3 and the gate insulation layer GI. It should be appreciated that the gate insulation layer GI may need to be provided at some part of the display panel PNL at least temporarily during manufacturing. For instance, the gate insulation layer GI may provide temporary protection for the metal trace lines in the non-display area of the display panel PNL. In such cases, the gate insulation layer GI may remain on the SL-VCOM contact region. For instance, the passivation layer PAS3 may be over etched, but not as much as to expose the surface of the lower planarization layer PLN-L, as depicted in (B) of FIG. FIG. 8B.

After forming the contact hole through the passivation layer PAS3 and the gate insulation layer GI, another photoresist deposition and development process can be carried out, and the lower planarization layer PLN-L at the SL-VCOM contact region can be etched to expose the common signal line SL as depicted in (C) of FIG. FIG. 8B. After stripping the photoresist, a transparent electrode layer (e.g., ITO) can be deposited to be in direct contact with the common signal line SL via the contact hole made through the upper planarization layer PLN-U and the lower planarization layer PLN-L as depicted in (D) of FIG. FIG. 8B.

In this exemplary method, the formation of contact hole CT through the lower planarization layer PLN-L is performed after the annealing processes. In other words, any thermal expansion of the lower planarization layer PLN-L would have been already taken place when the contact hole CT is being formed through the lower planarization layer PLN-L. Thus, stable connection between the common signal line SL and the common electrode block can be provided without using the bypass line BL.

[Coplanar Structure TFT]

Figure 9A:
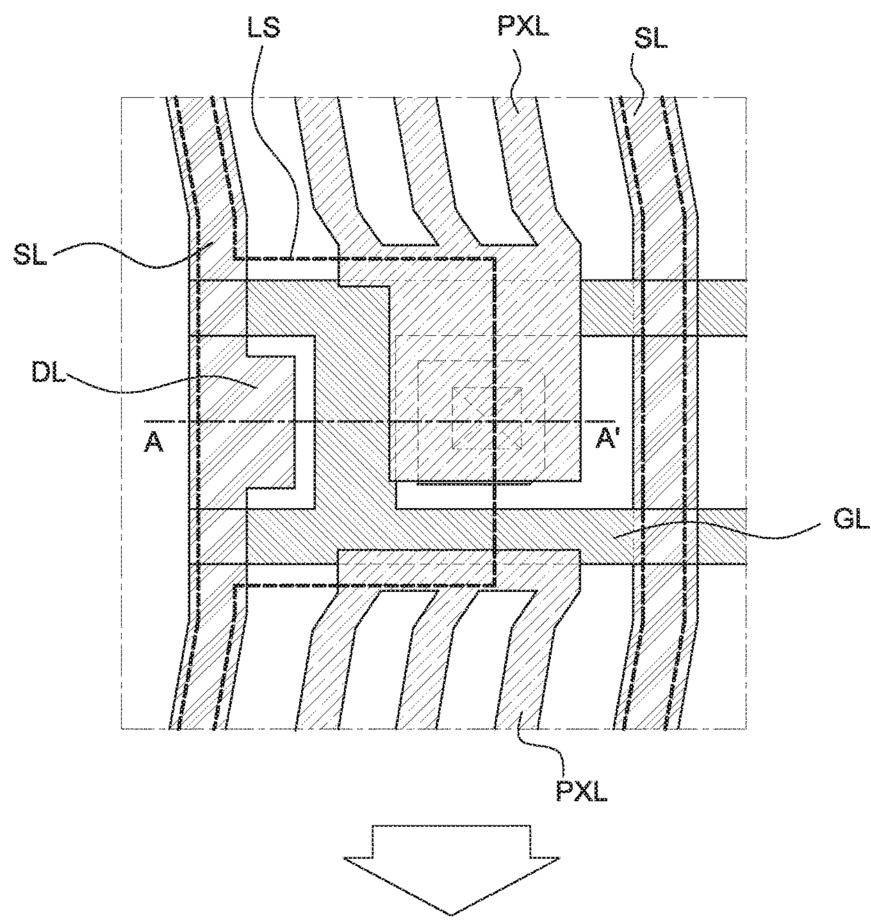
FIG. 9A is a top view and a cross-sectional side view illustrating an exemplary configuration of a common signal line provided under a coplanar structure thin-film transistor, according to an embodiment of the present disclosure.
Figure 9A:
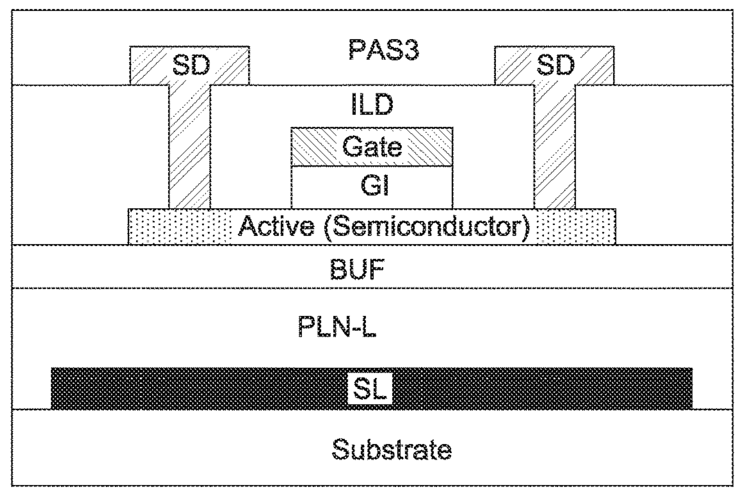
Figure 9B:
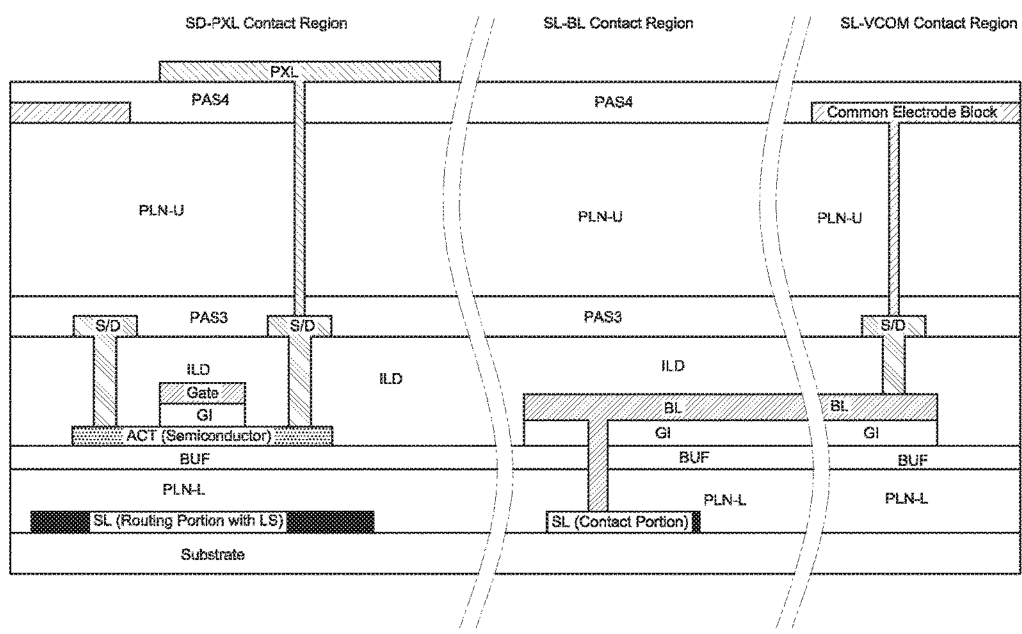
FIG. 9B is a cross-sectional side view of an illustrative configuration of a common signal line, a bypass line and transparent electrode blocks, according to an embodiment of the present disclosure.

In some embodiments, the TFTs on the lower planarization layer may have coplanar structure, in which the gate, source and drain are provided on the same side of the semiconductor layer SEM. FIG. 9A illustrates a plane view and a cross-sectional view of a coplanar TFT, which may be provided in an exemplary embodiment of the present disclosure. FIG. 9B is a cross-sectional view for illustrating the connection between the common signal line SL and the common electrode block according to an embodiment of the present disclosure.

Referring to FIGS. 9A and 9B, the common signal line SL is patterned from the first metal layer M1, and are covered under the lower planarization layer PLN-L. Similar to the display panel PNL with inverted staggered structure TFTs shown in FIG. 6B, passivation layers PAST and PAS2 may be provided on the lower surface and the upper surface of the lower planarization layer PLN-L. The lower contact hole CTL is provided through the lower planarization layer PLN-L to open a part of the contact portion of the common signal line SL.

The semiconductor layer SEM (e.g., IGZO, poly-silicon) is provided on the lower planarization layer PLN-L. A light shield LS may be provided in order to suppress light induced threshold voltage shift of the TFT. In this regard, the light shield LS may be patterned form the first metal layer M1 under the lower planarization layer PLN-L. As shown in FIG. 9A, a part of the common signal line SL may be projected out toward the active of the TFT to serve as the light shield LS. In this way, both the common signal lines SL and the light shields LS can be provided from a single metal layer, thereby reducing the time and cost for manufacturing the display panel PNL.

If desired, a buffer layer BUF can be provided between the semiconductor layer SEM and the lower planarization layer PLN-L. In this regard, the buffer layer BUF may be provided in addition to the passivation layer (not shown) provided on the lower planarization layer PLN-L. Similar to the passivation layers under and over the lower planarization layer PLN-L, the buffer layer BUF can be formed of a silicon nitride layer, a silicon oxide layer and a combination thereof. If the semiconductor layer SEM to be provided on the buffer layer BUF is an oxide metal semiconductor, such as IGZO, it is preferred that a silicon oxide layer is the outer most layer (i.e., the layer interfacing the semiconductor layer) of the buffer layer BUF to shield the semiconductor layer SEM from the free/unbound hydrogen from any silicon nitride layer existing thereunder. For instance, a passivation layer formed of silicon nitride layer may be provided on or below the lower planarization layer PLN-L and the buffer layer BUF formed of silicon oxide layer can be provided on the passivation layer.

A gate insulation layer GI is provided on the semiconductor layer. Then, the second metal layer M2 is patterned to form the gate line GL and the gate electrode of the TFTs on the gate insulation layer GI. Annealing process and/or plasma treatment is performed on the semiconductor layer. Also, the third metal layer M3 is patterned to form the data lines DL and the source/drain electrodes of the TFTs. An interlayer dielectric layer ILD is provided to insulate the gate electrode from the source/drain electrodes. The upper planarization layer PLN-U is disposed on the coplanar type TFTs described above, and a plurality of transparent electrode blocks is provided on the upper planarization layer PLN-U. Each of the plurality of transparent electrode blocks may serve as a common electrode VCOM during operation of the display panel PNL. The plurality of transparent electrode blocks may also serve as a touch sensor during operation of the display panel PNL.

Each of the transparent electrode blocks is connected to at least one of the common signal line SL under the lower planarization layer. In some embodiments provided with the coplanar type TFTs, bypass lines BL may be used to connect the common signal lines BL under the lower planarization layer PLN-L and the common electrode blocks on the upper planarization layer PLN-U. The bypass lines BL may be patterned from the second metal layer M2. Alternatively, in some other embodiments, the bypass lines BL may be patterned from the third metal layer M3.

Further, in embodiments which the semiconductor layer SEM is formed of an oxide metal layer such as IGZO, the oxide metal pattern formed from the lower contact hole CTL and the upper contact hole CTU may be turned into a conductive line to serve as the bypass line BL. That is, the bypass lines BL can be patterned from the oxide metal layer, which is turned into a conductive path by suitable doping process, including but not limited to, plasma enhanced chemical vapor deposition (PECVD), hydrogen plasma treatment, argon plasma treatment and the like.

It should be appreciated that such heavily doped oxide metal paths can be provided in various other parts of the display panel PNL. For example, conductive lines in the non-display area of the display panel PNL may be formed from doped oxide metal patterns. Also, in some embodiments, the gate driver GD of the display panel PNL may be provided as a gate-in-panel (GIP) type, which is implemented with a plurality of TFTs directly formed at the non-display area of the display panel PNL. In the embodiments provided with the GIP type gate driver GD, some nodes in the circuitry of the GIP may be formed with the heavily doped oxide metal patterns.

It should be noted that the TFTs implementing the GIP circuit is not just limited to the oxide TFTs, and the GIP circuit may be implemented with LIPS TFTs. In other words, both oxide TFTs and LIPS TFTs may be provided on the TFT substrate of the display panel PNL. By way of examples, the pixel circuits in the display area of the display panel PNL may be implemented with oxide TFTs and the driving circuits (e.g., buffer, shift register, multiplexer, GIP, etc.) in the non-display area may be implemented with LIPS TFTs. The pixel circuit implemented with the oxide TFTs would provide higher voltage holding ratio than the LIPS TFT, which would be beneficial when temporarily reducing the frame rate (i.e., frames per second) of the display to conserve power while the display is being used in applications which do not require high frame rate. The driving circuits implemented with the LIPS TFTs would be beneficial high frequency driving of various components, such as the touch driver, especially when IFP touch scanning scheme is used.

Also, a combination of both oxide TFTs and the LIPS TFTs may be used to implement the pixel circuits and/or the driving circuits. For instance, oxide TFTs may be used to fabricate the IFP compensation circuit (which will be described in detail below), while LIPS TFTs are used to implement the rest of GIP circuitry. If a storage capacitor is used in the pixel circuit and/or the driving circuit, the transistors connected to the terminals of such storage capacitors may be oxide TFTs even though LIPS TFTs are used in other parts of the circuitry. As will be described in greater detail below, an IFP compensation circuit includes a storage capacitor and the transistors connected at the terminals of the storage capacitor may be oxide TFT while LIPS TFTs are used for other parts of the GIP circuit.

In the non-display area where the common signal lines are not routed, the oxide TFTs and the LIPS TFTs can be provided in a different layer from each other. For instance, the LIPS TFTs may be provided under the lower planarization layer PLN-L and the oxide TFTs may be provided on the lower planarization layer PLN-L, and vice versa. Accordingly, in embodiments provided with both oxide TFTs and LIPS TFTs, the pixel circuits and/or the driving circuits of the display panel PNL may include a node and/or electrode formed with doped oxide metal pattern (i.e., conductive line formed from the oxide metal semiconductor layer). In the embodiments where the combination of oxide TFTs and LIPS TFTs are provided on the TFT substrate (TFT backplane), TFTs can be provided in any of the coplanar structure and the inverted staggered structure. In some cases, either the oxide TFTs or the LIPS TFTs may be implemented in the coplanar structure, and the other TFTs may be provided in the inverted staggered structure.

Also, in some embodiments provided with the coplanar type TFTs, the common signal lines SL may be in a direct contact with the common electrode blocks via a contact hole through the upper planarization layer PLN-U and the lower planarization layer PLN-L.

[Non-Display Area: SOG Open Area]

Figure 10A:
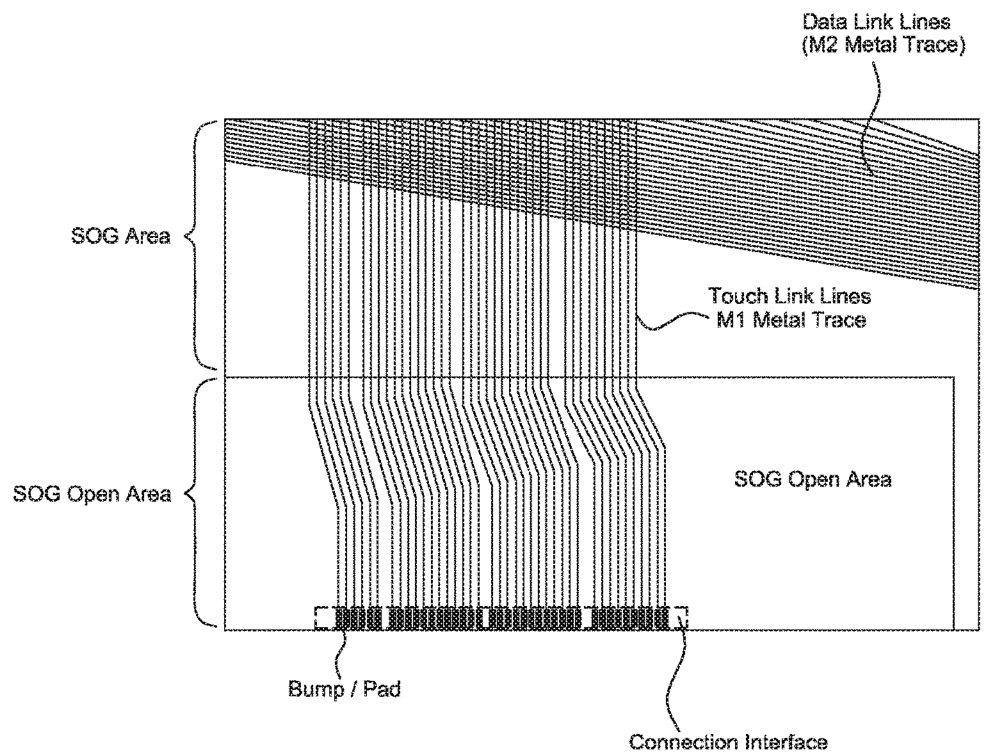
FIG. 10A is a top view of an exemplary configuration of metal line traces in the non-display area of a display panel, according to an embodiment of the present disclosure.
Figure 10B:
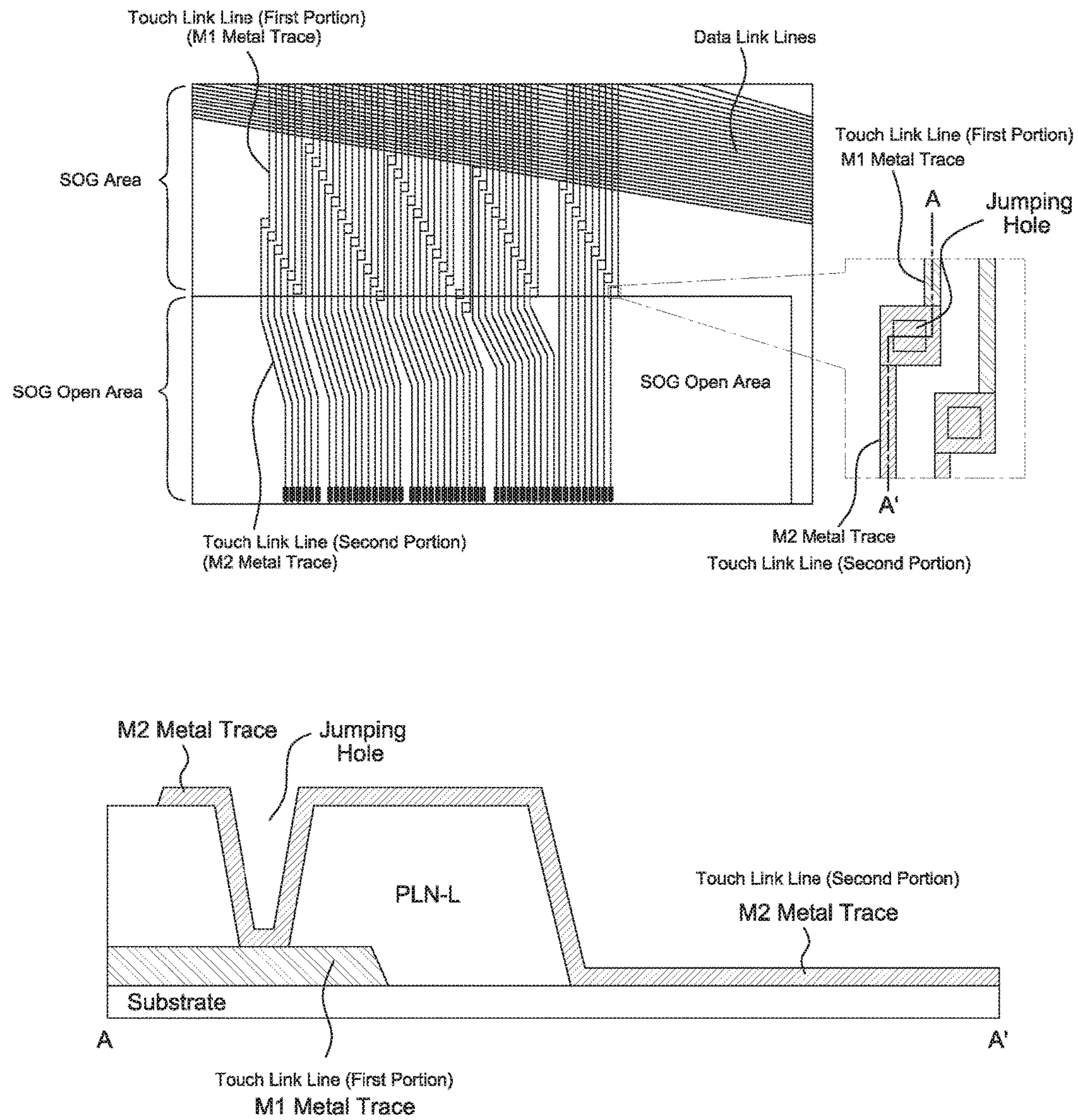
FIG. 10B is a top view and a cross-sectional side view showing an exemplary configuration of metal line traces in the non-display area of a display panel, according to an embodiment of the present disclosure.

In some embodiments, a drive integrated circuit (D-IC) and/or FPCB having a driver can be connected to a connection interface provided in the non-display area of the display panel PNL. FIG. 10A and FIG. 10B each illustrates a schematic illustration of an exemplary configuration of a connection interface for a driver in the non-display area of the display panel PNL.

Referring to FIG. 10A, some part of the non-display area is provided with the lower planarization layer PLN-L and some other part of the non-display area is free of the lower planarization layer PLN-L. For simpler explanation, the part of the non-display area is provided with the lower planarization layer PLN-L may be referred to as the "SOG area," and the part of the non-display area without the lower planarization layer PLN-L may be referred to as the "SOG Open Area."

If the connection interface is provided on the lower planarization layer PLN-L, the lower planarization layer PLN-L may be damaged when attaching the D-IC or detaching the D-IC for repair. As such, it is preferred that the connection interface for the D-IC is positioned in the SOG open area of the non-display area.

To provide the connection interface in the SOG open area, a plurality of metal line traces is routed from the SOG area to the SOG open area. As shown, the metal line traces routed to the SOG open area may be the metal line traces patterned from the first metal layer M1. Each of the metal line traces exposed in the SOG open area may include a portion that is configured as a bump (e.g., pad), which is a part of the connection interface. In some embodiments, the bumps may be formed of multiple metal layers. For example, the second metal layer M2 may be disposed on the bump portions of the metal line traces patterned from the first metal layer M1. Of course, additional metal layers can be provided on top of the bump portions of the underlying metal layer. In suitable embodiments, the metal line traces routed from the SOG area to the SOG open area may be the common signal line SL and a touch drive IC or a FPCB provided with a touch driver is attached to the bumps provided in the SOG open area.

Referring to FIG. 10B, in some embodiments, the metal line traces routed from the SOG area to the SOG open area may be patterned from the second metal layer M2. In this case, the common signal lines SL can be routed to the SOG area of the non-display area, and metal line traces patterned from the second metal layer M2 can be routed from the SOG area to the SOG open area. The common signal lines SL in the SOG area can come in contact with the metal line traces patterned from the second metal layer M2 via the lower contact holes CTL provided in the SOG area. The metal line traces of the second metal layer M2 in the SOG open area may include portions configured as the bumps for connecting touch drive IC and/or FPCB with a touch driver. Although this configuration requires contact holes (i.e., jumping holes) to be formed in the non-display area, the common signal lines SL will not be damaged during patterning of the second metal layer M2.

In some suitable embodiments, the data link lines that fan out from the data driver DD may be routed from the SOG open area to the SOG area as depicted in FIG. 10B. Here, the data link lines may be patterned from the second metal layer M2 or the third metal layer M3, and they can simply be routed on the lower planarization layer PLN-L in the SOG area. The metal line traces, which are connected to the common signal lines SL through the lower contact hole CTL in the non-display area, may be the touch link line connected to a touch drive IC. In this setting, the data link lines connected to the data driver DD may fan out across the common signal lines SL placed under the lower planarization layer PLN-L, allowing for a reduced bezel design of the device equipped with the display panel PNL.

[Gate-In-Panel: GIP]

The gate driver GD of the display panel PNL may be provided as a gate-in-panel (GIP) type, which is implemented with a plurality of TFTs directly formed at the non-display area of the display panel PNL. In some embodiments, the TFTs of the GIP circuit may be formed on the lower planarization layer, similar to the array of TFTs in the display area of the display panel PNL. In such embodiments, the conductive lines for supplying external signals to the GIP circuit can be provided underneath the lower planarization layer PLN-L. For instance, a plurality of external signal lines can also be patterned in the non-display area of the display panel PNL when patterning the first metal layer M1 on the substrate to provide the common signal lines SL across the display area of the display panel.

Figure 11A:
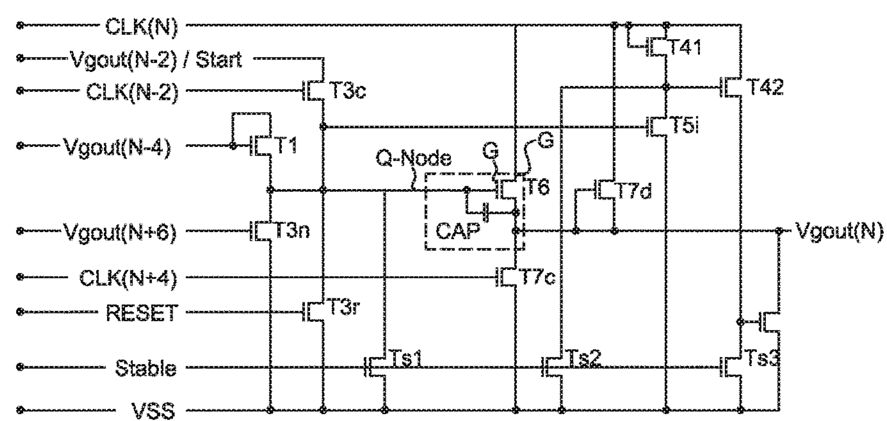
FIG. 11A is a circuit diagram of illustrative stage in a gate driver circuitry for a display, according to an embodiment of the present disclosure.

FIG. 11A illustrates an exemplary configuration of a stage in an exemplary GIP circuit, which may be provided in the display panel PNL. As shown in FIG. 11A, the external signal lines provided to the GIP circuit may include various clock signal lines, power signal lines (e.g., VSS, VDD), reset signal lines and more. Such external signal lines are routed in the non-display area of the display panel PNL. More specifically, the external signal lines may be formed with the first metal layer M1 and provided under the lower planarization layer PLN-L. In this way, the external signal lines may be routed under the plurality of TFTs in the non-display area implementing the shift register of the GIP circuit. The external signal lines can be connected to the respective nodes of the GIP circuit via contact holes through the lower planarization layer PLN-L. In some embodiments, signal line for transmitting the common voltage signal may be routed in the non-display area under the GIP circuit. Routing at least some of the external signal lines directly under the GIP circuit allows to reduce the bezel size even further.

[Exemplary Capacitor Configuration]

In some embodiments, capacitors included in the GIP circuits may be implemented with a metal layer under the lower planarization layer PLN-L. For instance, each stage of the shift register in the GIP circuit includes a pull-up TFT T6, which is configured to output a scan signal on the output terminal Vgout(N). The pull-up TFT T6 has its gate connected to the Q-node, the first terminal connected to the voltage source CLK and the second terminal connected to the output terminal Vgout(N) of the respective stage. Accordingly, the pull-up TFT T6 controlled by the voltage on the Q-node.

A capacitor CAP may be connected between the gate and the second terminal of the pull-up TFT T6. During operation of the shift register, the voltage of the Q-node is increased to a higher voltage by bootstrapping of the capacitor CAP connected between the Q-node and the output terminal, thereby completely turning on the pull-up TFT T6.

The capacitor CAP may be configured as a parasitic capacitor which is formed in an overlapping area between the gate and source of the pull-up TFT T6, which are formed of the second metal layer M2 and the third metal layer M3, respectively. The dimension of the capacitor CAP in the GIP circuit may be considerably large. Accordingly, the dimension of the capacitor CAP may be reduced to reduce the size of the GIP circuit in the non-display area of the display panel PNL.

Figure 11B:
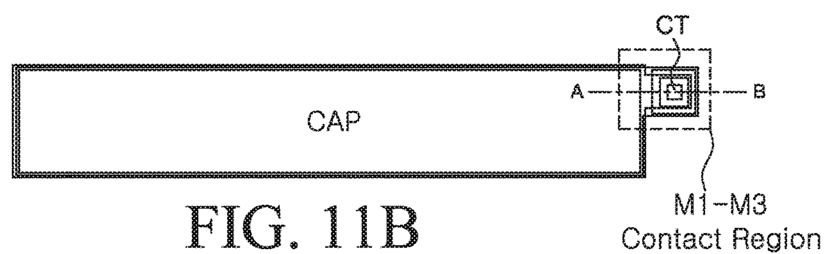
FIG. 11B is a top view of a capacitor provided in the stage of FIG. 11A, according to an embodiment of the present disclosure.
Figure 11C:
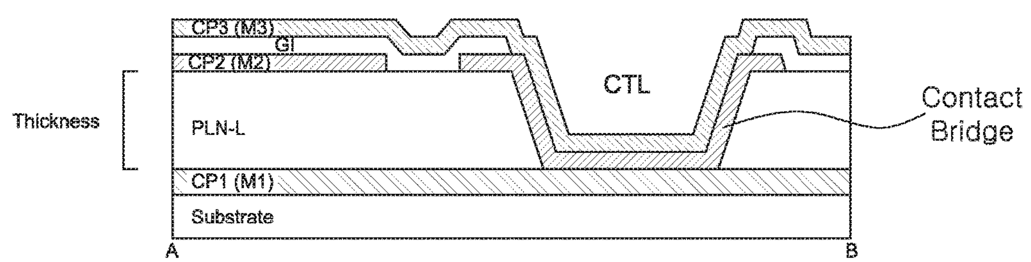
FIGS. 11C and 11D are cross-sectional side views of a capacitor provided in the stage of FIG. 11A, according to an embodiment of the present disclosure.
Figure 11D:
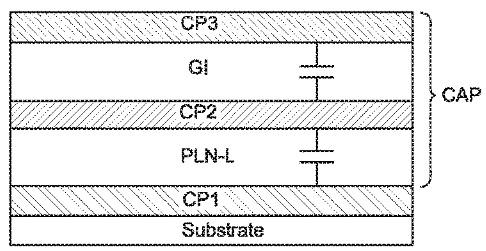

To this end, the first metal layer M1 can be patterned to provide an additional metal layer under the lower planarization layer PLN-L to implement the capacitor CAP. As shown in FIG. 11B, the capacitor CAP can be formed in an overlapping area between the first capacitor plate CP1 patterned from the first metal layer M1, the second capacitor plate CP2 patterned from the second metal layer M2 and the third capacitor plate CP3 patterned from the third metal layer M3, of which the first capacitor plate CP1 and the third capacitor plate CP3 are electrically connected to each other. The third capacitor plate CP3 can be connected to the first capacitor plate CP1 via a contact hole CTL provided through the lower planarization layer PLN-L. As shown, a contact bridge formed of the second metal layer M2 may be provided to electrically connect the first capacitor plate CP1 and the third capacitor plate CP3. Of course, the contact bridge formed of the second metal layer M2 is disconnected from the second capacitor plate CP2. By stacking up three metal plates, more compact sized capacitor can be provided without having to sacrifice the total charge storage capability. This, in turn, facilitates more compact sized GIP circuits.

In some embodiments, the thickness of the lower planarization layer PLN-L interposed between the first metal plate CP1 and the second metal plate CP2 can be reduced in order to further increase the amount of capacitance that can be stored in the capacitor CAP. To this end, a half-tone mask may be used when forming the lower contact hole CTL through the lower planarization layer PLN-L. More specifically, when forming the lower contact hole CTL, a photoresist can be placed over the lower planarization layer PLN-L, and the photoresist can be developed by using the half-tone mask. The photoresist over the lower planarization layer PLN-L at the first metal plate CP1 can have a reduced thickness. Accordingly, the thickness of the lower planarization layer PLN-L at the capacitor CAP can also be reduced when dry-etching process for creating the lower contact hole CT is performed. Similar process can be used in forming various other capacitors described in the present disclosure.

It should be noted that the shift register of the GIP circuit may include capacitors other than the one described above. Similar to the capacitor CAP connected between the Q-node and the output terminal Vgout(N) of the stage, other capacitors may also be formed of a stack of a first capacitor plate CP1, a second capacitor plate CP2 and a third capacitor plate CP3.

[Intra-Frame Pause Compensation Circuit]

As discussed above, in some embodiments, a display panel PNL can be configured to operate in the intra-frame-pause (IFP) touch scan scheme to provide enhanced touch scan resolution.

In the GIP circuit, each stage of the shift register outputs a scan signal on the gate line GL, which is connected with the output terminal of the stage. Also, the scan signal from one stage is supplied to another stage of the shift register as a start signal so that the stage receiving the start signal operates to output the scan signal on the gate line GL connected thereto. Thus, the scan signal is supplied on all of the gate lines GL in a sequential order per each frame.

However, when the IFP scheme is used, the sequential output of the scan signal on the gate lines GL is temporarily paused while the touch scan operation is being performed. In other words, a stage of the shift register is prevented from outputting the scan signal until intra frame touch scan operation is completed. To resume and output the scan signal from last gate line GL which was provided with the scan signal, the Q-node need to be charged at the high-state. One way of resuming the operation of the shift register is by keeping the Q-node at the high state while IFP touch scan operation is be performed. That is, the Q-node of the stage which received the start signal from a previous stage may simply remain at high state. In this case, however, the pull-up TFT connected to the high state Q-node for a prolonged period may deteriorate faster than other TFTs of the GIP circuits.

Accordingly, in some embodiments, the display panel PNL may include a GIP circuit having a compensation circuit adapted for the IFP driving scheme. The compensation circuit allows the Q-node to be discharged while the IFP touch scan operation is being performed by storing the voltage of the Q-node in a storage capacitor during the IFP touch scan operation and recharging the Q-node with the stored voltage after the IFP touch scan operation.

Figure 12A:
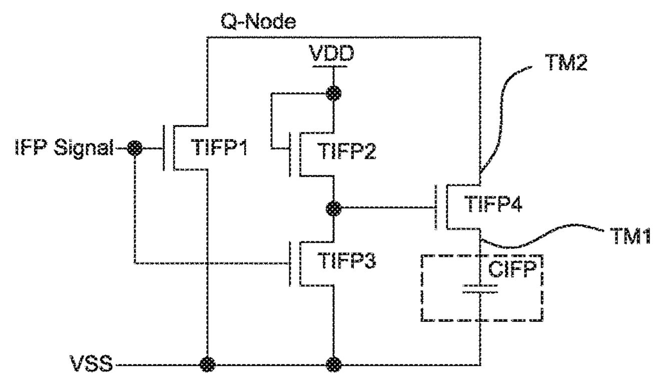
FIG. 12A is a circuit diagram of exemplary compensation circuitry, which may be provided in embodiments configured with the intra-frame pause driving scheme, according to an embodiment of the present disclosure.

FIG. 12A is a schematic circuit diagram showing an exemplary configuration of the compensation circuit which can be provided in one or more stages of a GIP circuit. It should be noted that the compensation circuit depicted in FIG. 12A is only a part of circuitry in a stage, and thus the circuitry of a stage would include various other transistors including but not limited to the pull-up transistor. For instance, the compensation circuit in FIG. 12A can be added to the circuitry of a stage depicted in FIG. 11A.

Referring to FIG. 12A, the compensation circuit includes a first transistor TIFP1, a second transistor TIFP2, the third transistor TIFP3 and the fourth transistor TIFP4. The first transistor TIFP1 is connected between the Q-node and the low voltage line VSS, and the gate of the first transistor TIFP1 is connected to a node, which is supplied with an IFP signal. The second transistor TIFP2 is connected between the high voltage line VDD and the gate of a fourth transistor TIFP4, and the gate of the second transistor TIFP2 is also connected to the high voltage line VDD. The third transistor TIFP3 is connected between the gate of the fourth transistor TIFP4 and the low voltage line VSS, and the gate of the third transistor is connected to the node, which is supplied with the IFP signal. The second transistor TIFP2 and the third transistor TIFP3 are serially connected between the high voltage line VDD and the low voltage line VSS, acting as an inverter in the compensation circuit that controls the fourth transistor TIFP4.

The fourth transistor TIFP4 has a first terminal TM1 connected to a storage capacitor CIFP, a second terminal TM2 connected to the Q-node and the gate connected to the node between the second transistor TIFP2 and the third transistor TIFP3, which are serially connected between the high voltage line VDD and the low voltage line VSS. The compensation circuit includes a storage capacitor CIFP, which is connected between the first terminal TM1 of the fourth transistor TIFP4 and the low voltage line VSS.

Figure 12B:
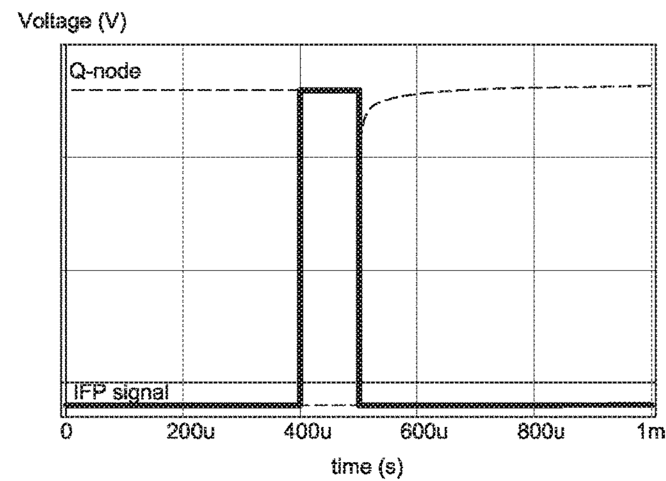
FIG. 12B is a timing diagram of illustrative operation of a gate driver provided with the compensation circuitry of FIG. 12A, according to an embodiment of the present disclosure.

In operation, a Q-node of a stage is charged in response to a start signal from a previous stage (or via an external start signal line). As mentioned, the stage is provided with a compensation circuit. Thus, an IFP signal, which indicates the start and the end of IFP touch scan operation, is supplied to the stage. In response to the low IFP signal, the voltage of the Q-node is stored in the storage capacitor CIFP. As shown in FIG. 12B, the Q-node is discharged in response to the high level IFP signal. When the IFP signal is switched back to the low level, the Q-node of the stage is charged to the voltage stored in the storage capacitor CIFP, and outputs the scan signal. In this way, the Q-node can be discharged during the period for carrying out the IFP touch scan operation, thereby minimizing the deterioration of the pull-up transistor.

It should be noted that, in some embodiments, the start timing of the IFP touch scan operation within a frame may be fixed. In other words, the display panel PNL may be configured to begin the IFP touch scan operation after the scan signal is supplied on each of a pre-specified number of gate lines GL within a frame. That is, one or more pre-specified stages of the shift register may be configured to be paused in sync with the IFP touch scan operation. In such embodiments, the compensation circuit may be added to the circuitry of those pre-specified stages configured to be paused during the IFP touch scan operation.

In some other embodiments, the start timing of the IFP touch scan operation within a frame may vary. For instance, the timing of the IFP signal hitting the high stage may vary between any two display periods within a single frame. Since the timing of the IFP signal varies, the stage of be paused for IFP touch scan operation also varies. As such, the stage to be paused during the IFP touch scan operation can be one of a set of pre-specified stages (i.e., a plurality of stages of a pre-specified range). The display panel PNL can be configured such that the timing of the high IFP signal varies for each frame. In such cases, the high level IFP signal can be supplied to a different stage of the set of pre-specified stages to receive the high level IFP signal. In such embodiments, all of the stages in the set of pre-specified stages, which may receive the high level IFP signal, can be provided with the compensation circuit.

Similar to the bootstrapping capacitor (e.g., CAP) discussed in reference to FIG. 11A, the storage capacitor CIFP of the compensation circuit may be implemented with the first metal plate CP1 patterned from the first metal layer M1, the second metal plate CP2 patterned from the second metal layer M2 and the third metal plate CP3 patterned from the third metal layer M3. As mentioned above, the second metal plate CP2 is interposed between the first metal plate CP1 and the third metal plate CP3 connected to the first metal place CP1. In this setting, increased amount of charge can be stored in the storage capacitor CIFP so that, upon the end of the IFP touch scan operation, the Q-node can be properly reloaded with the initial high voltage of the Q-node before the IFP touch scan operation started as shown in FIG. 12(B).

[Dummy Line Configuration]

In order to implement a touch sensor in the display panel PNL by using the segmented pieces of transparent electrodes (e.g., segmented pieces of a common electrode), each individual pieces needs to be connected to at least one common signal line SL. Thus, the minimum number of common signal lines SL required in the display panel would be equal to the number of common electrode blocks. However, it should be appreciated that a display panel PNL may be provided with much greater number of common signal lines SL than the bare minimum required in the display panel PNL. With extra common signal lines SL provided in the display panel PNL, multiple common signal lines SL can be connected to a single common electrode block to provide a low resistance connection between the common electrode block and the driver.

If desired, a common signal line SL can be provided under each and every data lines DL, and they may be connected to the common electrode blocks to implement either a self-capacitance touch sensor system, a mutual-capacitance touch sensor system or to provide various other functionalities (e.g., touch pressure sensor system, localized tactile feedback system, etc.) in the display panel PNL.

With a common signal line SL being placed under every data lines DL, uniformity in the capacitance between the data line DL and the common signal line SL throughout the display panel PNL may be achieved. However, part of the common signal line SL routed under the common electrode blocks that are not connected to that particular common signal line SL increases undesired capacitance at those common electrode blocks. As such, dummy lines DML, which are not directly connected to the touch driver TD, can be provided in place of unnecessary portions of the common signal lines SL. That is, in order for the data lines DL to have uniform data line capacitance, dummy lines DML may be provided in the display panel PNL, so that every data lines DL in the display panel are overlapped with either the common signal line SL or the dummy line DML as depicted in FIG. 6A. Since the dummy lines DML do not need to be connected to the common electrode blocks, the number of total bypass lines BL needed in the display panel PNL can be greatly reduced, which would improve the aperture ratio of the pixels in the display panel PNL.

It should be appreciated that both a common signal line SL and a dummy line DML may be laid under a single data line DL. To put it in other way, a conductive line patterned from the first metal layer M1 routed along under a single data lines DL may be separated into multiple disconnected portions, in which a portion serves as the common signal line SL connected to the touch driver TD and other portion serves as the dummy line DML. For example, a common signal line SL may be extended under a data line DL and connected to a common electrode block. The common signal line SL would end at a point where it is connected to the common electrode block. From thereon, a conductive line disconnected from the common signal line SL can be extended under the data line DL as a dummy line DML.

The dummy lines DML in floating state may cause electrostatic during manufacturing of the display panel PNL. As such, in some embodiments, the dummy lines DML may be connected to a voltage source, such as a common voltage source, a DC voltage source or a ground voltage source. A common signal line SL divided into multiple portions under the same data line DL may include isolated dummy line DML portions, which cannot be extended to a voltage source located outside the display area. Accordingly, in some embodiments, some dummy lines DML may be connected to the common electrode blocks via the bypass lines BL. In such cases, a dummy line DML should not interconnect multiple common electrode blocks that are individually communicating with the touch driver TD via a separate one or a set of common signal lines SL. The dummy lines DML can be connected to the common electrode blocks so long as their connection to the common electrode blocks do not alter the electrical connection map of the common electrode blocks for implementing a certain feature that is defined by the common signal lines SL.

Figure 13:
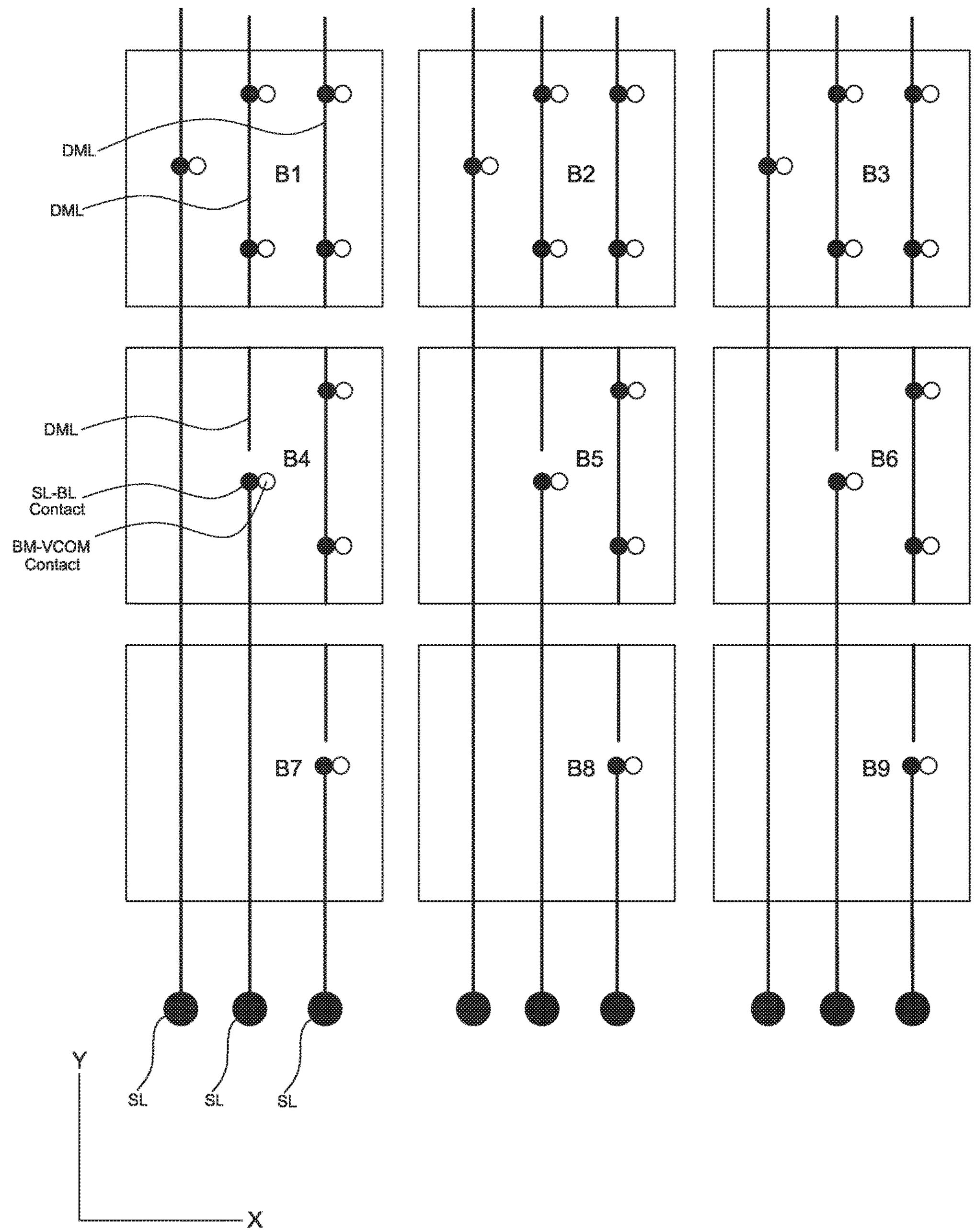
FIG. 13 is a schematic diagram showing an illustrative configuration of the common signal lines and their connections to the transparent electrode blocks, according to an embodiment of the present disclosure.

FIG. 13 illustrates exemplary configuration of a display panel PNL provided with a plurality of isolated dummy lines DML, in which the dummy lines DML are selectively connected to a corresponding ones of common electrode blocks. The connection between the dummy lines DML to the common electrode block can be made through the bypass line BL in the same way as the common signal lines SL. As shown, the dummy lines DML are not in a floating state as being connected to the common electrode blocks thereon. However, the isolated dummy lines DML do not interconnect different common electrode blocks. Even though the dummy lines DML are not directly connected to the touch driver TD on their own, the dummy lines DML can serve as a current path relaying a signal within a single common electrode block.

In the example shown in FIG. 13, each of the dummy lines DML was connected to a common electrode block via multiple bypass lines BL located at different locations of the common electrode block. It should be appreciated that a common signal lines SL may also be connected to multiple bypass lines BL connected to different locations of the same corresponding common electrode block.

Referring back to the example shown in FIGS. 6A-6C, the contact portion of the common signal line SL is depicted as being extended into the pixel region that is immediately adjacent to the routing portion of that common signal line SL. However, the configuration of the contact portion is not limited as such, and the contact portion may be extended further into other pixel regions. If dummy lines DML are disposed in the display panel PNL, the dummy lines DML under each data line DL may be provided in divided pieces so as to provide a passage for the contact portion of the common signal line SL to extend across the dummy lines DML.

In embodiments where dummy lines DML under some of the data lines DL are connected to the common electrode blocks placed above as depicted in FIG. 13, the dummy lines DML would also include a routing portion extending parallel to the data lines DL and a contact portion projecting out from the routing portion to be connected to a bypass line BL. The contact portions of the dummy lines DML may also be transversely extended across multiple pixel regions. In this case, other dummy lines DML under the data lines DL may be provided in divided pieces so as to provide a passage for the contact portion of the dummy line DML to pass across. It should be noted that the contact portion of a dummy line DML can be in contact with other dummy lines DML along the way as long as those dummy lines DML are not connected to a different common electrode block.

[Resistance-Capacitance Compensation]

Some common electrode blocks are located further away from a driver (e.g., touch driver TD) than others, and require a longer signal path to communicate with the touch driver TD. In embodiments where the common electrode blocks are configured to communicate with the touch driver TD, the differences in the length of the common signal lines SL forming the signal path translate into resistance-capacitance delay (RC delay) differences between the common electrode blocks, which would complicate the recognition of touch inputs. To compensate the resistance differences between the signal paths for the common electrode blocks, some signal paths can be implemented with a greater number of common signal lines SL than the others.

Accordingly, some of the common electrode blocks can be configured to communicate with the touch driver TD via a signal path formed of a set of common signal lines SL. The common signal lines of the set may be connected to each other in parallel. In other words, a parallel-connection signal path implemented with at least two common signal lines SL can be provided for at least some of the common electrode blocks.

Connecting the common signal lines SL of the set in parallel to form a parallel-connection signal path can be done in various ways. In some embodiments, the parallel connection of the common signal lines SL of a set can be achieved by simply patterning an interconnection line from the first metal layer M1 during patterning the common signal lines SL in the first place. In other words, a metal line may be patterned from the first metal layer M1 to extend across selective location of the common signal lines SL of the set and interconnect them to form a parallel-connection signal path. In this case, the interconnection line may be arranged to at least partially overlap with a gate line GL to minimize the effect which the interconnection line might have on the aperture ratio of the pixel regions. The parallel-connection signal path implemented with the set of parallel-connected common signal lines SL can be connected to the common electrode block using any one of the configurations described in this disclosure.

In some other embodiments, a bypass line BL commonly shared among the common signal lines SL of the set can serve as a means for creating the parallel-connection for the set of common signal lines SL. In yet another embodiment, each common signal line SL in the set may discretely connected to the same common electrode block, in which case, the common electrode block itself will create the parallel connection between the common signal lines SL of the set.

The greater the number of common signal lines SL in the parallel connection signal path, the lower the resistance of the signal path becomes. Accordingly, some parallel-connection signal path may include a greater number of common signal lines than other signal paths. For instance, a set of common signal lines SL that forms a parallel-connection path for a common electrode block positioned further away from the touch driver TD can be implemented with additional number of common signal lines SL than a set of common signal lines SL that forms a parallel-connection path for the common electrode blocks positioned closer to the touch driver TD. In other words, a first parallel-connection signal path for a common electrode block can be implemented with N number of common signal lines SL, and a second parallel-connection signal path for another common electrode block can be implemented with M number of common signal lines. When the common electrode block that is connected with the first parallel-connection signal path is placed further away from the touch driver TD than the common electrode block connected with the second parallel-connection signal path, N may be greater than M.

Figure 14A:
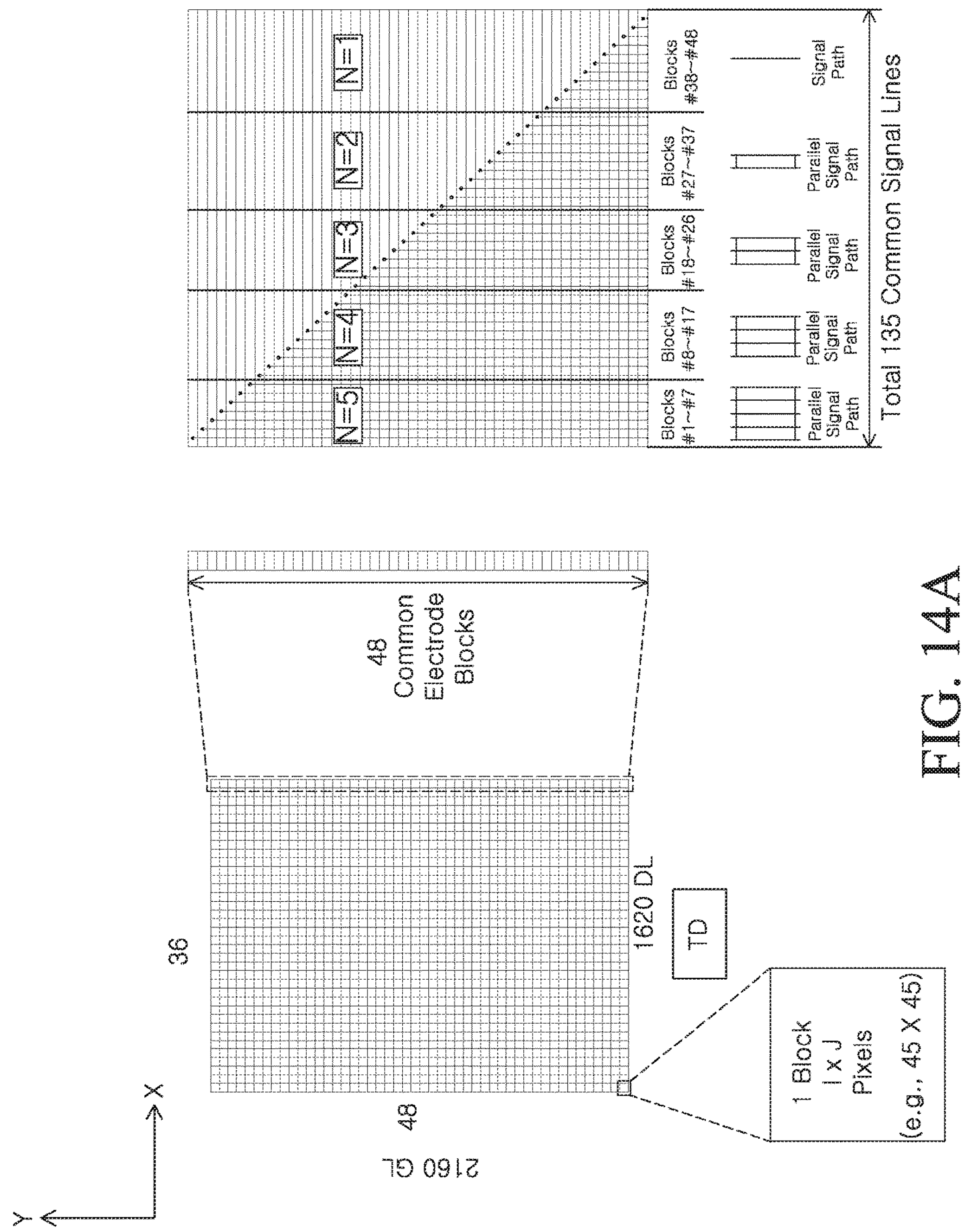
FIGS. 14A-14F each illustrates an exemplary configuration of common signal lines for implementing signal paths between a driver to the common electrode blocks, according to the embodiments of the present disclosure.

FIG. 14A illustrates an exemplary configuration of common signal lines SL for normalizing the resistance differences among the common electrode blocks of the display panel PNL, according to an embodiment of the present disclosure. In the display panel PNL, the common electrode blocks may be arranged in "X" number of rows and "Y" number of columns, for instance 48 rows by 36 columns. Also, pixels may be arranged in "I" number of rows by "J" number of columns, for instance 45 rows by 45 columns. Each pixel may include three sub-pixels (RGB). However, it should be appreciated that the arrangements of the common electrode blocks and the pixels described above are merely an example. The number of common electrode blocks, the number of pixels, the number of sub-pixels as well as their colors may vary in other embodiments of the present disclosure.

As mentioned, at least for some common electrode blocks, the signal path from the touch driver TD to the respective common electrode block can be implemented with multiple common signal lines SL, which are connected in parallel. In the example shown in FIG. 14A, each of the signal paths for the common electrode blocks of the column numbered 1 through 37 are implemented with at least two parallel-connected common signal lines SL. In some cases, common electrode blocks positioned relatively close to the touch driver TD may not be provided with such parallel connection signal paths. As such, the signal paths for the common electrode blocks numbered 38 through 48 of the same column are implemented with a signal path formed of a single common signal line SL.

As mentioned above, some parallel connection signal paths can implemented with an increased number of parallel-connected common signal lines SL. However, it should be noted that the total number of common signal lines SL that can be placed under each common electrode block may be limited. Therefore, it may not be feasible to increment the number of common signal lines SL in each and every parallel-connection signal paths for the common electrode blocks of the column. Accordingly, in some embodiments, some common electrode blocks may be provided with a signal path that is implemented with equal number of common signal lines SL as the signal path for other common electrode blocks even though one is positioned closer to the touch driver TD than the other. In such embodiments, the common electrodes blocks arranged in each column may be divided into a plurality of groups of common electrode blocks, of which the groups are defined based on the distance between the touch driver TD to the common electrode blocks. Here, the signal path for every common electrode block of in same group may be implemented with the equal number of common signal line(s).

In the example depicted in FIG. 14A, the common electrode blocks of a single column includes five groups (N1, N2, N3, N4 and N5). The common electrode blocks of the first group N1 are positioned closer to the common electrode blocks of the other groups. The common electrode blocks of the second group N2 are positioned further away from the touch driver TD than the common electrode blocks of the first group N1, but not further than the common electrode blocks of the third group N3. The common electrode blocks of the fourth group N4 are positioned further away from the touch driver TD than the common electrode blocks of the third group N3, but not further than the common electrode blocks of the fifth group N5.

In this setting, the differences in resistance of the signal paths from the touch driver TD to the common electrode blocks are compensated by adjusting the number of common signal line SL creating those signal paths. As such, the first group N1, the second group N2, the third group N3, the fourth group N4 and the fifth group N5 of the column includes the common electrode blocks from #38 through #48, from #27 through #37, from #18 through #26, from #8 through #17 and from #1 through #7, respectively. Since the first group N1 is the closest to the touch driver TD, the signal path for each of the common electrode blocks of the first group N1 is configured with a signal path implemented with a single common signal line SL. As for the second group N2, the parallel connection signal path for each of the common electrode blocks is configured with two parallel-connected common signal lines SL. As for the third group N3, the parallel connection signal path for each of the common electrode blocks is configured with three parallel-connected common signal lines SL. Further, as for the fourth group N4, the parallel connection signal path for each of the common electrode blocks is configured with four parallel-connected common signal lines SL. Lastly, as for each of the common electrode blocks of the fifth group N5, the parallel connection signal path is configured with five common signal lines SL that are connected in parallel.

In the example of FIG. 14A, the resistance differences among the signal paths are compensated between the groups of common electrode blocks in the column. However, the resistance difference still exists among the common electrode blocks within the same group. When the number common electrode blocks included in each group increases, the resistance differences for the signal path among the common electrode blocks of the same group may not be negligible. As such, in some embodiments, the signal path between the touch driver TD and the common electrode block may include a tail portion for secondary adjustment of the resistance of the signal path. The tail portion of the signal path can be adjusted to further normalize the resistance of the signal paths for the common electrode blocks of the same group.

Figure 14B:
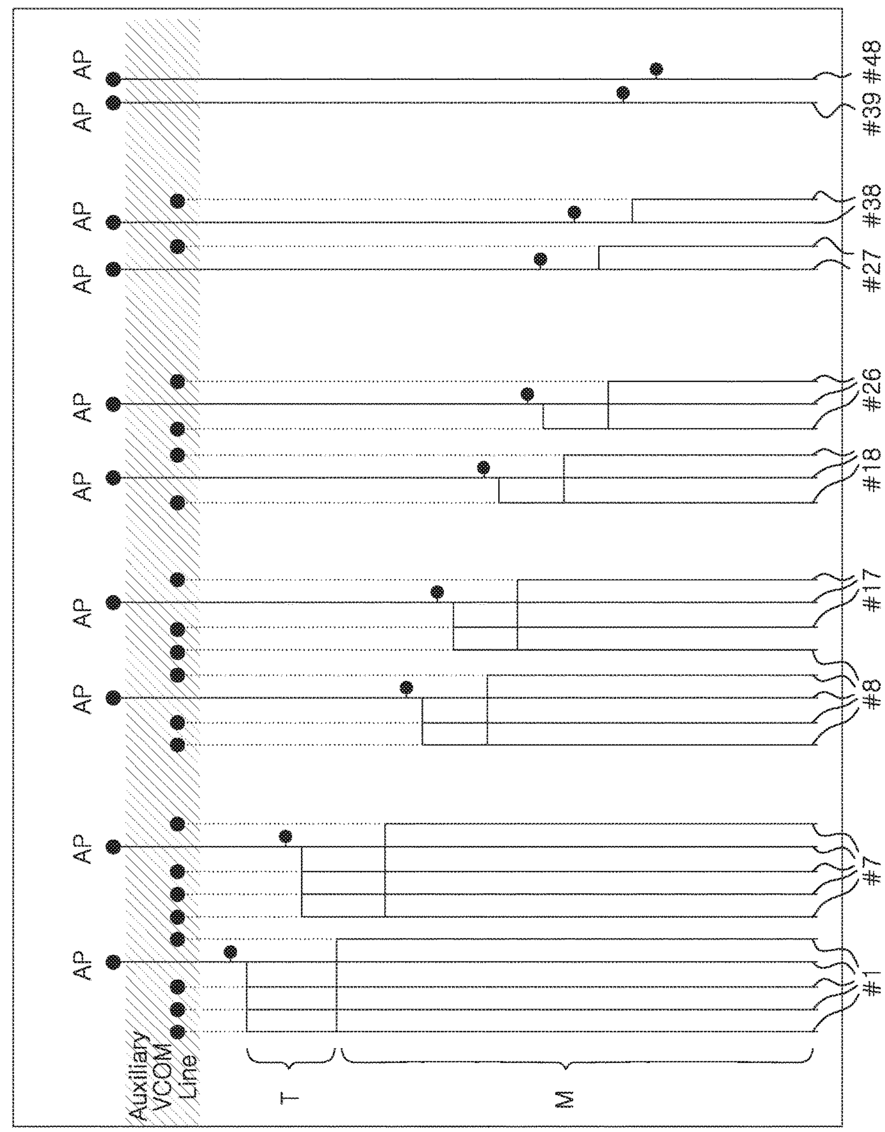

FIG. 14B is an exemplary configuration of tail portions for secondary adjustment of resistance difference between the signal paths for the common electrode blocks. The signal path #1 may be the one that is connected to the common electrode block #1 and the signal path #7 may be the one that is connected to the common electrode block #7. As shown, the signal paths #1 and #7 includes a main portion M and a tail portion T. The tail portion T may be another parallel connection signal path formed at the end of the parallel connection signal path of the main portion M, only that the parallel connection signal path of the tail portion T is implemented with a lesser number of common signal lines SL than the parallel connection signal path of the main portion M.

In the example depicted in FIG. 14B, the parallel connection signal path of the tail portion T is formed of n−1 number of common signal lines SL, of which "n" denotes the total number of common signal lines SL used in forming the parallel connection signal path of the main portion M. However, it should be appreciated that the number of common signal lines SL for forming the parallel connection of the tail portion T is not limited to n−1. As such, in some embodiments, the tail portion of a signal path can be implemented with n−2, n−3 and so on. In some cases, a parallel connection signal path may be provided with a tail portion T that is formed of a single common signal line SL. For instance, the signal paths #27 and #37, which may be connected to the common electrode blocks #27 and #37, includes a parallel connection main portion M formed of two parallel-connected common signal lines SL and a tail portion T formed of a single common signal line SL.

In the example depicted in FIG. 14B, all of the signal paths for the common electrode blocks of the same group include a tail portion T. The tail portions T of those signal paths are implemented with the same number of common signal lines SL. For example, the tail portions T of the signal paths #1 through #7 are implemented with n−1 (i.e., 4 in this case) number of common signal lines SL. For more precise adjustment, the tail portions T of some of the signal paths can be configured differently from the tail portions T of other signal paths. Using different tail portion T may be particularly useful for the signal paths of the common electrode blocks of the same group, which each signal path has the main portion M implemented with the same number of common signal lines SL as one another. For the signal paths of the common electrode blocks of the same group, the tail portion T may not be much of a use in compensating the resistance differences if all of those signal paths are provided with the tail portion T configured in the exactly the same way as each other.

Figure 14C:
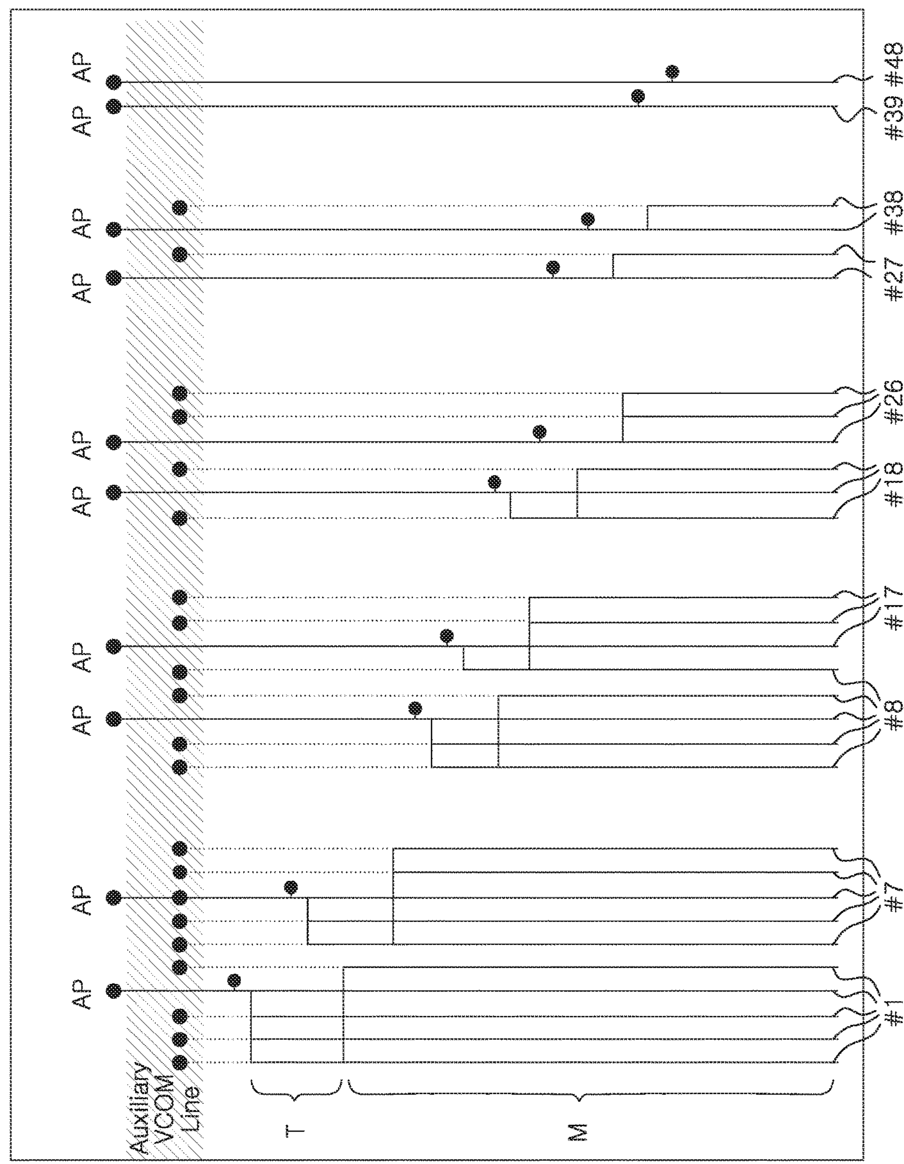

Accordingly, in some embodiments, the tail portion T of signal paths may be implemented with a different number of common signal lines SL even though those signal paths include the main portions M implemented with the same number of common signal lines SL as one another. FIG. 14C illustrates an exemplary configuration of signal paths having the same main portions M but provided with different tail portions T. In the example depicted in FIG. 14C, each of the signal paths #1 through #7 may have a main portion M implemented with n number of common signal lines SL (5 in the example of FIG. 14C). However, the tail portion T of the signal path #1 may be implemented with n−1 (e.g., 4) number of common signal lines SL and the tail portion T of the signal path #7 may be implemented with n−2 (e.g., 3) number of common signal lines SL.

Figure 14D:
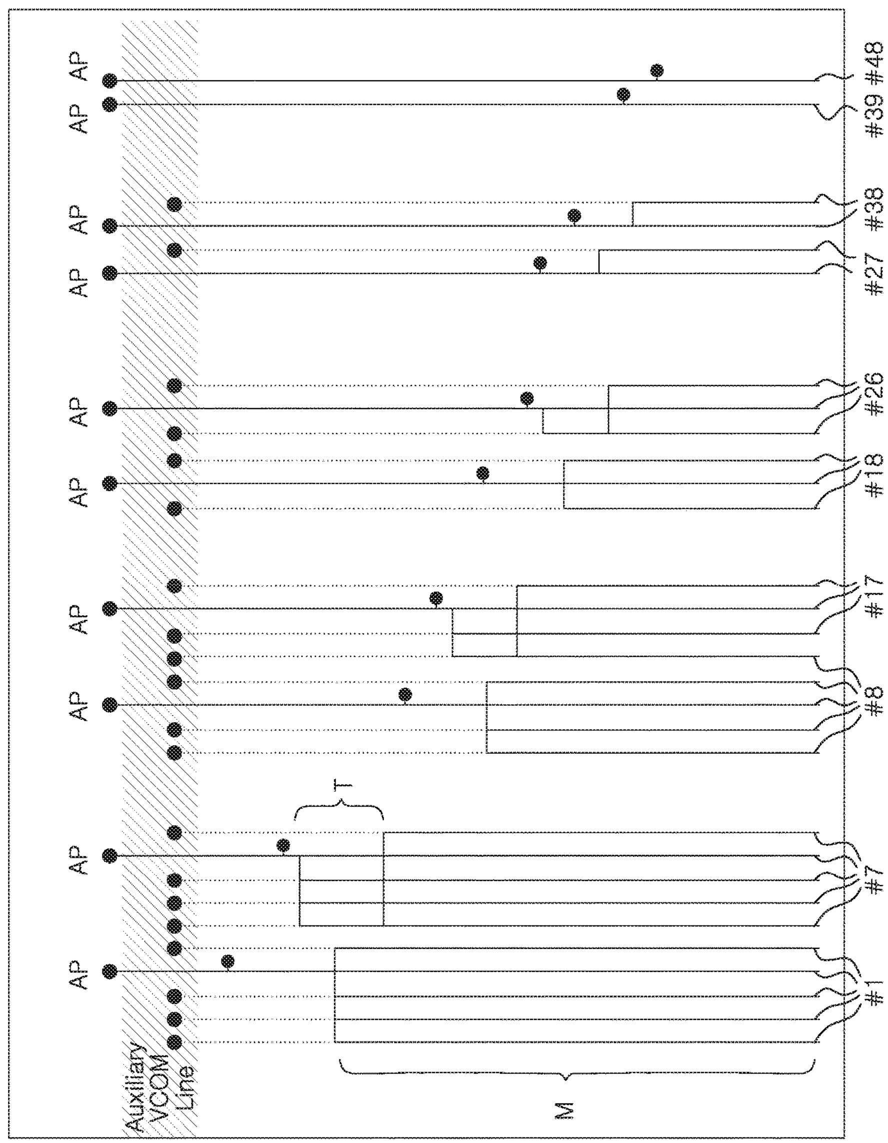

FIG. 14D illustrates an exemplary configuration of the signal paths for the common electrode blocks of the same group. In some embodiments, among the signal paths implemented with the same number of common signal lines SL, only some signal paths may be provided with the tail portion T. For instance, the signal path #1 may not be provided with a tail portion T, even though the main portion M for both the signal path #1 and the signal path #7 are implemented with the same number of common signal lines SL.

Figure 14E:
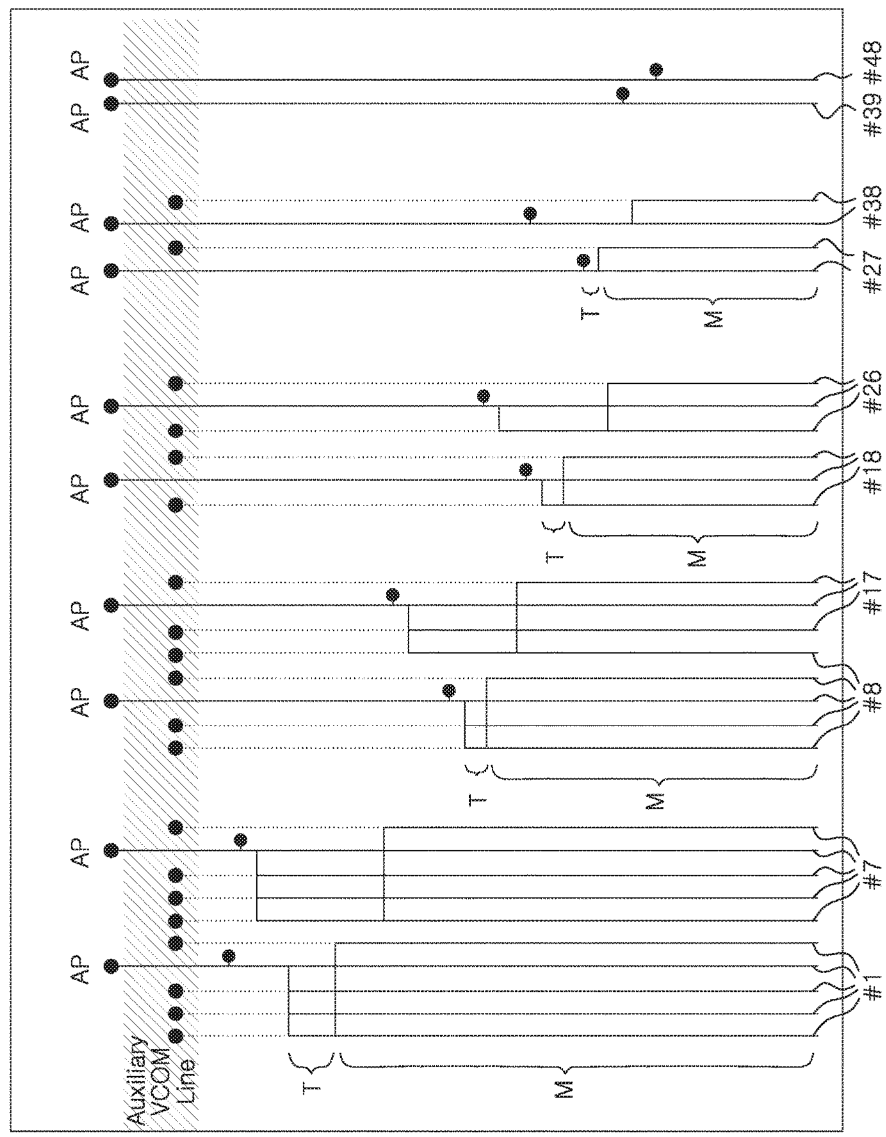

Moreover, in some embodiments, the length of the tail portion T can be adjusted to compensate for the resistance differences of the signal paths. For instance, the tail portion T of the signal path #1 and the tail portion T of the signal path #7 may be provided in a different length as shown in FIG. 14E.

It may be difficult to adjust the resistance of the signal path with a tail portion implemented with a single common signal line SL. For example, the length of a single common signal line SL for implementing the tail portion may not fit under the common electrode block which the tail portion needs to be connected. As such, in some embodiments, some signal paths may be provided with a tail portion T implemented with at least two common signal lines SL, which are connected in serial configuration.

Figure 14F:
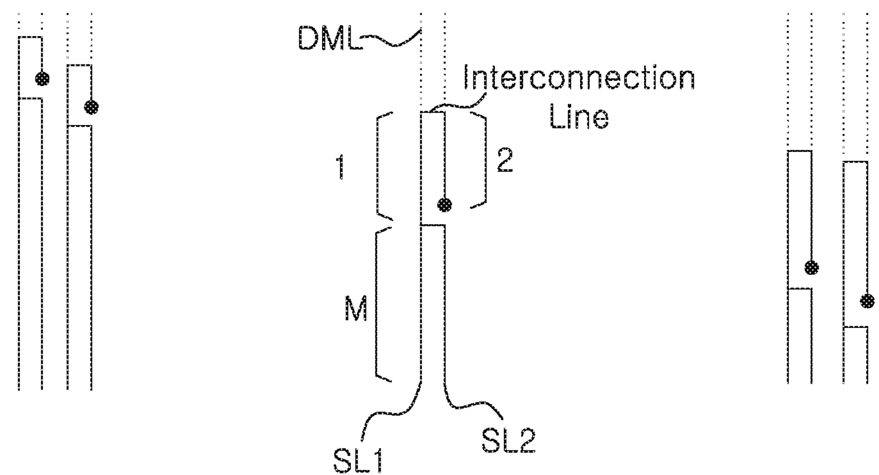

FIG. 14F illustrates an exemplary configuration of common signal lines SL for implementing a signal path with a serial-connection tail portion. Referring to FIG. 14F, a signal path includes a parallel connection main portion M and a serial-connection tail portion T. The serial-connection tail portion T is implemented with at least two parts (denoted 1 and 2), which are conductive lines patterned from the first metal layer M1 and placed under different data lines DL. An interconnection line can be used to serially connect the two parts, thereby implementing the serial connection tail portion T. In this regard, the collective length of the serial connection tail portion can be adjusted by adjusting the length of either parts (denoted 1 and 2). It should be noted that such serial-connection tail portion may also be provided for the signal paths having the parallel main portion implemented with more than two common signal lines SL.

In the previous examples, each of the signal paths for the common electrode blocks of the first group N1, which is the group that is closest to the touch driver TD, was implemented with a single common signal line SL. With a single common signal line SL, resistance of the signal path is very heavily dependent on the length of the common signal line SL. Thus, it can be difficult to normalize the resistance of the signal paths when the entire signal path is implemented with a single common signal line SL. Accordingly, in some embodiments, all signal paths for the common electrode blocks of the display panel PNL may be implemented with at least two common signal lines SL connected in parallel. In such embodiments, each and every signal paths between a common electrode block to the touch driver TD may include at least one parallel connection portion. Some signal paths may include the tail portion and some may not. For those signal paths including the tail portion T, the tail portion T can be implemented with a single common signal line SL, multiple common signal lines SL connected in serial configuration or multiple common signal lines SL connected in parallel.

As discussed above, the dummy lines DML that are disconnected from the common signal lines SL can be arranged under the data lines DL. As depicted in FIGS. 14B-14E, the dummy lines DML under the data lines DL may be disconnected from the parallel connection signal paths described above. Also, some of the common signal lines SL implementing the parallel connection signal path may be continuously extended across the display area.

Signal paths for common electrode blocks of other columns of common electrode blocks may also be configured in the similar way as described above. However, it should be noted that the configuration of signal paths for the column of common electrode blocks needs not be the same for every column of common electrode blocks. Some columns of common electrode blocks may have a different signal path configuration from a configuration of signal paths in other column of common electrodes.

[Contact Hole Position]

As mentioned, the common signal lines SL are routed across the display area of the display panel PNL along the data lines DL. This allows the routing portion of each common signal line SL to be at least partially overlap with the data line DL provided thereon. However, the contact portion transversely projected out from the routing portion of the common signal line SL may not be covered under the data line DL.

Also, the bypass lines BL cannot be positioned to overlap with the gate lines GL because the bypass lines BL are formed of the second metal layer M2, which is the same non-transparent metal layer of the gate lines GL and the gate electrode of the TFTs. In LCD devices, the bypass lines BL would block the light from the light source (e.g., backlight) to pass through, effectively reducing the aperture of the pixels. Even for self-light emitting display such as the OLED display, the bypass lines BL can reflect external light and make it difficult to see the images on the screen. Thus, the contact portion of the common signal line SL as well as the bypass lines BL is concealed under a masking layer BM in a similar way as the gate lines GL and data lines DL are concealed under the masking layer BM. The same applies to the contact portion of the dummy lines DML and the bypass lines BL connecting the dummy lines DML to the corresponding ones of the common electrode blocks.

Since the masking layer BM defines the aperture ratio of the pixels, covering the bypass lines BL results in reduction in the aperture ratio of the pixels where the bypass lines BL are arranged therein. Because at least one bypass line BL is needed to connect a common signal line SL to the common electrode block, each pixel group sharing a common electrode block may include pixels with different aperture ratios. For instance, the maximum aperture ratio of the pixel region with the lower contact hole CTL may differ from the maximum aperture ratio of the pixel region with the upper contact hole CTU. Also, the maximum aperture ratio of the pixel regions where the interim section of the bypass line BL is laid across may be different from the maximum aperture ratio of the pixel regions accommodating the lower or the upper contact holes. Further, some pixels may not be accommodating any of the contact holes or the bypass line BL, and allowed with a greater maximum aperture ratio than the maximum aperture ratio of other pixels. Herein, the pixels with a reduced maximum aperture ratio due to the contact holes or the bypass lines BL may be referred to as the "bypass pixels." The pixels in which the maximum aperture ratio is not reduced by the contact holes or the bypass lines BL may be referred to as the "normal pixels."

Referring back to FIG. 6A, the lower contact hole CTL for connecting the common signal line SL to the bypass line BL is provided in one of the pixel region, and the upper contact hole CTU for connecting the bypass line BL to the common electrode block is provided in another pixel region. The lower contact hole CTL and the upper contact hole CTU should be covered with the masking layer BM. Thus, the pixels accommodating the lower contact hole CTL and the upper contact hole CTU have reduced maximum aperture ratio then the pixels in between those two pixels.

To improve efficiency, the lower contact hole CTL and the upper contact hole CTU may be provided at certain selective pixels. For example, the lower contact hole CTL and the upper contact hole CTU may be provided in blue pixel regions. Luminance of blue pixels tends to be lower than the luminance of green or red pixels, even when they are provided in the same size. With a poor luminance/size ratio, the actual amount of luminance decreased by placing the contact holes is less in the blue pixel regions as compared to placing the contact holes in red and green pixel regions. Therefore, in some embodiments, the lower contact hole CTL and the upper contact hole CTU at the opposite ends of the bypass lines BL may be arranged in the blue pixel regions.

As shown in the examples of FIG. 6A, the blue pixel regions for accommodating a lower contact hole CTL and an upper contact hole CTU for connection of a bypass line BL may be the pixels in the same row. The intermediate pixel regions between the blue pixel region with the lower contact hole CTL and the blue pixel region with the upper contact hole CTU in the same row includes pixel regions of other colors, such as a red pixel region, a green pixel region and/or a white pixel region.

A blue pixel region without a contact hole may also be included among the intermediate pixel regions between the two blue pixels accommodating the contact holes. That is, the interim section of a bypass line BL between the blue pixel region with the lower contact hole CTL and the blue pixel region with the upper contact hole CTL may be laid across one or more blue pixel regions, which do not accommodate neither the lower contact hole CTL nor the upper contact hole CTU therein.

It should be reminded that the bypass line BL and the gate lines GL are provided in the same plane, and thus they are not arranged to overlap one another. As such, the aperture ratio of the intermediate pixel regions is also reduced by the bypass lines BL extending between the lower contact hole CTL and the upper contact hole CTU. In order to minimize the number of bypass pixel regions, that is, the pixel regions of which the aperture ratio is reduced due to the bypass line BL, the length of the bypass lines BL should be kept minimal. For this reason, the lower contact hole CTL and the upper contact hole CTU for each of the bypass lines BL may be provided in two closest blue pixel regions of the same row. In other words, the blue pixel region where the upper contact hole CTU is formed in may be the first blue pixel region of the same row, which comes after the blue pixel region with the lower contact hole CTL.

[Common Signal Line Detour]

In order to place the SL-BL contact region and the BL-VCOM region in the blue pixel regions, a common signal line SL under one data line DL may need to be partly detoured under another data line DL. For example, one or more common signal lines SL at the right end of a common electrode block may run out of a blue pixel region to accommodate the BL-VCOM contact region.

Figure 15A:
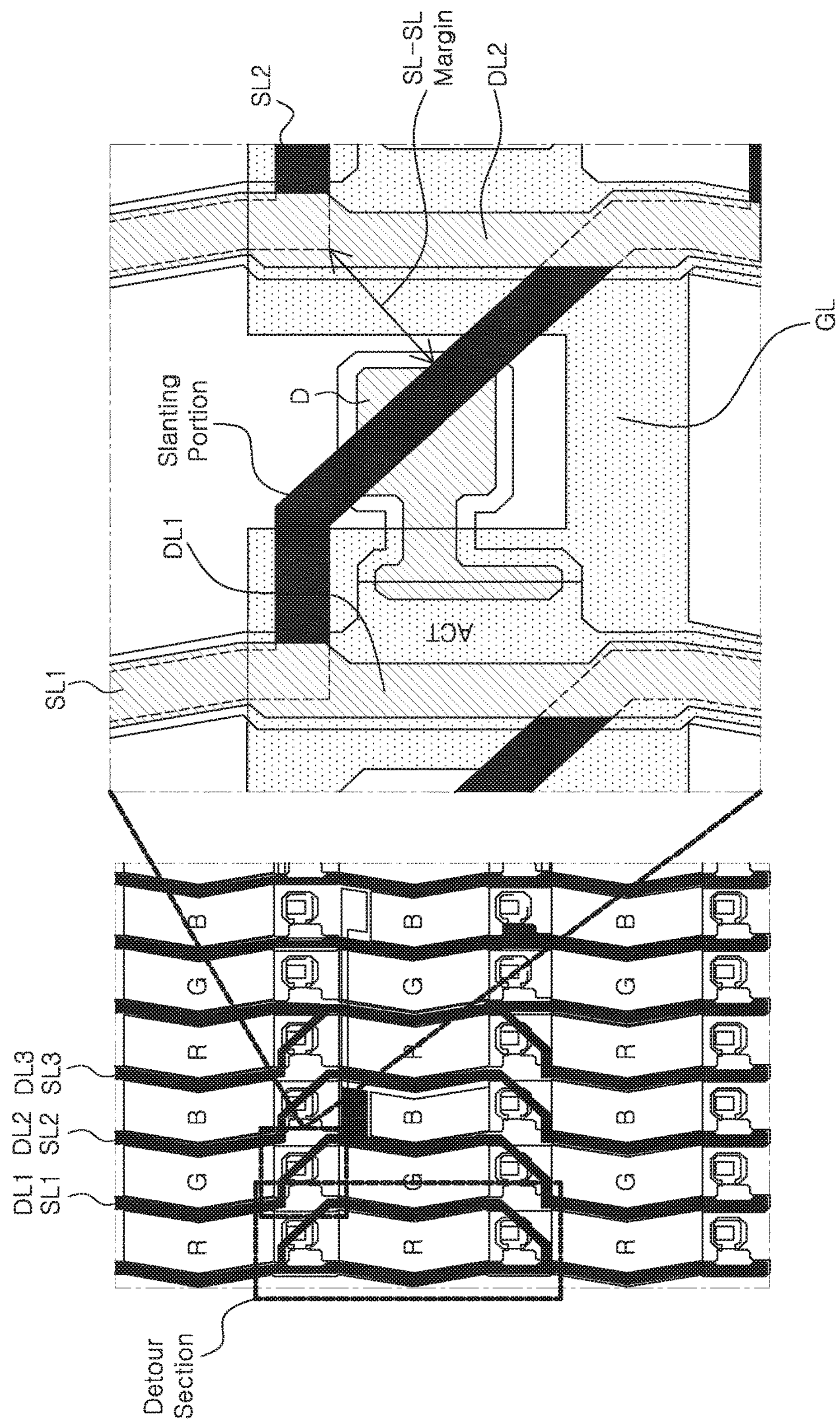
FIG. 15A illustrates an exemplary configuration of common signal lines at the detour section.

FIG. 15A is a schematic illustration of common signal lines SL provided with a detour section DT, according to an embodiment of the present disclosure. Referring to FIG. 15A, a common signal line SL1 routed under a data line DL1 is provided with a detour section, which is skewed toward the data line DL2. As such, the detour section DT of the common signal line SL1 runs under the data line DL2. In the example of FIG. 15A, the detour section DT of the common signal line SL1 is a single pixel long. That is, the detour section DT of the common signal line SL1 extends in the Y-direction under the data line DL2 for a single pixel, then returns back under the data line DL1. However, the length of the detour section DT is not limited as such. If desired, the detour section DT may continue for a plurality of pixels. In such cases, however, the detour section DT of the adjacent common signal lines SL2, SL3, etc. would also be extended further.

Figure 15B:
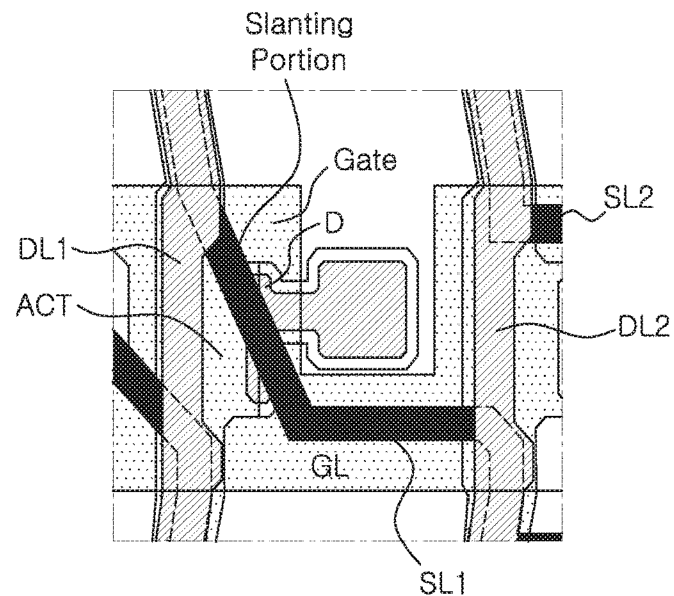
FIG. 15B illustrates another exemplary configuration of common signal lines at the detour section.
Figure 15B:
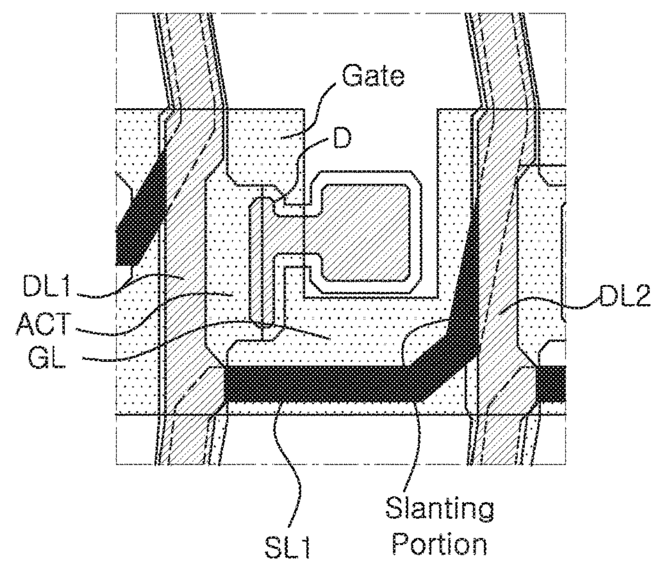

The shift in the lane between the two data lines DL can be made at the part of the common signal line SL crossing under the gate line GL. In this regard, the slanting portion of the common signal line SL may be covered under the gate line GL. Because the common signal line SL carries modulation pulse signal during the touch scanning period, thus the signal on the pixel electrode PXL can be affected by the signal on the common signal line SL and cause unwanted visual artifacts on the screen. Referring to FIG. 15B, the slanting portion of the common signal line SL may be routed in an angle such that the slanting portion does not go under the drain D of the TFT, which is not covered by the gate line GL. Further, some part of the common signal line SL may be routed in the X-direction along the gate line GL to be covered under the gate line GL. Further, the slanting portion of the common signal line SL should be angled such that a sufficient margin can be provided between two detouring sections of the common signal lines SL. In suitable embodiments, any two detouring sections of the common signal lines SL may be spaced apart from each other by 5 um or more, and more preferably by 6 um or more.

[Aperture Ratio Compensation]

Depending on the size and location, considerable difference in the maximum aperture ratio can result between the bypass pixels and the normal pixels. The portion of the bypass line BL corresponding to the contact holes for connecting the bypass line BL to the common signal line SL and to the common electrode block may be larger than other portions of the bypass line BL. As such pixels where the contact holes in the lower planarization layer PLN-L for connecting the common signal line SL to the bypass line BL and in the upper planarization layer PLN-U for connecting the common electrode block to the bypass line BL may have even smaller maximum aperture ratio than other bypass pixels between the two. The differences in the aperture ratio of the pixels may be visually noticeable to a naked human eye, for instance as a moiré pattern or a dim line, especially when the pixels of different aperture ratio are arranged in a simple repeated pattern.

Since it is the differences in the aperture ratio of pixels which becomes the visually noticeable pattern, lessening the differences in the aperture ratio of the pixels would make the pattern less noticeable. Accordingly, in some embodiments, the masking layer BM may be configured to compensate for the loss of aperture ratio in the bypass pixels.

Figure 16:
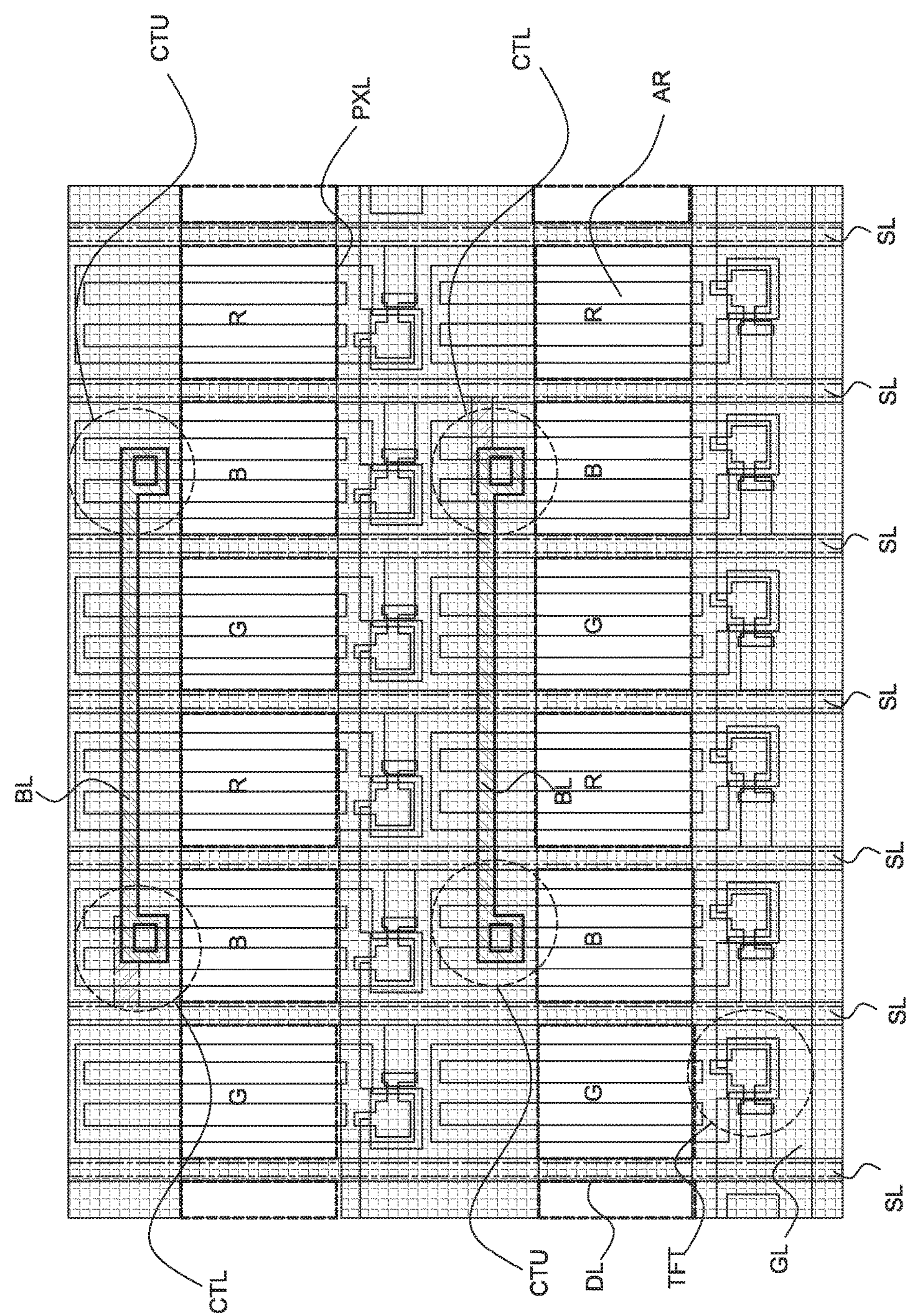
FIG. 16 is a schematic illustration showing an exemplary configuration of masking layer, according to an embodiment of the present disclosure.

Referring to FIG. 16, the masking layer BM includes a plurality of strips covering the data lines DL and the gate lines GL. In the present disclosure, the strips arranged in a longitudinal direction, covering the data lines DL, may be referred to as the data BM strip. The strips arranged in horizontal direction, covering the gate lines GL and the bypass lines BL may be referred to as the gate BM strip. Further, a portion of each gate BM strip and each data BM strop corresponding to a pixel is referred to as a gate BM section and a data BM section, respectively. In other words, a single gate BM strip includes a plurality of gate BM sections. Similarly, a single data BM strip includes a plurality of data BM sections. These BM strips and the BM sections of the BM strips are arranged to intersect one another to set the aperture ratio of the pixel regions, hence they are generally referred to as the black matrix pattern.

[Simple BM Pattern]

In some embodiments, aperture ratio of all pixels can be formed to be equal as depicted in FIG. 16. In this regard, the width of the gate BM strips may be set to the width of the gate BM strip for the pixel region with the smallest maximum aperture ratio. For example, the gate BM strip for all pixel regions may be provided in a width that is sufficient to cover upper the contact hole CTU and the lower contact hole CTL. In this way, there will not be aperture ratio discrepancies between the bypass pixels and the normal pixels, albeit the overall aperture of all of the pixels will be reduced down to the smallest aperture of the pixels.

In some cases, reducing the aperture ratio discrepancies between the pixels accommodating the contact holes and the normal pixels may alone be enough for eliminating the visually noticeable patterns to a certain level. As such, it is also possible that the width/alignment adjusted section in a strip spans continuously for limited number of pixels. For instance, a continuous section of a gate BM strip, which spans from the pixel with the lower contact hole CTL until the pixel with the upper contact hole CTU, may have a single width and aligned in the same way, even though the maximum aperture ratio that some of the pixels in that particular section may be greater than the maximum aperture ratio of some of other pixels of that section.

In some embodiments, the width of gate BM sections can be adjusted to reduce the discrepancy in aperture between the pixel regions. For instance, the widths of the gate BM sections corresponding to the normal pixels may be wider than the widths of the gate BM sections corresponding to the bypass pixels accommodating either the lower contact hole or the upper contact hole. Also, the widths of the gate BM sections corresponding to the intermediate bypass pixels may be wider than the widths of the gate BM sections corresponding to the bypass pixels accommodating either the lower contact hole or the upper contact hole. Further, the widths of the gate BM sections corresponding to the bypass pixels accommodating the upper contact hole may be wider than the width of the gate BM sections corresponding to the bypass pixels accommodating the lower contact hole. In this setting, the widths of the gate BM sections are adjusted to maximize the aperture of the bypass pixels accommodating the lower contact hole and the upper contact hole, then the widths of the gate BM sections corresponding to other pixels are adjusted in reference to the aperture of those bypass pixels having the contact holes therein. This setting may provide higher overall aperture than the previous embodiments. However, the location of the aperture for each pixel can be skewed from one another, which may not be desirable in some cases.

It should be noted that the differences in width among different the sections of the gate BM strips needs not be as large to make the aperture ratio of the pixels exactly the same. As shown in the example of FIG. 16, uniformity in aperture of bypass pixels and the normal pixels can tax the overall aperture of the pixels. Accordingly, in some embodiments, aperture of the bypass pixels may be from 80 percent to 95 percent of the aperture of the normal. More preferably, aperture of the bypass pixels may be from 85 percent to 95 percent of the aperture of the normal. The aperture discrepancy at such a level may not be visually noticeable to a naked human eye, especially when coupled with several other features described in the present disclosure.

[Asymmetric BM Pattern]

In such settings, however, the overall luminance of the display panel PNL suffers at some level. Accordingly, in some other embodiments, selective sections of the masking layer BM next to the pixel regions of the bypass pixels can be provided narrower than the other sections of the masking layer BM so that the aperture ratio discrepancies between the bypass pixels and the normal pixels can be reduced. Also, selective sections of the masking layer BM abutting the pixel regions of the bypass pixels can be shifted away or skewed from the sections abutting the normal pixels. In this way, the aperture ratio of the bypass pixels can be increased while reducing or maintaining the aperture ratio of the normal pixels. Accordingly, the difference in the aperture ratio of the bypass pixels and the normal pixels can be reduced, while maintaining the overall luminance level of the display panel PNL.

For example, the width and/or the alignment of the sections in the data BM strips and/or the gate BM strips can be adjusted to compensate the amount of aperture ratio difference between the bypass pixels and the normal pixels. In the data BM strips and/or the gate BM strips, such adjustments may be made on a pixel by pixel basis. That is, the width/alignment of the strips may be different between the pixel having the lower contact hole CTL, the pixel having the upper contact hole CTU, the intermediate pixels and the normal pixels.

In order to reduce the aperture ratio discrepancy among the pixels, some of the sections in a data BM strip can be asymmetrically arranged from other sections of the same data BM strip. At the basic level, sections of the data BM strips bordering the bypass pixels can be narrower than the sections that are only bordering the normal pixels. In such configurations, the sections of data BM strips placed between two normal pixels may be configured to be wider than other sections of the data BM strip. That is, if any one of the pixels on the left and the right sides of the section is a bypass pixel, then the width of the data BM strip at that section may be narrower than the sections between two normal pixels. In this way, the reduction in the aperture ratio of the bypass pixels due to the bypass lines BL can be compensated to some degrees.

Figure 17A:
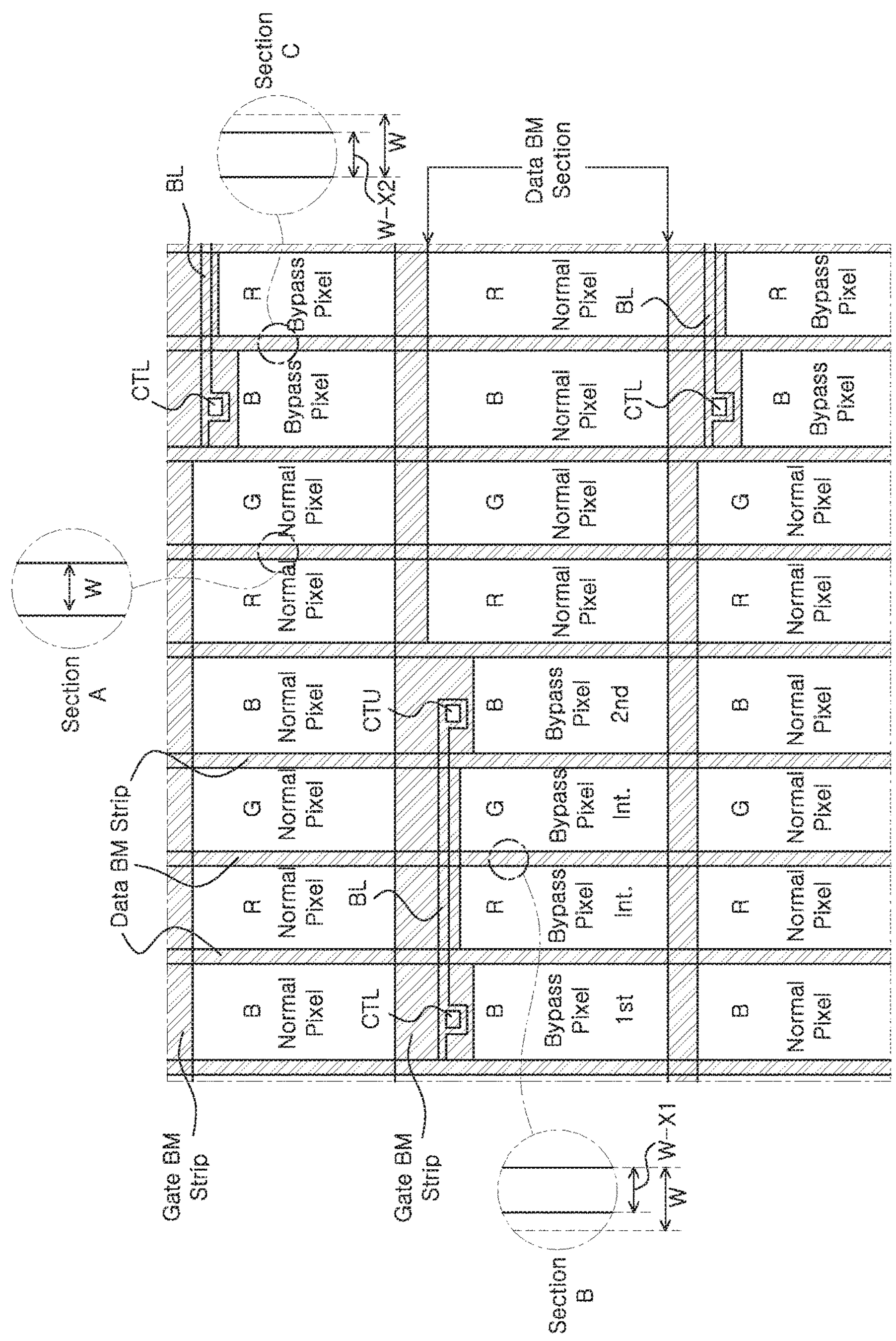
FIGS. 17A-17E illustrate various exemplary configurations of a masking layer, according to embodiments of the present disclosure.

As shown in FIG. 17A, in some embodiments, sections in the data BM strip between two immediately adjacent normal pixels (e.g., section A) may be provided with a width "W", which is greater than the width of the sections of the data BM strip next to the first bypass pixel with the lower contact hole CTL, the second bypass pixel with the upper contact hole CTU and any of the intermediate bypass pixels between the first bypass pixel and the second bypass pixel. That is, in each of the data BM strips, data BM sections positioned next to a first bypass pixel (e.g., section C), a second bypass pixel or any intermediate bypass pixels between the first bypass pixel and the second bypass pixel (e.g., section B) may be narrower than other data BM sections positioned between two immediately adjacent normal pixels (e.g., section A).

Further, in some embodiments, the data BM sections that are neighboring the first bypass pixel, the second bypass pixel or any intermediate pixels between the first bypass pixel and the second bypass pixel may have substantially the same width, which is narrower than a width of data BM sections positioned between two immediately adjacent normal pixels. Accordingly, the differences in the width of the masking layer BM can compensate the aperture ratio discrepancy due to the placement of the bypass lines BL. However, it should be noted that the differences in width among different the sections of the data BM strips needs not be as large to make the aperture ratio of the pixels exactly the same. As described above, in some embodiments, aperture of the bypass pixels may be from 80 percent to 95 percent of the aperture of the normal. More preferably, aperture of the bypass pixels may be from 85 percent to 95 percent of the aperture of the normal. The aperture discrepancy at such a level may not be visually noticeable to a naked human eye, especially when configured with several other features described in the present disclosure.

By way of example, the width of the sections in the data BM strip neighboring the bypass pixels may be about 5 to 6 um while the width of the sections between the normal pixels may be about 7 to 8 um. The width of the data line and the width of the common signal line SL should be equal to or less than the width of any given sections in the data BM strip. In other words, the widths of the data line DL and the common signal line SL placed thereunder may set the narrowest width of the data BM sections next to the bypass pixels.

As mentioned above, the pixel regions that are accommodating the contact holes may suffer the most in terms of aperture ratio by the bypass line BL. Therefore, in some embodiments, the sections of data BM strips positioned next to the pixel regions with the lower contact hole CTL and the pixels regions with the upper contact hole CTU can be configured to provide the maximum compensation of aperture ratio to those pixels. As such, in some of the embodiments, some of the data BM sections may be configured to be off-centered in relation to the center of the data line DL placed thereunder as shown in sections “A”, “B” and “C” of FIG. 17B.

Figure 17B:
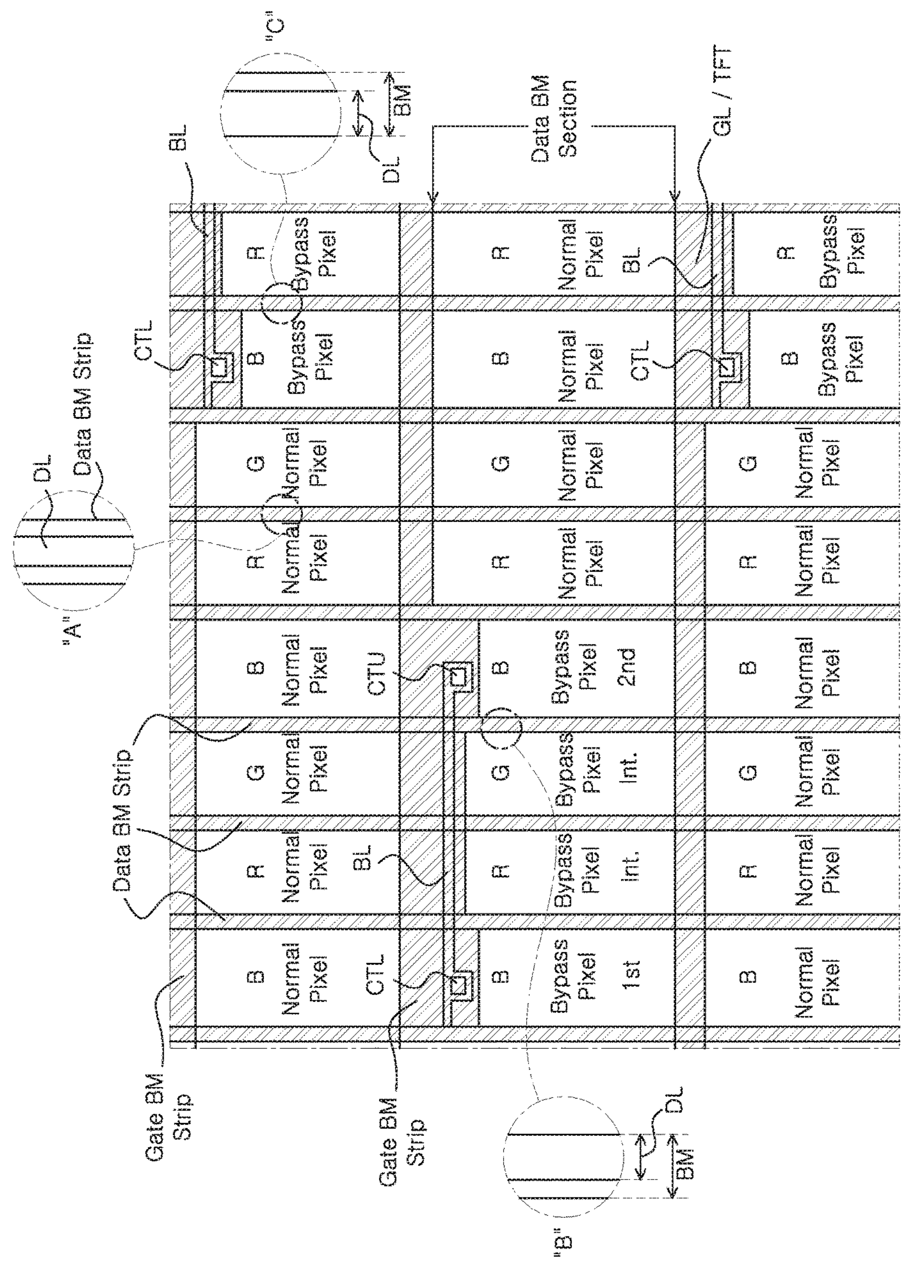
Figure 17C:
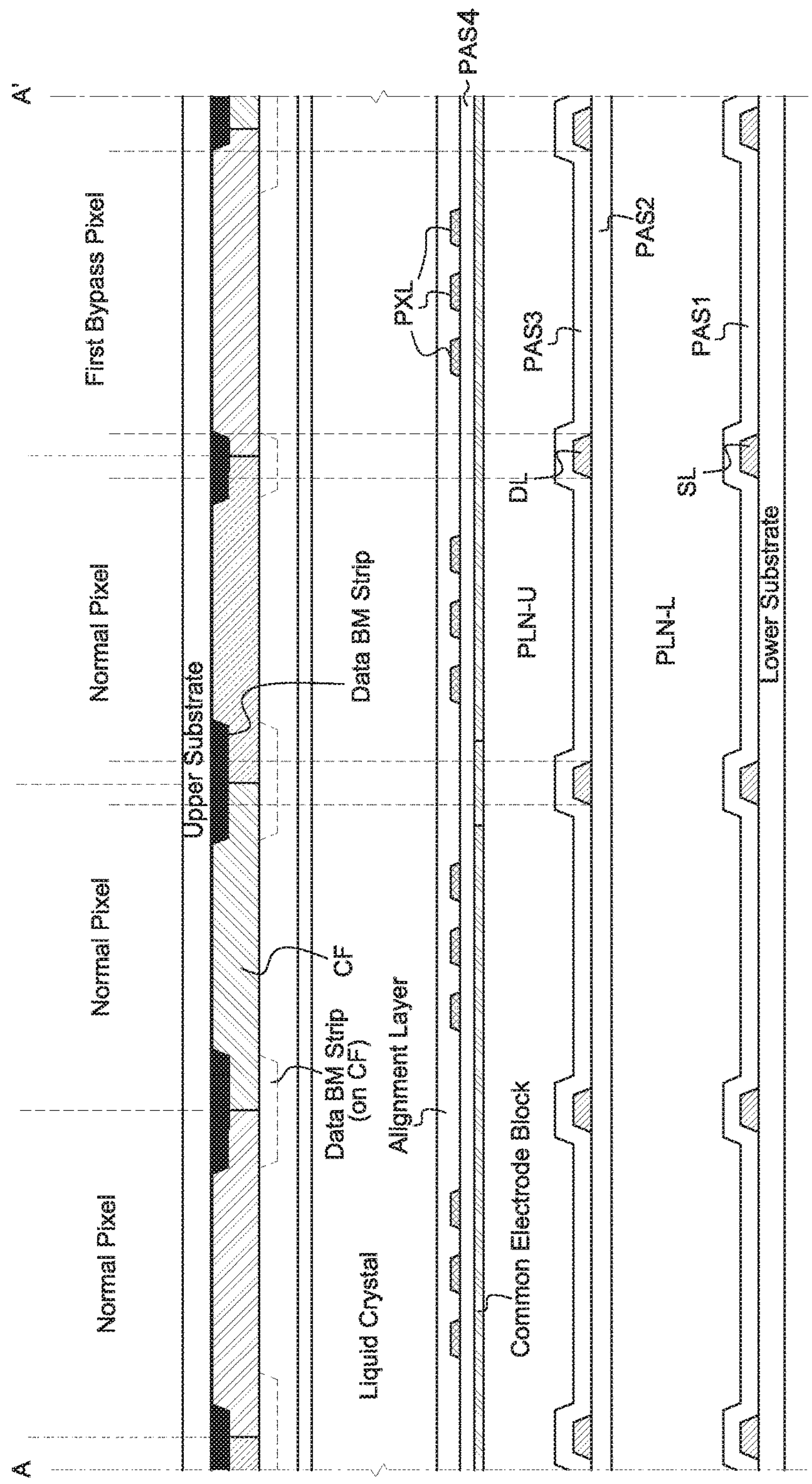
Figure 17D:
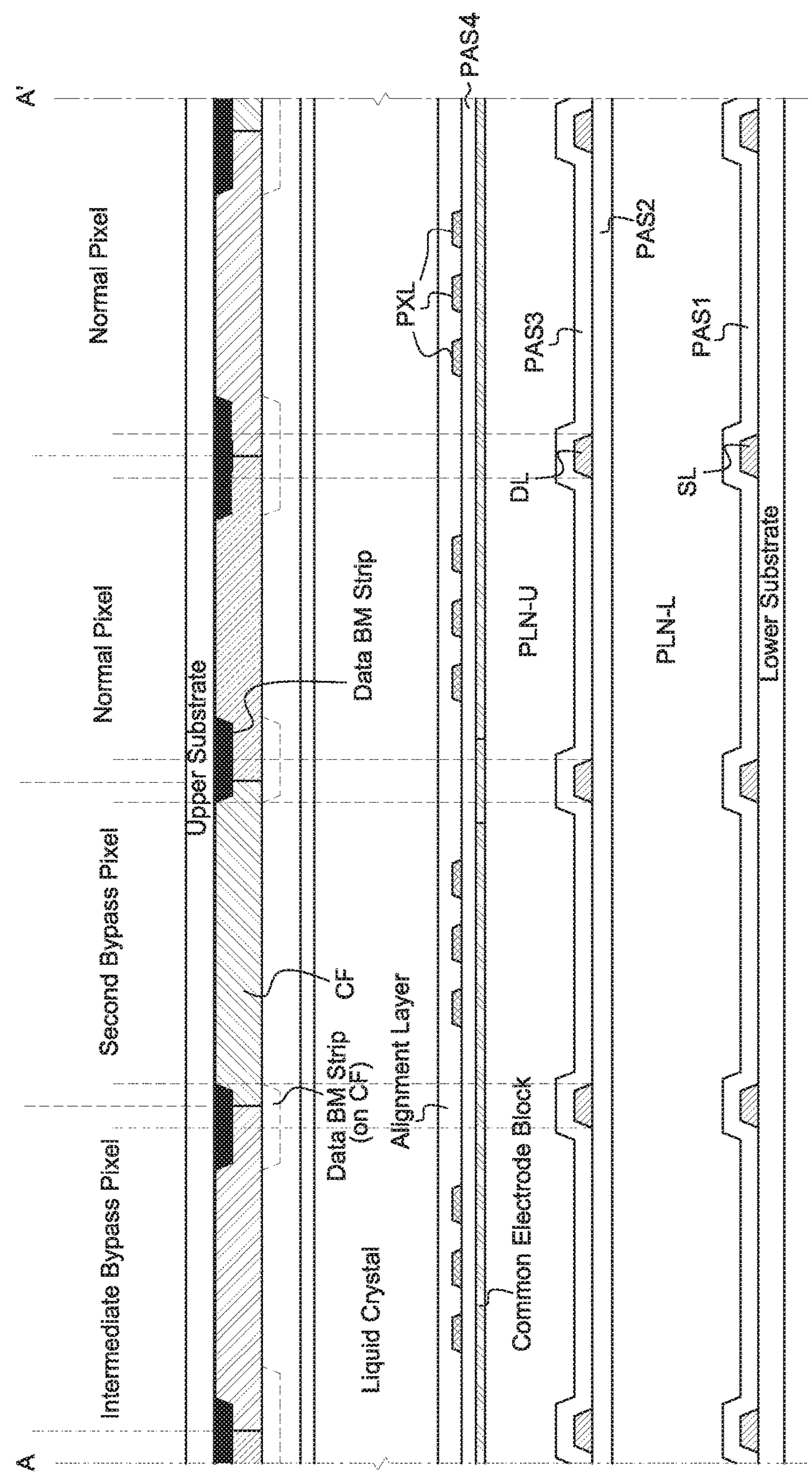
Figure 17E:
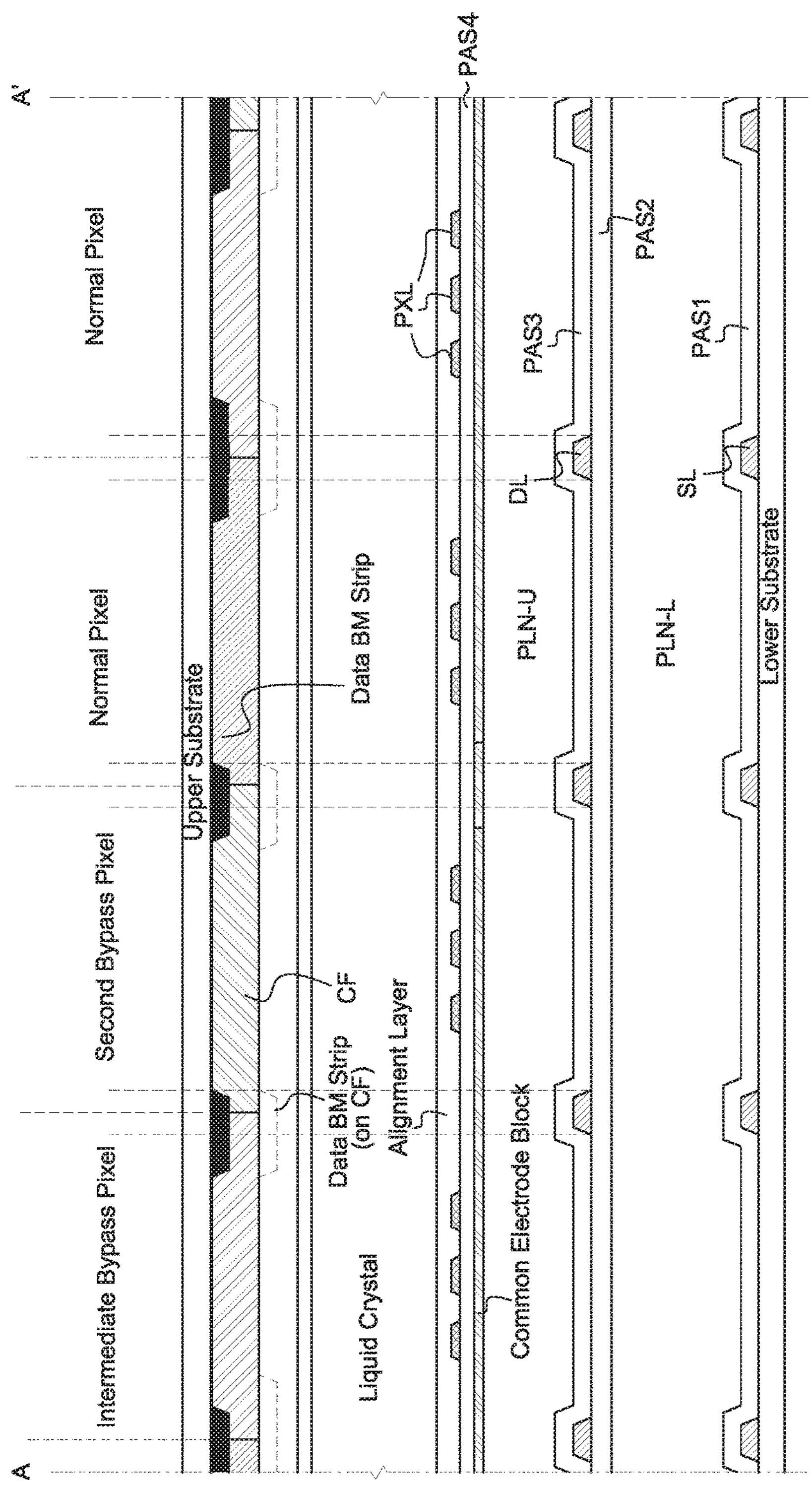

In FIG. 17B, the data BM sections between a pixel with a contact hole and a normal pixel may be configured asymmetrically from other sections of the data BM strip. FIGS. 17C-17E are cross-sectional views of the sections “A”, “B” and “C” in FIG. 17B, respectively. Referring to FIG. 17C, the width of the data BM sections between the normal pixels (i.e., wider portions of the data BM strips) may be greater than the width of the data line DL and the common signal line SL below. Thus, extra width of the data BM section may be distributed equally on both sides on the data line DL. By way of an example, if the data BM section between the two normal pixels has 3 um of extra width, then 1.5 um of the data BM section can overhang on each side of the data line DL and/or the common signal line SL.

As described above, the data BM sections neighboring the pixel with a contact hole is asymmetrically configured with respect to other sections of the data BM strips. In this regard, the length in which the data BM section overhangs beyond the edge of the data line DL toward the normal pixel may be greater than the length of the data BM section overhanging toward the pixel with the contact hole. As shown in FIGS. 17D and 17E, the edge of the data BM section and the edge of the data line DL toward the pixel with the contact hole can be arranged to be justly or otherwise vertically aligned to each other for the maximum aperture ratio for the pixels with the contact hole. Further, in some embodiments, the length in which the data BM section overhangs toward the pixel with a contact hole beyond the edge of the data line DL thereunder is shorter than the length in which the respective data BM section overhangs toward the intermediate bypass pixel.

Note that the BM section should cover both the data line DL and the common signal line SL there under, and thus, the edge of the data BM section and the edge of the common signal line SL may be aligned to each other toward the pixel with the contact hole. In other words, the edge of the data BM section can be aligned with either the edge of the data line DL or the edge of the common signal line SL, whichever is closer to the pixel with the contact hole.

The light from a light source may be passed through a color filter layer, which would set the color of light emitted from each of the pixel region. In some embodiments, the color filter layer and the masking layer BM may be provided on a second substrate, which is different from the first substrate where the array of TFT is located. Here, the color filter layer may be arranged such that the masking layer BM is provided further away from the first substrate than the color filter layer. Alternatively, the color filter layer and the masking layer BM may be provided on a second substrate, and arranged such that the masking layer BM is provided closer toward the first substrate where the array of TFTs is provided than the color filter layer. The light from the display can be projected from the first substrate and extracted toward the second substrate, and the masking layer BM positioned closer toward the first substrate then the color filter layer can help in suppressing light intended for one pixel leaking into an adjacent pixel.

In some embodiments, the masking layer BM may be provided closer to the light source than the color filter layer. Providing the masking layer BM closer to the light source allows to control the angle of the light from the light source to the color filter layer with more acuity, which in turn, makes it possible to suppress light leakage and/or color washout issues at a reduced width of the masking layer. Accordingly, the discrepancy in the aperture ratio between the normal pixel and the bypass pixels can be dealt with the asymmetric BM strips with a lower risk of such light leakage or the color washout issues.

[Wavy Bypass Line]

In some embodiments, the location and the shape of the bypass line BL can be adjusted to maximize the aperture ratio of the bypass pixels. Depending on the shape of the gate line GL, some parts of the bypass line BL can be arched toward the gate line GL, while keeping the minimum margin from the gate line GL. By eliminating the space wasted between the gate line GL and the bypass line BL, the area that needs to be covered by the masking layer BM can be reduced for the bypass pixels.

Figure 18A:
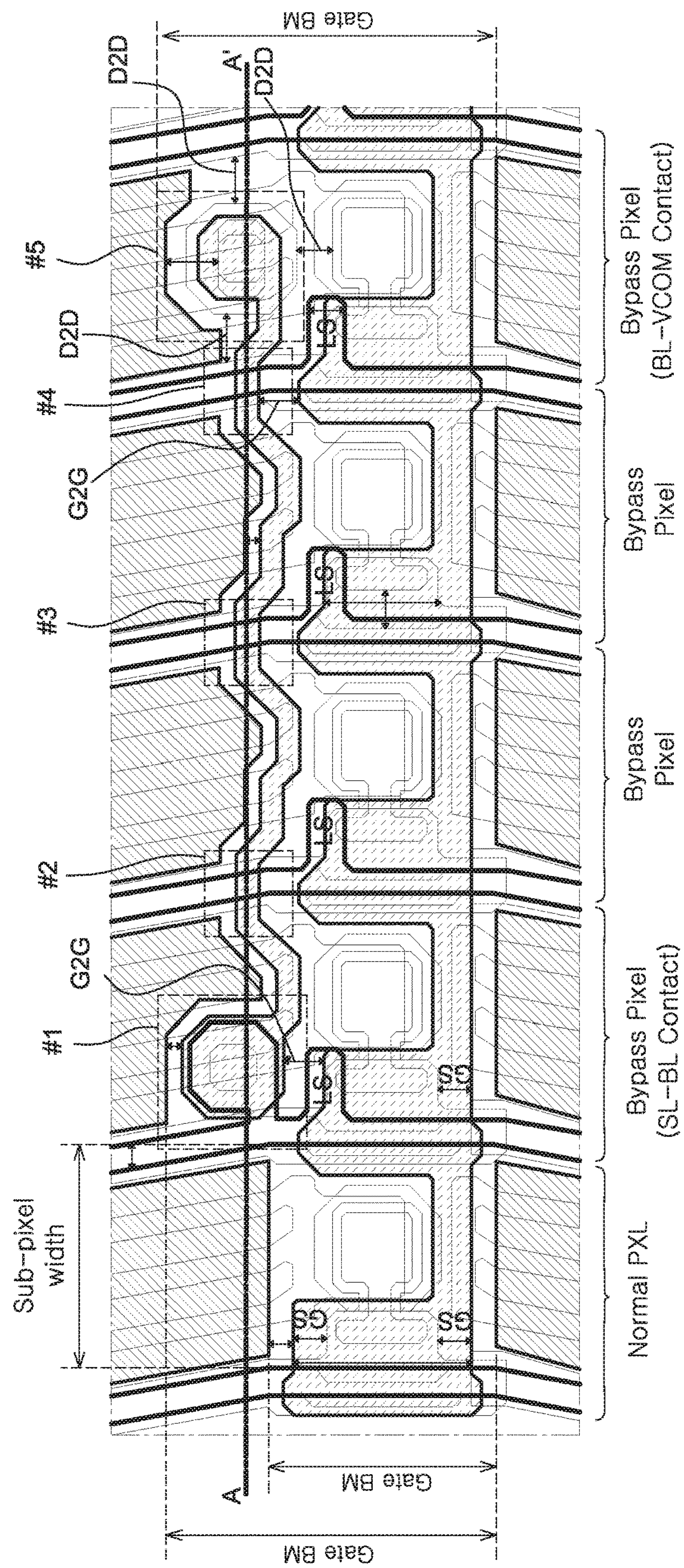
FIGS. 18A-18C illustrate exemplary configurations of common signal lines having a light shield, according to an embodiment of the present disclosure.
Figure 18B:
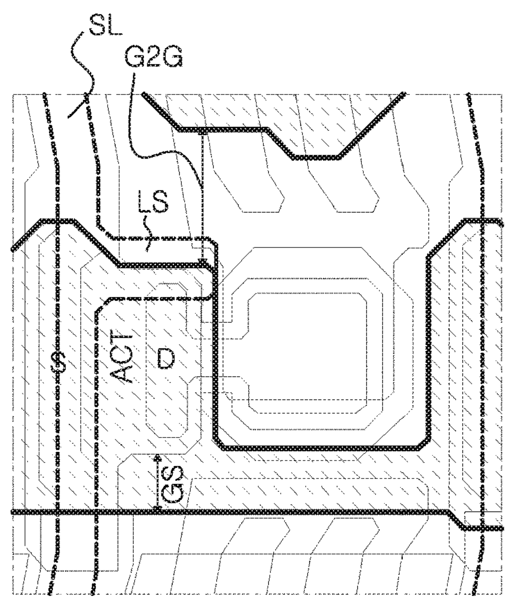

FIGS. 18A and 18B illustrate an exemplary configuration of the bypass line BL, which may be provided in the display panel PNL for greater aperture ratio of the bypass pixels. With both the gate line GL and the bypass line BL being patterned from the second metal layer M2, they must be spaced apart from each other by a minimum margin (denoted as G2G). As a non-limiting example, the minimum margin G2G between the gate line GL and the bypass line BL may be about 5 um. As shown, the gate line GL includes a plurality of gate electrodes that project out toward the active channel of the TFTs from the main routing portion of the gate line GL. There is an indented open area between every two adjacent gate electrodes for connecting the drain of the TFT and the pixel electrode PXL. As such, the part of the bypass line BL next to the indented open area can be arched in toward the indented open area until the minimum margin is reached.

Accordingly, the bypass line BL has a sign-wave form shape, which parts of the bypass line BL is curved in and out. More specifically, parts of the bypass line BL arches in toward an indented open area between two gate electrodes, and parts of the bypass line BL arches out in the opposite direction at the gate electrode portion of the gate line GL. In the example shown in FIGS. 18A and 18B, both the SL-BL contact region and the BL-VCOM contact region are provided in blue pixel regions. The bypass line BL laid between these two blue pixel regions include three arched-in portions and three arched-out portions. Even though the bypass line BL is provided with such a sign-wave shape, all parts of the bypass line BL is distanced away from the gate line GL by at least the minimum margin G2G.

[Common Signal Line with Light Shield]

Considering the minimum margin G2G between the gate line GL and the bypass line BL discussed above, greater aperture ratio can be achieved by reducing the size of the gate electrode. In embodiments which the TFTs of the display panel PNL are the bottom gated inverted staggered type TFTs, the gate electrode serves as a light shield LS for the active of the TFT. To serve as the light shield LS, the gate electrode may need to be provided in a larger dimension than it needs to be for simply controlling on/off state of the TFT. The extra length of the gate electrode outside the edge of the active of the TFT for light shielding purposes may be referred to as the gate shield GS. However, the dimension of the gate electrode, in particular the size of the gate shield GS, can be reduced if the active of the TFT can be shielded from the light by another structure.

Accordingly, in some embodiments, some of the common signal lines SL may be provided with a light shield LS. More specifically, the light shield LS may be projected out from the routing portion of the common signal line SL. The light shield LS is positioned at the end of the gate electrode facing the bypass line BL. In the pixels provided with the light shield LS, the width of the gate shield GS can be reduced. In other words, the light shield LS, which patterned from the first metal layer M1, is provided to compensate for the reduced width of the gate shield GS. When the width of the gate shield GS is reduced, the bypass line BL can be placed more toward the gate line GL, and this would allow a thinner gate BM at the bypass pixels.

As shown in FIG. 18A, the light shield LS may not be needed in the normal pixel as the normal pixel has the greatest aperture ratio even without the light shield LS. In such cases, the gate electrode is provided with the gate shield GS of a sufficient width. For instance, the width of the gate shield GS in the Y-direction may be 4 um or greater.

The common signal line SL between the normal pixel and the first blue pixel is provided with the light shield LS. The common signal line SL includes a connection portion that projects out from the routing portion. In such cases, the connection portion can be enlarged and serve as the light shield LS at the same time as shown in FIG. 18A.

Each of the common signal lines SL positioned between the first bypass pixel and the last bypass pixel is also provided with the light shield LS. Since these common signal lines SL do not have the connection portion, the light shield LS of these common signal lines SL are not as large as the one in the first bypass pixel.

FIG. 18B is an enlarged view showing an exemplary configuration of the common signal lines SL with the light shield LS. As shown, the light shield LS can be positioned next to the gate shield GS of the bypass line BL side. It should be noted that the gate electrodes of the bypass pixels still include the gate shields GS, although at a much narrower width than the gate shield GS of the normal pixel. As mentioned above, the reduced width of the gate shield GS in the bypass pixels shifts the boundary of the minimum margin G2G between gate line GL and the bypass line BL, and thus the bypass line BL can also shift toward the gate line GL without impinging upon the minimum margin G2G from the gate line GL.

As shown, the width of the light shield LS can be greater than the width of the gate shield GS provided in the normal pixel. As such, the light shield LS compensates for the reduced width of the gate shield GS in the bypass pixels. In this regard, the light shield LS in the bypass pixel may be configured to provide even a greater coverage than the gate shield GS of the normal pixel. In other words, the distance between the edge of the active and the edge of the light shield LS on the bypass line BL side may be greater than the distance between the edge of the gate shield GS and the edge of the active. Further, the light shield LS in the bypass pixels may be arranged to at least partially overlap with the gate shield GS to ensure that the external light does not reach the active of the TFT. In some cases, part of the light shield LS can be positioned to partially overlap with the active of the TFT.

Figure 18C:
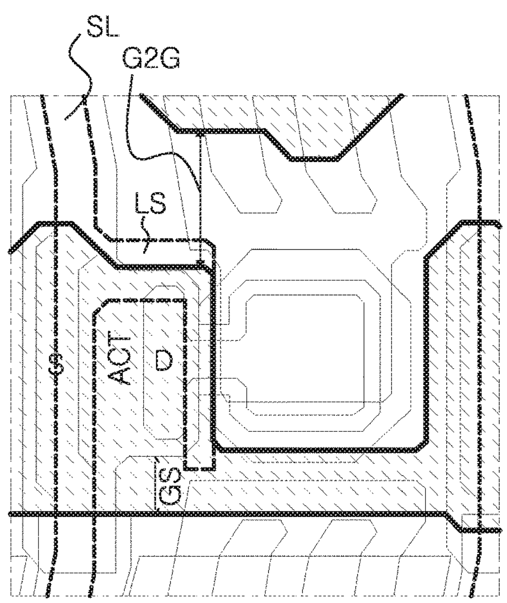

In the example shown in FIG. 18B, the light shield LS is configured to reduce the width of the gate electrode, and shift the bypass line BL for greater aperture ratio of the bypass pixels. The light shield LS is arranged to reduce the gate shield in vertical direction (i.e., Y-direction). However, in some embodiments, the light shield LS may also be configured to reduce the gate shield GS in the horizontal direction (i.e., X-direction). As depicted in FIG. 18C, the light shield LS can be extended under the gate shield GS toward the drain-pixel contact hole at the indented open area. In this setting, the light shield LS may not contribute much for the aperture ratio of the pixels. However, the reduced gate shield GS toward the drain-pixel contact hole can help in further reducing the Cgs of the TFT and the ΔVp (kick back voltage).

[Contact Bridge]

As described above, in some embodiments, a contact bridge patterned from the third metal layer M3 may be placed at the BL-VCOM contact region. In such embodiments, the minimum margin between the contact bridge and other metal structures patterned from the third metal layer M3 needs to be considered. For example, the minimum margin must be maintained between the contact bridge and the drain electrode of the TFT (denoted as D2D). Also, the minimum margin D2D must be maintained between the contact bridge and the data line DL. The minimum margin D2D which must be maintained between the metal structures patterned from the third metal layer M3 may be greater than the minimum margin G2G to be maintained between the gate line GL and the bypass line BL. As such, it is difficult to reduce the width of the gate BM at the BL-VCOM contact region even when the common signal line SL is provided with the light shield LS to reduce the width of the gate shield GS. Also, due to the minimum margin D2D from the data lines DL, the location of the upper contact hole CTU in the bypass pixel may be limited.

Figure 19A:
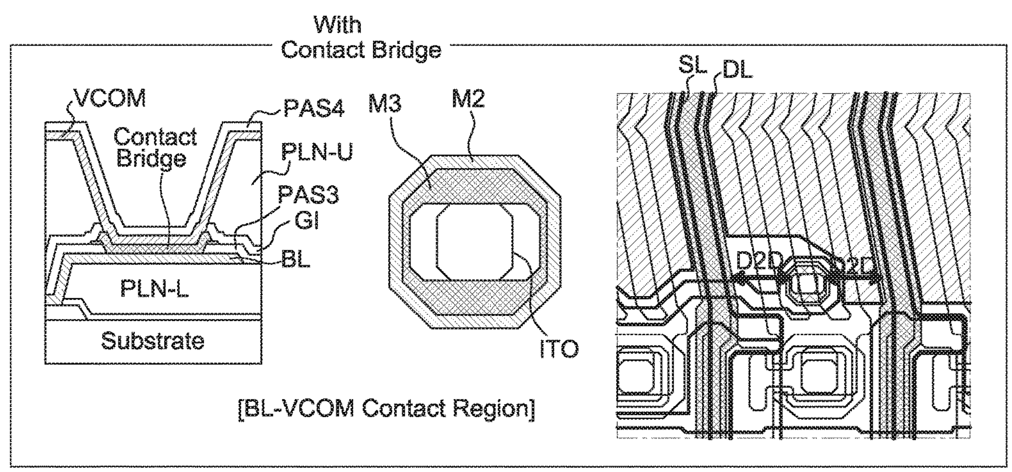
FIG. 19A illustrates exemplary configuration for connection a bypass line and a transparent electrode block at the BL-VCOM contact region, according to embodiments of the present disclosure.
Figure 19A:
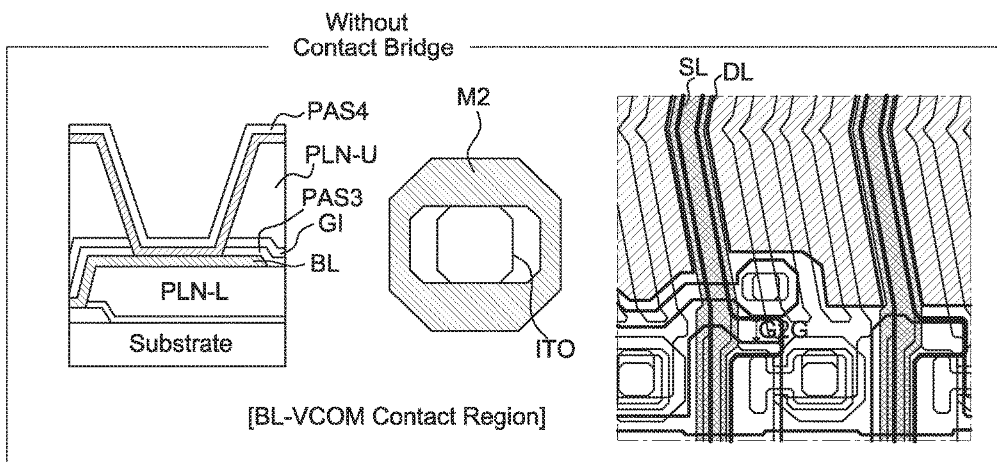

Accordingly, in some embodiments, the contact between the bypass line BL and the common electrode block at the BL-VCOM contact region is made without the contact bridge. FIG. 19A illustrates configurations of BL-VCOM contact area with and without the contact bridge. Connecting the bypass line BL and the common electrode block via the upper contact hole CTU without the use of the contact bridge may be achieved by adjusting the order in which the contact holes are formed during the manufacturing of the display panel PNL.

Figure 19B:
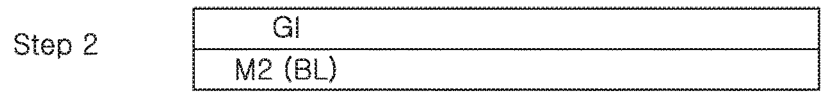
FIG. 19B illustrates schematic cross-sectional views of the BL-VCOM contact region during manufacturing, according to an embodiment of the present disclosure.
Figure 19B:
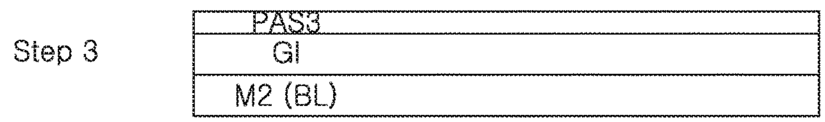
Figure 19B:
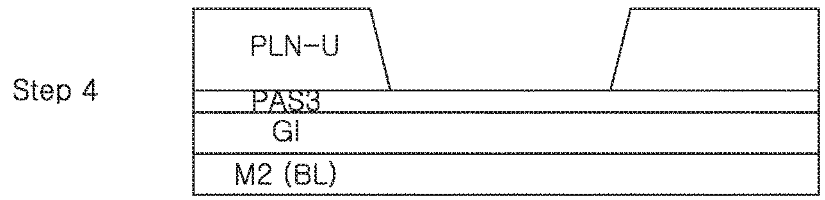
Figure 19B:
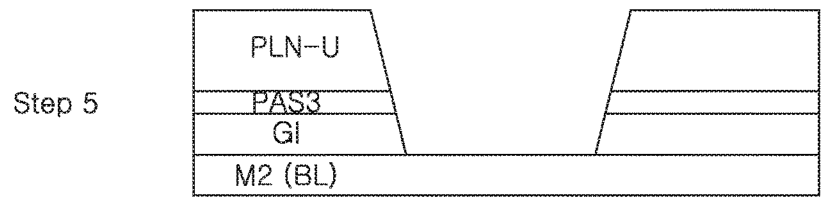
Figure 19B:
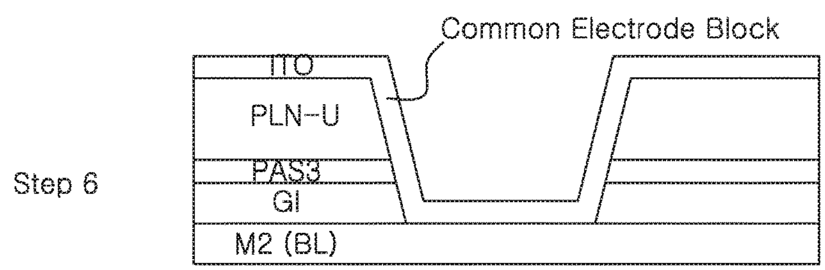

FIG. 19B is an exemplary manufacturing steps of the display panel PNL without the contact bridge, according to an embodiment of the present disclosure. For brevity, the method is explained from the step of patterning the second metal layer M2 on the lower planarization layer PLN-L. In step 1, the second metal layer M2 is patterned to form the gate lines GL and the bypass line BL. In step 2, the gate insulation layer GI and the semiconductor layer SEM are provided on the gate lines GL. Unlike the previous example described in reference to FIGS. 7A and 7B, in this case, contact hole formation through the semiconductor layer SEM and the gate insulation GI for exposing the bypass line BL is postponed. The third metal layer M3 can be patterned to provide the data lines DL and source/drain of the TFT. In this embodiment, however, the contact bridge shown in FIGS. 7A and 7B is not patterned in the BL-VCOM contact region. Patterning of the semiconductor layer SEM can be done along with the patterning of the third metal layer M3, or may be done separately prior to the patterning of the third metal layer M3.

In this case, the contact bridge at the BL-VCOM contact region is no longer needed as the bypass line GL at the BL-VCOM contact region is covered under the gate insulation layer GI. In step 3, the passivation layer PAS3 is provided. As shown in FIG. 19B, the passivation layer PAS3 is on the gate insulation layer GI at the BL-VCOM contact region. In step 4, the upper planarization layer PLN-U are provided so that the data lines DL and the source/drain of the TFTs are covered under the upper planarization layer PLN-U. Then, a contact hole is formed through the upper planarization layer PLN-U. The upper contact hole CTU is formed at to expose the BL-VCOM contact region. At this stage, the passivation layer PAS3 and the gate insulation layer GI still remains over the bypass line BL at the BL-VCOM contact region. Similarly, a contact hole can be formed through the upper planarization layer PLN-U to expose drain region of the TFT. The drain region, which is exposed through the contact hole of the upper planarization layer PLN-U, may also be covered by the passivation layer PAS3 and the gate insulation layer GI.

After the formation of the contact hole through the upper planarization layer PLN-U, in step 5, the passivation layer PAS3 and the gate insulation layer GI at the drain region of the TFT and the BL-VCOM contact region can be etched at the same time to expose the bypass line BL. Once the bypass line is exposed, in step 6, the transparent electrode layer (e.g., ITO) can be deposited to be in contact with the bypass line BL through the upper contact hole CTU. In this way, a direct contact between the bypass line BL and the common electrode block can be made without using the contact bridge formed from the third metal layer M3.

Without the contact bridge at the BL-VCOM contact region, the bypass line BL can be positioned closer to the gate line GL so long as the minimum margin between the bypass line BL and the gate line GL is maintained. As described above, the width of the gate shield GS can be reduced by providing the light shield LS, which is patterned from the first metal layer M1, and reduce the width of the gate BM. Further, contact portion of the bypass line BL at the BL-VCOM contact region can be shifted toward left side or right side toward the data lines DL, which would allow for more efficient placement of the bypass line BL within the pixel region.

[Bypass Line Shifting]

Although the aperture ratio discrepancy among the pixels is the root cause of the visual artifacts, it is the repeated arrangement of such pixels, which makes the visual artifacts stand out and noticeable to a naked human eye. It would be difficult to perceive the relatively low luminance of a single isolated set of bypass pixels. However, multiple sets of bypass pixels arranged in a repeated pattern forms a pattern of low luminance region and a high luminance region in the matrix, which is much more perceptible to a naked eye. Some pattern is inevitable in the arrangement of the bypass lines in the matrix, but the pattern can be less noticeable when it becomes complex enough.

Here, the basic idea is to provide variations in the arrangement of bypass lines BL in the matrix of pixel regions rather than placing them in a simple linear order in vertical or horizontal directions. Accordingly, in some embodiments, a set of bypass lines BL connected to a common electrode block includes a bypass line BL from the set of bypass lines BL is displaced from at least one other bypass line BL of the same set. More specifically, the pixel region accommodating the lower contact hole CTL for a bypass line BL of the set of bypass lines BL is placed in a different row and a different column from the pixel region accommodating the lower contact hole CTL for at least one other bypass line BL of the same set.

As described in above, each common electrode block may be connected to a plurality of common signal lines SL as well as dummy lines DML. Further, a single common signal line or a single dummy line DML may be connected to the common electrode block by using multiple bypass lines BL. As such, the set of bypass lines BL connected to the common electrode block may be the bypass lines BL connected to a single common signal line SL, a plurality of common signal lines SL, a single dummy line DML, a plurality of dummy lines DML or a combination of the above.

Figure 20A:
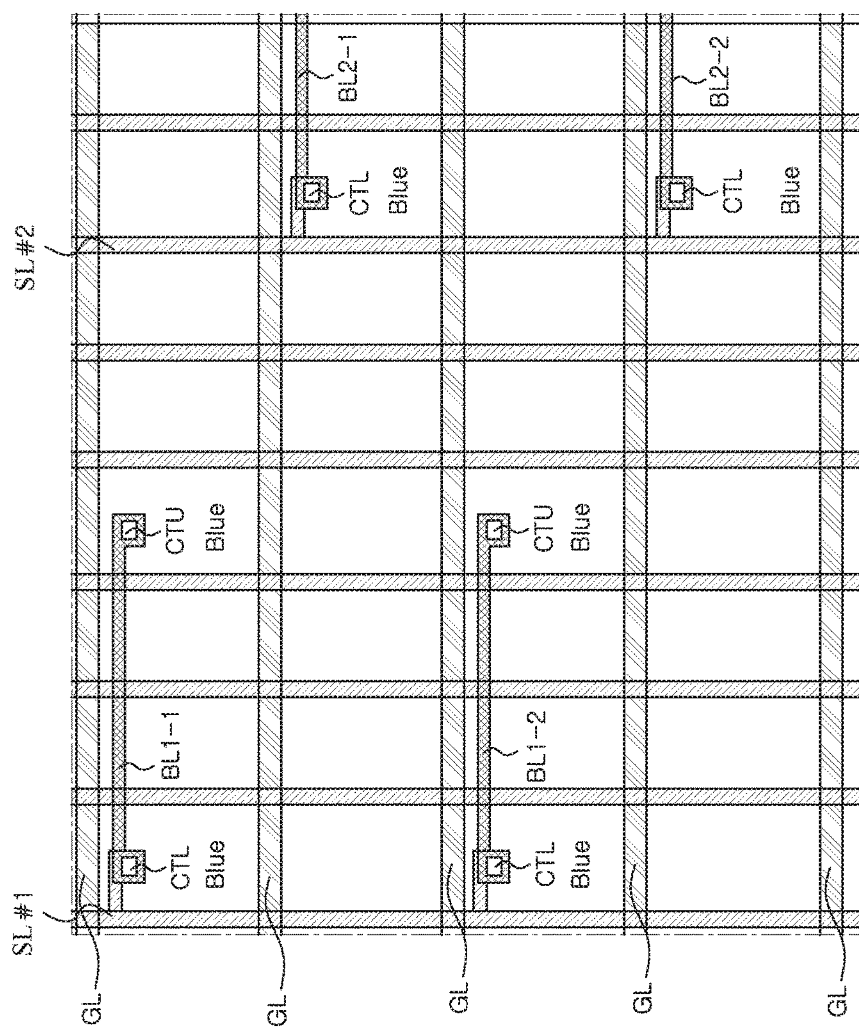
FIG. 20A illustrates an exemplary configuration of a set of bypass lines for connecting a plurality of common signal lines (or dummy lines) to a common electrode block.

FIG. 20A shows an exemplary configuration of a set of bypass lines for a common electrode block. In this example, the line #1 is connected to the common electrode block via two bypass lines (BL 1-1 and BL 1-2). The lower contact holes CTL for each of the bypass lines BL 1-1 and BL 1-2 are provided in the same column of pixel regions. Similarly, the line #2 is connected to the common electrode block via two bypass lines (BL 2-1 and BL 2-2), and the lower contact holes CTL for the each of the bypass line BL 2-1 and BL 2-2 are provided in the same column of pixel regions as each other. The line #1 and the line #2 may each be either a common signal line SL or a dummy line DML.

As shown, the pixel regions with the lower contact holes CTL for the bypass lines BL connected to the line #1 and the pixel regions with the lower contact holes CTL for the bypass lines BL connected to the line #2 are provided in different rows. Skewing the placement of contact holes for the bypass lines BL, at least to different rows from one another, can help in suppressing the visually noticeable pattern, such as the moiré effect.

As mentioned above, the lower contact holes CTL and the upper contact holes CTU may be provided in the blue pixel regions. Each of the upper contact holes CTU for the bypass lines BL may also be placed in a blue pixel region, which can be in the same row as the blue pixel that accommodates the lower contact hole CTL for the respective bypass line BL. It should be noted that the column of pixel regions including the pixels accommodating the contact holes needs not be formed entirely of blue pixels regions. Instead, the column may be formed of pixel regions with many different colors including the blue pixel regions where the contact holes are accommodated in.

Figure 20B:
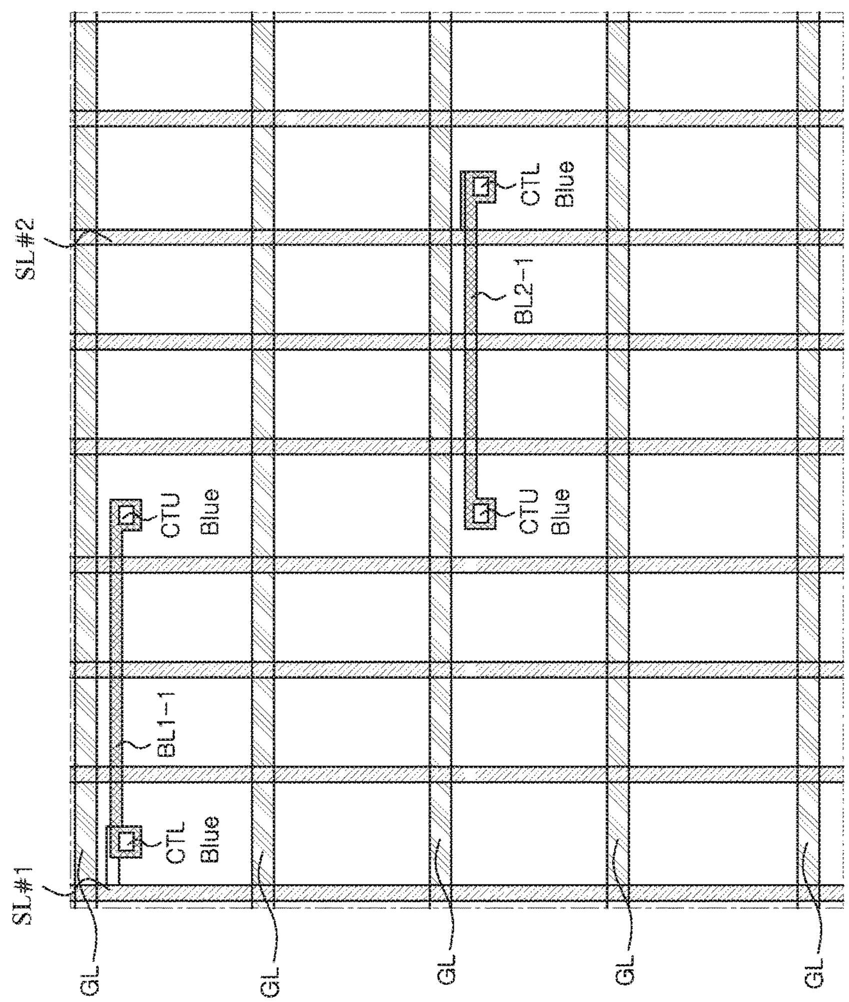
FIG. 20B illustrates an exemplary configuration of a set of bypass lines for connecting a plurality of common signal lines (or dummy lines) to a common electrode block.

FIG. 20B illustrates another exemplary configuration of a set of bypass lines BL connected to the common electrode block. Similar to the previous example, the line #1 and the line #2 are connected to the same common electrode via one or more of bypass lines BL. In this particular example, however, some bypass lines BL extend to the left side while some other bypass lines BL extend to the right side of the underlying lines that they are connected to.

By way of an example, the bypass line BL 1-1 connected to the line #1 extends from the lower contact hole CTL to the upper contact hole CTU, which is provided further on the right side of the lower contact hole CTL for the bypass line BL 1-1. The bypass line BL 2-1 connected to the line #2 is extends from the lower contact hole CTL to the upper contact hole CTU, which is provided on the left side of the lower contact hole CTL for the bypass line BL 2-1. Although not depicted in FIG. 7B, other bypass lines connected to the line #1 and the line #2 may also be configured in the similar way as the bypass line BL 1-1 and the bypass line BL 2-1.

Figure 20C:
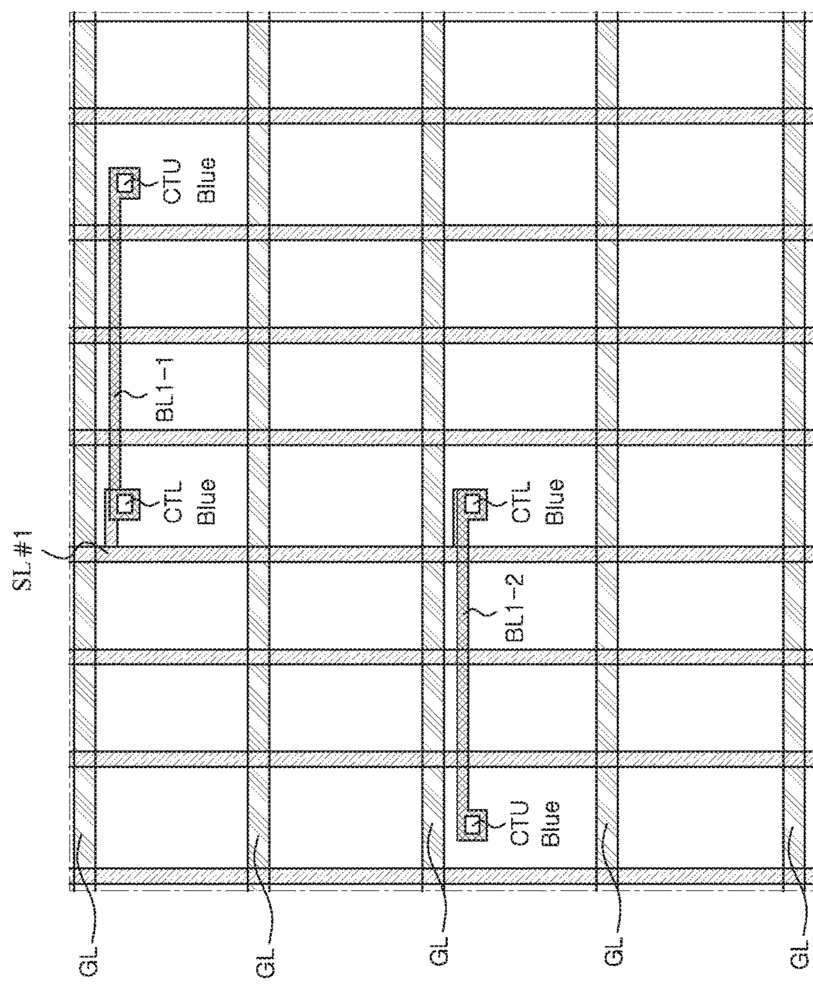
FIG. 20C illustrates an exemplary configuration of a set of bypass lines for a common electrode block, in which one of the bypass lines extends toward a first side of the common signal line (or dummy line) and another one of the bypass lines extends toward a second side of the common signal line (or dummy line).

Also, even among the bypass lines connected to the same common signal line SL, some bypass lines can be arranged to extend toward one side of the common signal line SL while some of the other bypass lines are arranged to extend toward in the other side. For instance, the bypass line BL 1-1 may extend toward the right side of the line #1, while the bypass line BL 1-2 extends toward the left side of the line #1 as depicted in FIG. 20C. That is, the lower contact hole CTL for the bypass line BL 1-1 and the lower contact hole CTL for the bypass line BL 1-2 are provided in the pixel region of the same column. On the other hand, the upper contact holes CTU for the bypass line BL 1-1 and the bypass line BL 1-2 are provided at the opposite sides of the line #1 from each other. Since the bypass lines are formed in the second metal layer M2 (e.g., gate metal layer), they can be transversely extended across the line #1 (i.e., the first metal layer M1) and the data line DL (i.e., the third metal layer M3) placed thereon.

Although the lower contact holes CTL for the bypass lines BL were depicted as being provided in the pixel regions of the same column, in some other embodiments, the lower contact hole CTL for each of the bypass lines BL can be placed in pixel regions of different columns even when they are connected to the same common signal line SL (or the same dummy line DML).

Figure 20D:
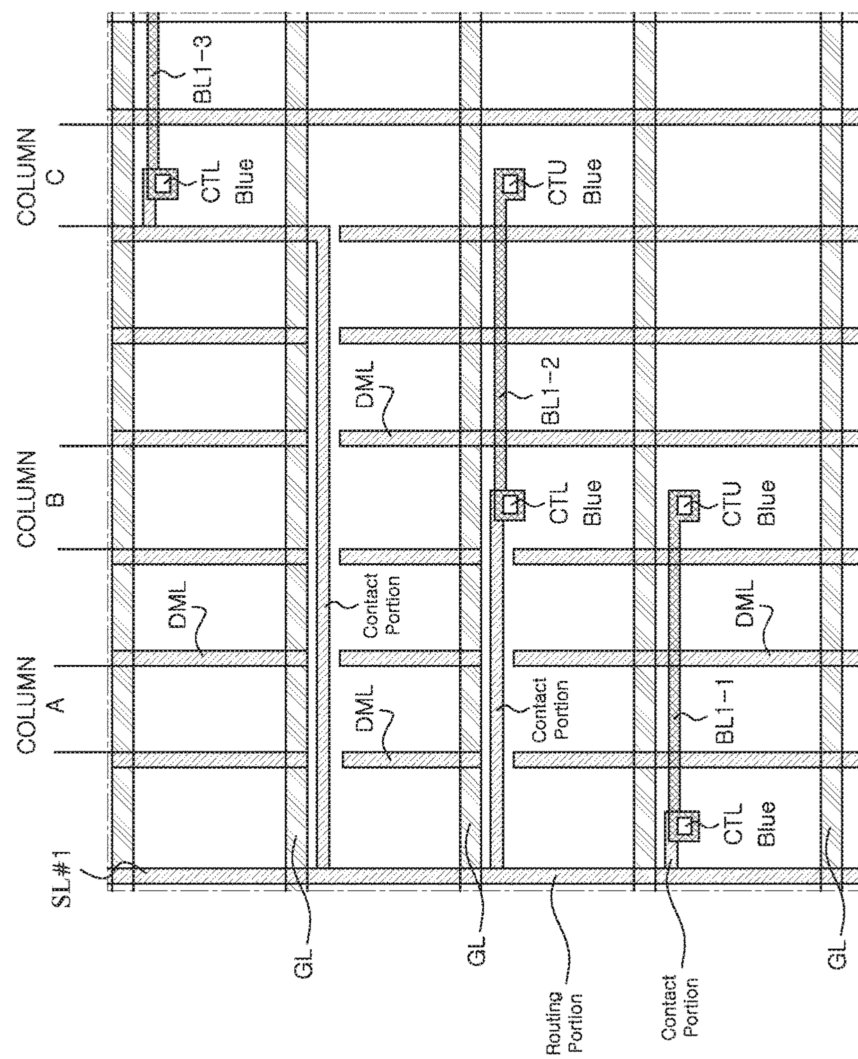
FIG. 20D illustrates an exemplary configuration of a set of bypass lines for a common electrode block, in which a common signal line is provided with a plurality of contact portions, each routed to a different pixel regions.

FIG. 20D illustrates yet another exemplary configuration of the bypass lines BL connected to the same common electrode block. Similar to the previous example, the line #1 is connected to a common electrode block via a plurality of bypass lines BL. Unlike the previous examples, however, the lower contact holes CTL for some of the bypass lines BL are provided in a pixel region away from the common signal line SL (or the dummy line DML).

Referring to FIG. 20D, the lower contact hole CTL for connecting the bypass line BL 1-1 to the line #1 is provided in the pixel region in a column A. The lower contact hole CTL for connecting the bypass line BL 1-2 to the line #1 is provided in the pixel region in a column B. Also, the lower contact hole CTL for connecting the bypass line BL 1-3 to the line #1 is provided in the pixel region in a column C. To this end, the line #1 is provided with the a plurality of contact portions projected out from the routing portion of the line #1, which are extended to the pixel regions of different columns where the contact is made with the corresponding bypass lines. To put it in another way, some contact portions of the line #1 may have a different length than others. As described before, the dummy line DML can be divided into multiple pieces to provide a passage for the contact portions to pass across and reach the pixel regions where the lower contact hole CTL are placed in. In this configuration, some contact portions would pass across a more or less number of dummy lines DML than other contact portions.

In FIG. 20D, the lower contact holes CTL for all of the bypass lines BL connected the line #1 were provided in the pixel regions of different columns. However, it should be appreciated that not all of the lower contact holes SL for the bypass lines BL needs to be provided in the pixel regions of different columns. In other words, some of the lower contact hole CTL for the bypass lines BL may still be provided in the same column with the lower contact holes CTL for other bypass lines BL.

Moreover, the contact portions of the line #1 can be arranged not just in X-direction but also in Y-direction as well. In such cases, the part of the contact portion being arranged in Y-direction can be extended under a data line DL, which is different from the one that is placed on the routing portion of the common signal line SL.

Referring to the example shown in FIG. 20D, the routing portion of the line #1 extends underneath the data line DL. The contact portions are projected out from the routing portion in the X-direction. A part of the contact portion being in contact with the bypass line BL 1-3 extends in the Y-direction underneath the data line DL_2, which then reaches the pixel region where the lower contact hole CTL is located. The contact portion being in contact with the bypass line BL 1-3 would be extended across a gate line GL. Of course, the number of gate lines GL which the contact portion crosses over varies by the length in which the part of contact portion extends in the Y-direction. Accordingly, some lower contact holes CTL can be provided in the pixel regions of the same column even though the contact portions are provided in different lengths.

In FIG. 20D, the contact portions of the line #1 were projected out to the right side of the routing portion. However, it should be appreciated that some common signal lines SL or dummy lines DML may include contact portions that are projected out in the opposite direction another contact portion of the same line.

In FIGS. 20A-20D, the configuration of bypass lines BL have been described in reference to just single common electrode block. However, it should be noted that the common electrode blocks in a display panel PNL need not be configured in the same way as each other. In other words, configuration of the common signal lines SL and the bypass lines BL in one common electrode block may differ from the configuration of those in another common electrode block. In this way, more complex bypass line BL pattern can be provided in the display panel PNL as a whole so that it becomes difficult for a user to visually recognize the aperture ratio differences caused by the bypass lines BL.

Figure 21A:
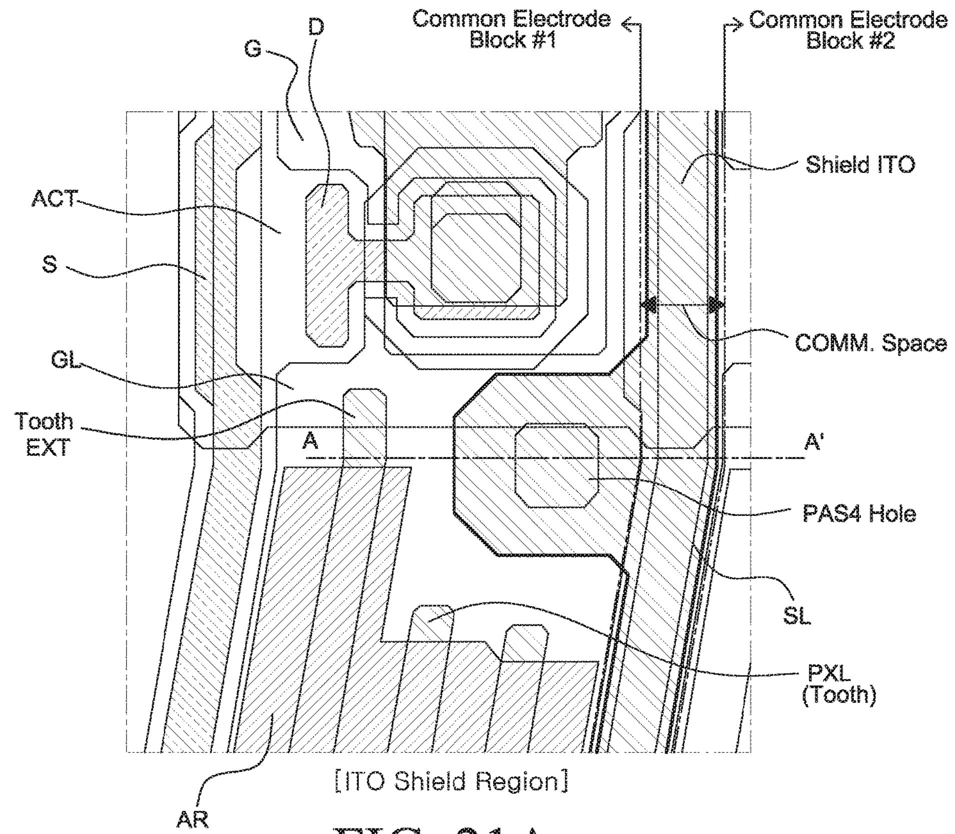
FIGS. 21A-21B illustrate an exemplary configuration of a display panel at the region between two adjacent transparent electrode blocks.
Figure 21B:
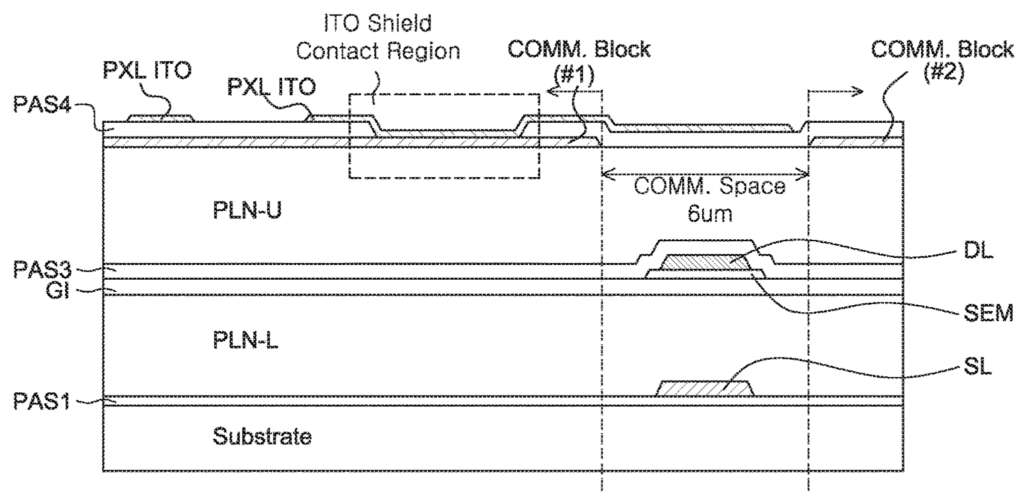

FIGS. 21A and 21B illustrate an exemplary configuration of the display panel PNL at the region between two adjacent common electrode blocks. Since the common electrode VCOM is divided in several common electrode blocks, a space (denoted as COMM. Space in FIGS. 21A and 21B) exists between two adjacent common electrode blocks. In this space, the electrical field for controlling the liquid crystal molecules may be disrupted due to the lack of common electrode block, and may result various visual defects. As such, a piece of transparent electrode, which is patterned along with the pixel electrode PXL, is provided in the "COMM. Space". Such a transparent electrode is referred to as the "shield ITO" in the present disclosure.

[Shield ITO]

Referring to FIGS. 21A and 21B, a shield ITO is provided between the common electrode blocks #1 and #2. In order to keep the common electrode blocks #1 and #2 separated from each other, the shield ITO is formed from the transparent electrode layer of the pixel electrode PXL. Accordingly, a passivation layer PAS4 is interposed between the shield ITO and the common electrode blocks #1 and #2. However, the shield ITO needs to be connected to either the common electrode block #1 or #2 in order to generate electric field for controlling the liquid crystal molecules at the COMM. Space. In the embodiment depicted in FIGS. 21A and 21B, the shield ITO is in contact with the common electrode block #1 via a contact hole through the passivation layer PAS4 at the ITO shield contact region. Of course, the configuration of the shield ITO can be reversed and the shield ITO can be connected to the common electrode block #2.

The ITO shield contact region may affect the maximum aperture ratio of the pixel region. Accordingly, the shield ITO at the shield ITO contact region can be positioned to at least partially overlap with the gate line GL of the adjacent row of pixels as depicted in FIG. 21A. In some embodiments, the pixel electrode PXL can be provided in a comb shape to compensate further for the aperture ratio AR affected by the ITO shield contact region. In this case, at least some teeth of the comb shaped pixel electrode PXL can be extend further toward the gate line GL for of the adjacent row of pixel as depicted in FIG. 21A. In the example depicted in FIG. 21A, one of the teeth EXT that is not intercepted by the ITO shield at the ITO shield contact region is extended toward the gate line GL. Similar to the ITO shield at the ITO shield contact region, the tooth of the pixel electrode PXL extended next to the ITO shield contact region may be at least partially overlap with the gate line GL. In such a setting, the extended tooth of the pixel electrode PXL can generate electric field in conjunction with the common electrode block #1 provided thereunder, which would contribute in minimizing the width of the gate BM.

The embodiments have been described with the common signal lines SL extended along under the corresponding data lines DL. However, features described herein can also be used even when the common signal lines SL are arranged to extend along under the gate lines GL. Further, embodiments have been described in the context of LCD display panel the having the pixel-top configuration. However, features described in the present disclosure can be equally applied in a display panel having the VCOM-top configuration, in which the layer of common electrode blocks and the layer of pixel electrodes are positioned in the reverse order from the examples depicted in the figures of the present disclosure. In the embodiments having the VCOM-top configuration, the contact hole at the BL-VCOM contact region or at the SL-VCOM contact region is formed through the passivation layer PAS4 to connect the common electrode block to the bypass line or directly to the common signal lines SL, respectively.

In this disclosure, many of the features have been described in reference to the embodiment which the common signal line SL and the common electrode block is connected via a bypass line BL. However, unless a specific feature is described as exclusive to the embodiments with the bypass lines, features may be applicable in the embodiment which the common signal line SL and the common electrode block is in direct contact with each other via a contact hole through the upper planarization layer PLN-U and the lower planarization layer PLN-L.

In the present disclosure, all of the embodiments have been described as having the common signal lines SL and the data lines positioned to overlap one another. The width of the common signal lines SL can be equal to the width of the data lines DL. However, it should be noted that the width of the common signal lines SL and the width of the data lines DL can differ from each other. With the common electrode being provided in a plurality of common electrode blocks, the field at the region between the two adjacent common electrode blocks can be different from other regions on the common electrode block. As such, controlling of the liquid crystal molecules over such regions may be difficult, and the light from the backlight can leak into the pixels near such regions.

Accordingly, a data line DL and a common signal line SL can be placed in the region between the two adjacent common electrode blocks. This way, the data line DL and the common signal line SL can be used to block the light from the backlight. The width of the data lines DL and the width of the common signal lines SL can be adjusted according to the distance between the two adjacent blocks. In this regard, increasing the width of the common signal lines SL can help reduce the resistance and lower the RC delay on the common signal lines SL. In the embodiments with the common signal lines SL disposed under the data lines DL, the width of the common signal lines SL can be greater than the width of the data lines DL. Since the common signal lines SL are placed further away from the common electrode blocks and the pixel electrodes than the data lines DL, managing the coupling capacitance may be easier for the common signal lines SL than the data lines DL.

In the embodiments disclosed in the present disclosure, the common signal lines SL are arranged under the data lines DL (or under the gate lines GL) and routed from the transparent electrode block to the driver (e.g., touch driver TD) in the non-display area directly across the display area. By routing the common signal lines SL directly across the display area, the size of the in display area at the side of the panel can be reduced. Further, the thickness of the passivation layer between the pixel electrode PXL and the common electrode blocks can be kept minimal to increase the capacitance of the pixel. Since, the common signal lines SL can be spaced farther away from the common electrode blocks, they can be provided with a desired thickness to decrease RC delays during touch-sensing period. In addition, there is no fringe field generated between the common electrode blocks and the common signal lines SL as the common electrode blocks positioned above the common signal lines SL. This effectively solves the light leakage problem caused by having the common signal lines SL in the same layer as the pixel electrode PXL.

In the embodiments of the present disclosure, the transparent electrode and the common signal lines SL are described in reference to a touch recognition enabled LCD device. However, the use of the transparent electrode (e.g., common electrode block) and the common signal line SL is not limited to displaying images from the panel and identifying the location of touch inputs. The functionalities of the transparent electrode and the common signal lines SL during other periods are not limited to activating the pixels (e.g., LCD pixel) as described above. In addition to touch-sensing functionality, the common electrode blocks and the common signal lines SL may be used in measuring amount of touch pressure on the screen, generating vibration on the screen or actuating electro-active materials in the panel.

For example, some embodiments of the display panel PNL may include a layer of deformable material. The common electrode blocks may be interfaced or positioned near the deformable material, and loaded with voltage signals to measure electrical changes caused by the deformation of the deformable material. In such cases, the common electrode blocks can measure the amount of pressure on the display panel PNL in addition to the location of the touch inputs. In some embodiments, the deformable material may be electro-active materials, which the amplitude and/or the frequency of the material can be controlled by electrical signals and/or electrical field. The examples of such deformable materials include piezo ceramic, electro-active-polymer and the like. In such embodiments, the common electrode blocks can be used to bend the deformable material into desired directions and/or to vibrate at desired frequencies, thereby providing tactile and/or texture feedback on the display panel PNL.

Although various embodiments are described with respect to display pixels, one skilled in the art would understand that the term display pixels can be used interchangeably with the term display sub-pixels in embodiments in which display pixels are divided into sub-pixels. For example, some embodiments directed to RGB displays can include display pixels divided into red, green, and blue sub-pixels. In other words, in some embodiments, each sub-pixel can be a red (R), green (G), or blue (B) sub-pixel, with the combination of all three R, G and B sub-pixels forming one color display pixel.

It will be apparent to those skilled in the art that various modifications and variations can be made in the present invention without departing from the scope of the inventions. Thus, it is intended that the present disclosure covers the modifications and variations of this invention provided they come within the scope of the appended claims and their equivalents.

What is claimed is:

1. A liquid crystal display device with a touch sensor, comprising:

a plurality of pixels operated by a pixel electrode and a transparent common electrode, the transparent common electrode including a plurality of separated transparent common electrode blocks in which each transparent common electrode block is used in operating one or more of the pixels;

a plurality of thin-film-transistors (TFTs) coupled to the plurality of pixels, the plurality of TFTs being disposed between a lower planarization layer and an upper planarization layer;

a touch driver configured to communicate with the plurality of separated common electrode blocks; and a plurality of common signal lines disposed under the lower planarization layer, wherein each transparent common electrode block is in direct contact with at least one of the common signal lines, wherein the pixel electrode and the transparent common electrode are disposed on the upper planarization layer.

2. The liquid crystal display device with a touch sensor of claim 1, wherein the lower planarization layer includes an organosiloxane hybrid layer based on Si—O monomer and polymer.

3. The liquid crystal display device with a touch sensor of claim 2, wherein the lower planarization layer includes a hybrid polysiloxane polymer layer, where the hybrid polymer contains organic contents, which includes alkyl and aryl functionalities.

4. The liquid crystal display device with a touch sensor of claim 1, wherein the lower planarization layer includes a hybrid polysiloxane polymer layer expressed in a chemical formula 1

[Formula 1]

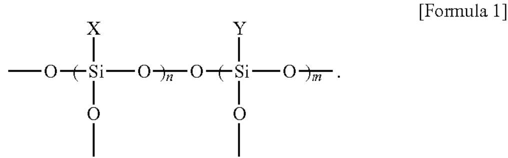

5. The liquid crystal display device with a touch sensor of claim 4, further comprising a passivation layer formed on a lower surface of the lower planarization layer.

6. The liquid crystal display device with a touch sensor of claim 2, wherein each of the common signal lines includes a routing portion extended under a data line and a contact portion projected out from the routing portion.

7. The liquid crystal display device with a touch sensor of claim 6, wherein each of the transparent common electrode blocks is in direct contact with the contact portion of at least one of the common signal lines via a contact hole through the upper planarization layer and the lower planarization layer.

8. The liquid crystal display device with a touch sensor of claim 1, wherein an upper part of a contact hole in the upper planarization layer is wider than a mid-part of the contact hole in a passivation layer and a gate insulation layer for the plurality of TFTs, and wherein the mid-part of the contact hole is wider than a lower part of the contact hole in the lower planarization layer.

9. The liquid crystal display device with a touch sensor of claim 8, wherein the gate insulation layer has a ledged within the contact hole.

10. A display panel, comprising:

a plurality of common signal lines on a substrate;

a lower planarization layer covering the plurality of common signal lines;

an array of thin-film transistors (TFTs) on the lower planarization layer, the array of TFTs being connected to a plurality of gate lines and a plurality of data line on the lower planarization layer;

an upper planarization layer covering the array of TFTs;

a plurality of transparent electrode blocks and a plurality of pixel electrodes on the upper planarization layer;

a driver configured to communicate with each of the plurality of transparent electrode blocks via a discrete signal path dedicated for each of the transparent electrode blocks, said discrete signal path for each of the transparent electrode blocks being implemented with one or more of the common signal lines, wherein each of the plurality of transparent electrode blocks is in direct contact with at least one of the common signal lines of the corresponding discrete signal path.

11. The display panel of claim 10, wherein the contact between each of the plurality of transparent electrode blocks and said at least one of the common signal lines of the corresponding discrete signal path is made via a contact hole through the upper planarization layer and the lower planarization layer.

12. The display panel of claim 11, wherein the contact hole is positioned in a blue pixel corresponding to a portion of the plurality of pixel electrodes and a portion of the plurality of transparent electrode blocks.

13. The display panel of claim 10, wherein the discrete signal path for at least one of the transparent electrode blocks is a first parallel-connection signal path implemented with a first set of the common signal lines, and the discrete signal path for another one of the transparent electrode blocks is a second parallel-connection signal path implemented with a second set of the common signal lines distinct from the common signal lines of the first set.

14. The display panel of claim 10, wherein a second set of common signal lines implementing the second parallel-connection signal path includes a fewer number of common signal lines than a total number of common signal lines in a first set of common signal lines implementing a first parallel-connection signal path.

15. The display panel of claim 14, wherein the transparent electrode block connected to the second parallel-connection signal path is positioned closer to the driver than the transparent electrode block connected to the first parallel-connection signal path.

16. The display panel of claim 10, wherein each of the discrete signal paths includes at least one common signal line having a contact portion projecting out from a routing portion of a respective common signal line, and wherein each of the plurality of transparent electrode blocks is in direct contact with the contact portion of the common signal line included in the corresponding discrete signal path.

17. The display panel of claim 10, wherein one or more of TFTs included in the array of TFTs has a coplanar structure.

18. The display panel of claim 17, wherein at least some of the common signal lines include a routing portion and a light shield portion, said light shield portion projecting out from the routing portion and positioned under a channel of said TFTs having the coplanar structure.

19. The liquid crystal display device with a touch sensor of claim 1, wherein the plurality of separated transparent common electrode block is connected with a plurality of discrete signal path implemented with the plurality of common signal line to the touch driver.

* * * * *